United States Patent
Brown et al.

(10) Patent No.: US 9,431,145 B2
(45) Date of Patent: Aug. 30, 2016

(54) TRANSISTORS AND METHODS FOR MAKING THEM

(75) Inventors: Beverley Anne Brown, Warrington (GB); Simon Dominic Ogier, Ripon (GB); Keri Laura McCall, Ripon (GB); Marco Palumbo, Liverpool (GB)

(73) Assignee: Neudrive Limited, Macclesfield (GB)

( * ) Notice: Subject to any disclaimer, the term of this patent is extended or adjusted under 35 U.S.C. 154(b) by 313 days.

(21) Appl. No.: 14/118,811

(22) PCT Filed: May 24, 2012

(86) PCT No.: PCT/GB2012/051170
§ 371 (c)(1),
(2), (4) Date: Jan. 28, 2014

(87) PCT Pub. No.: WO2012/160383
PCT Pub. Date: Nov. 29, 2012

(65) Prior Publication Data
US 2014/0175409 A1 Jun. 26, 2014

(30) Foreign Application Priority Data

May 26, 2011 (GB) .................................. 1108864.8
Nov. 1, 2011 (GB) .................................. 1118867.9
Dec. 7, 2011 (GB) .................................. 1120997.0
Mar. 22, 2012 (GB) .................................. 1205022.5

(51) Int. Cl.
*H01B 1/00* (2006.01)
*H01L 51/00* (2006.01)
(Continued)

(52) U.S. Cl.
CPC ............ *H01B 1/121* (2013.01); *H01L 51/0035* (2013.01); *H01L 51/0043* (2013.01);
(Continued)

(58) Field of Classification Search
CPC ..... H01B 1/121; H01B 1/20; H01L 51/0003; H01L 51/0051; H01L 51/0052; H01L 51/0055; H01L 51/0067
See application file for complete search history.

(56) References Cited

U.S. PATENT DOCUMENTS 6,630,566 B1  10/2003  Allen et al.
6,653,510 B1  11/2003  Brown et al.
(Continued)

FOREIGN PATENT DOCUMENTS

EP    1340270 A1    9/2003
EP    1394617 A2    3/2004
(Continued)

OTHER PUBLICATIONS

Sheraw, Chris D., et al.; "Functionalized Pentacene Active Layer Organic Thin-Film Transistors"; Advanced Materials, vol. 15, No. 23; Dec. 3, 2003; pp. 2009-2011.
(Continued)

*Primary Examiner* — Mark Kopec
(74) *Attorney, Agent, or Firm* — Winstead PC

(57) ABSTRACT

A semiconductor composition which comprises a soluble polyacene semiconductor and a polymeric semiconducting binder the binder having a permittivity greater than 3.4 at 000 Hz. The charge mobility of the semiconducting binder when measured in a pure state is greater than $10^{-7}$ cm$^2$/Vs and more preferably greater than $10^{-6}$ cm$^2$/Vs. Organic thin film transistors in which the source and drain electrodes are bridged by the semiconductor composition have desirable properties of reproducibility and charge mobility. The organic semiconducting composition can be applied by solution coating.

20 Claims, 5 Drawing Sheets

Diagram of OTFT made on a glass substrate coated with SU8 layer

Layer 1- Glass substrate
Layer 2- Bottom contact pads
Layer 3 – SU8 ((2002; negative epoxy-type negative, near UV photoresist material, supplied by MicroChem Inc.) Layer 4 – Source, drain electrodes
Layer 5 –OSC layer
Layer 06-Dielectric layer
Layer 07-Gate electrode

(51) Int. Cl.
*H01B 1/12* (2006.01)
*H01L 51/05* (2006.01)

(52) U.S. Cl.
CPC ....... *H01L51/0512* (2013.01); *H01L 51/0566* (2013.01); *H01L 51/0094* (2013.01); *H01L 51/0541* (2013.01); *H01L 51/0545* (2013.01)

(56) References Cited

U.S. PATENT DOCUMENTS

| | | | |
|---|---|---|---|
| 6,690,029 | B1 | 2/2004 | Anthony et al. |
| 6,861,502 | B1 | 3/2005 | Towns et al. |
| 6,994,941 | B2 | 2/2006 | Tanaka et al. |
| 7,514,710 | B2 | 4/2009 | Vogel et al. |
| 8,119,804 | B2 * | 2/2012 | Brown ................ C07F 7/0809 257/40 |
| 2001/0026878 | A1 | 10/2001 | Woo et al. |
| 2003/0068527 | A1 | 4/2003 | Noguchi et al. |
| 2003/0116755 | A1 | 6/2003 | Takahashi |
| 2004/0004433 | A1 | 1/2004 | Lamansky et al. |
| 2004/0028944 | A1 | 2/2004 | Mori et al. |
| 2004/0222412 | A1 | 11/2004 | Bai et al. |
| 2005/0067951 | A1 | 3/2005 | Richter et al. |
| 2005/0153167 | A1 | 7/2005 | Suzuki et al. |
| 2006/0093852 | A1 | 5/2006 | Marsitzky et al. |
| 2006/0105492 | A1 | 5/2006 | Veres et al. |
| 2006/0154384 | A1 | 7/2006 | Murphy et al. |
| 2006/0210827 | A1 | 9/2006 | Becker et al. |
| 2007/0146426 | A1 | 6/2007 | Nelson et al. |
| 2007/0158646 | A1 | 7/2007 | Reichmanis et al. |
| 2008/0217605 | A1 | 9/2008 | Wallace et al. |
| 2008/0309229 | A1 | 12/2008 | Steudel et al. |
| 2009/0206329 | A1 | 8/2009 | Yamaga et al. |
| 2009/0247728 | A1 | 10/2009 | Pan et al. |
| 2010/0096978 | A1 | 4/2010 | Wilson |
| 2010/0127220 | A1 | 5/2010 | Tierney et al. |
| 2010/0165604 | A1 | 7/2010 | Uetani |
| 2010/0256328 | A1 | 10/2010 | Heckmeier et al. |
| 2012/0037889 | A1 | 2/2012 | Tanaka et al. |
| 2012/0193611 | A1 | 8/2012 | Chen et al. |
| 2014/0114040 | A1 * | 4/2014 | Brown ................ H01L 51/0035 528/7 |
| 2014/0183414 | A1 | 7/2014 | Umemoto et al. |
| 2014/0231717 | A1 | 8/2014 | Sakakibara et al. |
| 2014/0367617 | A1 | 12/2014 | Yoshida et al. |
| 2015/0014599 | A1 * | 1/2015 | Griffiths ............ H01L 51/0035 252/500 |
| 2015/0028313 | A1 | 1/2015 | Pillow et al. |
| 2015/0069303 | A1 | 3/2015 | Eckes et al. |

FOREIGN PATENT DOCUMENTS

| | | | |
|---|---|---|---|
| EP | 1729357 | A2 | 12/2006 |
| GB | 2491810 | A * | 12/2012 |
| JP | 2009003157 | A | 1/2009 |
| JP | 2010502807 | A | 1/2010 |
| TW | 201319121 | A | 5/2013 |
| WO | WO-9715173 | A1 | 4/1997 |
| WO | WO-99/32537 | A1 | 7/1999 |
| WO | WO-9932537 | A1 | 7/1999 |
| WO | WO-02/45184 | A1 | 6/2002 |
| WO | WO-03052841 | A1 | 6/2003 |
| WO | WO-2004102690 | A2 | 11/2004 |
| WO | WO-2005055248 | A2 | 6/2005 |
| WO | WO-2006123596 | A1 | 11/2006 |
| WO | WO-2007078993 | A1 | 7/2007 |
| WO | WO-2007082584 | A1 | 7/2007 |
| WO | 2007/078993 | A1 * | 12/2007 |
| WO | WO-2008029155 | A2 | 3/2008 |
| WO | WO-2008107089 | A1 | 9/2008 |
| WO | WO-2009155106 | A1 | 12/2009 |
| WO | WO-2011090953 | A1 | 7/2011 |
| WO | WO-2012160382 | A1 | 11/2012 |
| WO | WO-2012160383 | A1 | 11/2012 |
| WO | WO-2012164282 | A1 | 12/2012 |

OTHER PUBLICATIONS

Madhavan, Nandita, "Small Molecule Organic Semiconductors", Organic Chemistry Seminar Abstracts 2001-2002 Semester II, University of Illinois, Apr. 1, 2002, pp. 49-56.

Chua, Lay-Lay, "General observation of n-type field-effect behaviour in organic semiconductors", Nature, vol. 434, Mar. 2005, pp. 194-198.

Wolfbauer, Georg, "International Search Report" for PCT/GB2012/051169, as mailed Aug. 10, 2012, 4 pages.

Bedekar, Beena A. et al, "Dielectric relaxation of cyanoethylated poly (2,3-dihydroxypropyl methacrylate)", Polymer vol. 36 No. 25, 1995, pp. 4735-4740.

Facchetti, Antonio et al., "Gate Dielectrics for Organic Field-Effect Transistors: New Opportunities for Organic Electronics", Advanced Materials 17, 2005 pp. 1705-1725.

Wolfbauer, Georg, "International Search Report" prepared for PCT/GB2012/051170, as mailed Aug. 10, 2012, 3 pages.

Starling, S.G., et al.; "Physics"; 1950; pp. 946-947.

Veres, Janos, et al.; "Gate Insulators in Organic Field-Effect Transistors"; Chem. Mater, vol. 16; Sep. 11, 2004; pp. 4543-4555.

* cited by examiner

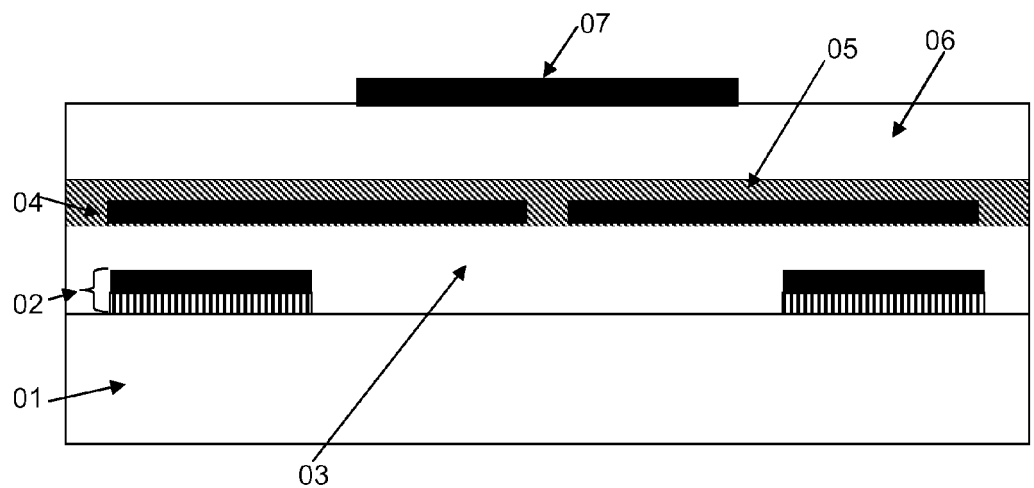
Figure 1: Diagram of OTFT made on a glass substrate coated with SU8 layer
Layer 1- Glass substrate
Layer 2- Bottom contact pads
Layer 3 – SU8 ((2002; negative epoxy-type negative, near UV photoresist material, supplied by MicroChem Inc.) Layer 4 – Source, drain electrodes
Layer 5 –OSC layer
Layer 06-Dielectric layer
Layer 07-Gate electrode

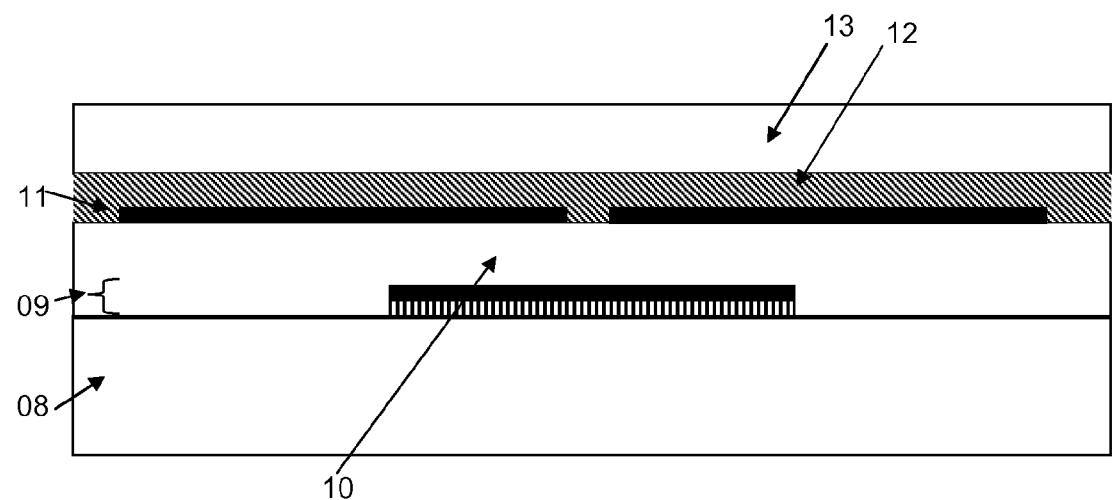
Figure 2: Diagram of Bottom Gate OTFT made on glass substrate
Layer 08 – Glass substrate
Layer 09 – Gate electrode
Layer 10 – Gate dielectric
Layer 11 – Source/Drain electrode
Layer 12 – OSC layer
Layer 13 – Passivation layer

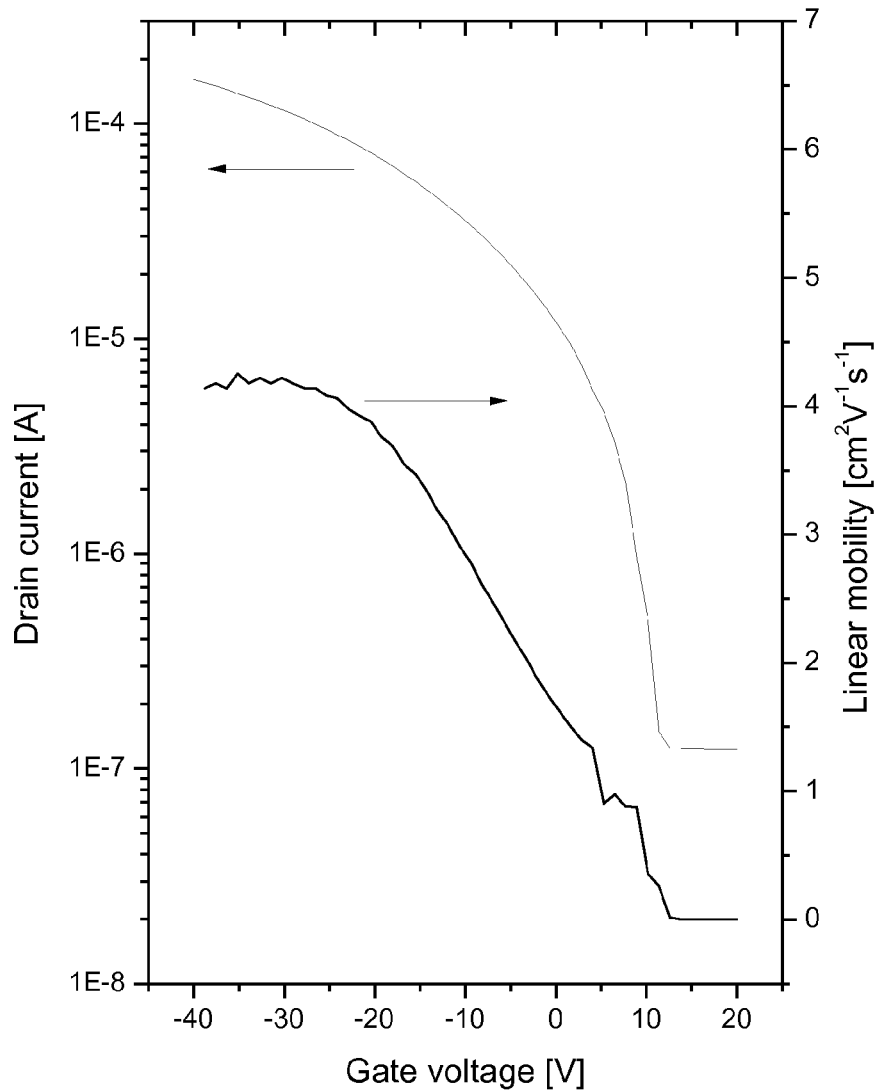
Figure 3: Transfer characteristic for a TG 100μm channel length OTFT using 1,4,8,11-tetramethyl bis-triethylsilylethynyl pentacene and 50:50 random copolymer (4)). Drain voltage is -2V.

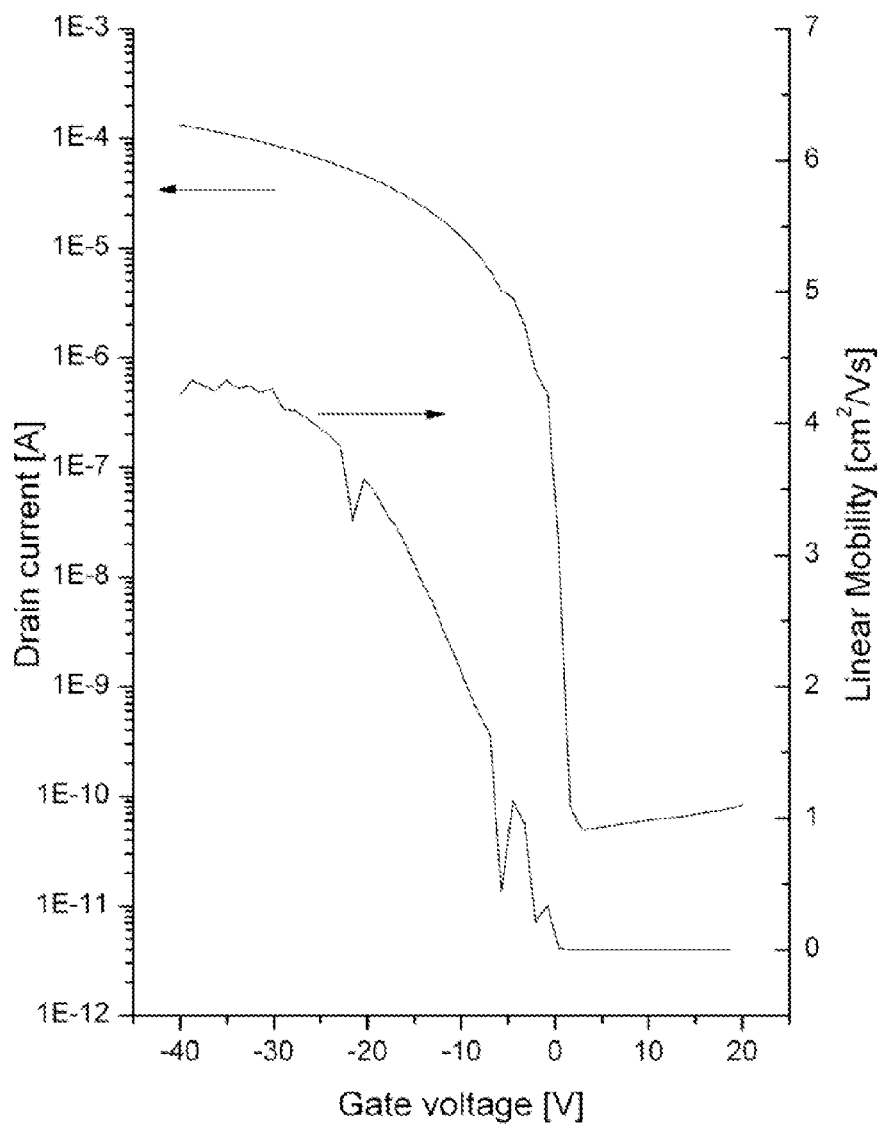
Figure 4: transfer characteristics for a TG 100μm channel length OTFT using 1,4,8,11-tetramethyl bis-triethylsilylethynyl pentacene and 30:70 random copolymer (5). Drain voltage is -2V.

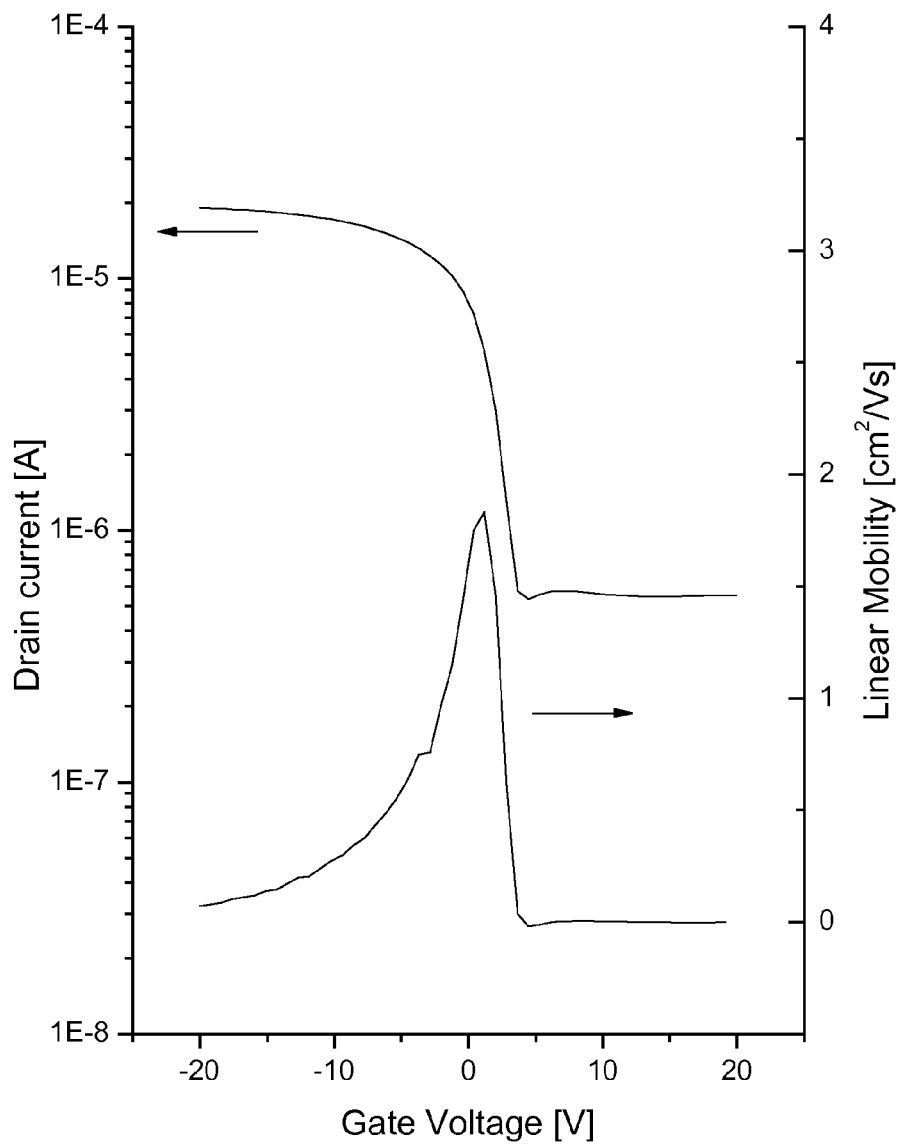
Figure 5: Transfer characteristic for a BG 100μm channel length OTFT using 1,4,8,11-tetramethyl bis-triethylsilylethynyl pentacene and 2,4-DiMeO polymer (2)). Drain voltage, 2V.

TRANSISTORS AND METHODS FOR MAKING THEM

TECHNICAL FIELD OF THE INVENTION

The present invention is directed in general, to organic semiconducting layer formulations, a layer comprising the same, a process for preparing the formulation and layer and electronic devices comprising the same, and it is most suitable for use in organic thin film transistors (OTFTs).

BACKGROUND OF THE INVENTION

Organic semiconductors are the subject of intense research and development driven by their potential to enable low cost, flexible electronic devices. They have been used extensively in organic field effect transistors and in circuits integrating multiple devices. OTFTs are expected to become a dominant technology in the display technology sector where their low cost manufacture, flexibility and low weight could result in OTFTs replacing their silicon based counterparts in some cases. However significant improvements are needed in the area of improved organic semiconductor material performance and in device manufacturing.

OTFT devices require organic semiconducting materials that satisfy a challenging combination of performance attributes including: high charge carrier mobility, coupled with high electrical, mechanical and thermal stability. Whilst a wide range of high charge carrier mobility materials are available these tend to be non-polymeric organic molecules that after processing result in brittle layers that limit the flexibility of the device (refer to N. Madhavan, Organic Chemistry Seminar Abstracts 2001-2002 Semester II, University of Illinois at Urbana Champaign, 2002, pp 49-56 at http://www.scs.uiuc.edu/chemgradprogram/chem/435/s02-Madhavan.pdf).

On the other hand, a wide range of amorphous and crystalline semiconducting polymers are available having excellent flexibility and toughness; however these have unfavourably low charge carrier mobilities (LL Chua et al., Nature, March, 2005, Vol. 434, pp194-198). It has been proposed to use polyacenes, especially substituted, soluble pentacene molecules as semiconductors. Such compounds and a number of electronic devices using them have been previously disclosed in US patent application 2003/0116755, EP 1729357 and U.S. Pat. No. 6,690,029.

It is desirable to improve the stability and integrity of the semiconductor layers and it has been disclosed in WO 2005/055248 to achieve this by using non-polymeric soluble pentacene semiconducting molecules in conjunction with a polymer binder having a permittivity $\varepsilon_r$, of at most 3.3. WO 2005/055248 reports in tests on top gate transistors that two compositions showed no charge mobility, five compositions showed charge mobility above 1.0 $cm^2/Vs$ and nine compositions had mobilities ranging between 0 to 1.0 $cm^2/Vs$. The best result reported was a mobility of 1.44 with a standard deviation of 0.35. Furthermore all 22 examples in the application were in a top gate OTFT configuration. We have found in the case of bottom gate organic thin film transistors that the charge carrier mobility is substantially reduced; WO 2005/055248 leaves the problem of bottom gate transistors unsolved. In WO 2007/078993 an attempt was made to use pentacene semiconducting molecules with binders of permittivity more than 3.3; the best charge mobilities reported were $2 \times 10^{-2}$ $cm^2/Vs$. This would appear to reinforce the prior teaching that the binder should have a permittivity below 3.3.

The simplest way of depositing a semiconductor layer, for example a polyacene semiconductor/polymer binder formulation, is to dissolve the semiconductor and polymer in a suitable solvent, deposit the formulated material and evaporate the solvent. Substituted soluble pentacenes have been described in the above specifications and suitable binders for them have been disclosed in WO2005/055248. A number of useful binders are disclosed in WO2005/055248A, WO2007/078993 and US 2007/0158646.

An important aspect of thin film transistors is that their performance in an array should be as uniform as possible. If there is a wide variation in the performance of the transistors when they are manufactured this would result in variability in the end use device performance. For example, if a non-uniform transistor backplane was used in a display application then the pixels in the display would be non-uniform and of unacceptable quality. The problem of non-uniformity of performance increases often very considerably as the dimensions of the transistors are reduced as this involves a reduction in the channel length between the source and drain electrodes. Reduction of the dimensions of electronic components has been a consistent and enduring characteristic of advances in electronics for many years and the problem is of increasing severity.

It is an object of the present invention to provide semiconductor compositions having a combination of a generally good uniformity of performance in electronic devices whilst having good charge mobility.

BRIEF DESCRIPTION OF THE DRAWINGS

FIG. 1 is a diagram of OTFT made on a glass substrate coated with SU8 layer;

FIG. 2 is a diagram of Bottom Gate OTFT made on a glass substrate;

FIG. 3 illustrates transfer characteristics for a TG 100 μm channel length OTFT using 1,4,8,11-tetramethyl bis-triethylsilylethynyl pentacene and 50:50 random copolymer (4);

FIG. 4 illustrates transfer characteristics for a TG 100 μm channel length OTFT using 1,4,8,11-tetramethyl bis-triethylsilylethynyl pentacene and 30:70 random copolymer (5); and FIG. 5 illustrates transfer characteristics for a BG 100 μm channel length OTFT using 1,4,8,11-tetramethyl bis-triethylsilylethynyl pentacene and 2,4-DiMeO polymer (2).

DESCRIPTION OF THE INVENTION

This invention comprises organic thin film transistors in which the source and drain electrodes are bridged by a semiconductor composition which comprises a soluble polyacene semiconductor and a polymeric semiconducting binder, having a permittivity greater than 3.4 preferably at least 3.5 and suitably at least 3.7, for example at least 4.1 at 1000 Hz and a charge mobility in the pure state of greater than $10^{-7}$ $cm^2V^{-1}$ $s^{-1}$ more preferably greater than $10^{-6}$ $cm^2V^{-1}$ $s^{-1}$ for example greater than $10^{-5}$ $cm^2V^{-1}$ $s^{-1}$.

Preferred semiconducting polymers are those of Formula (I) which can be homopolymers or copolymers. Copolymers are those polymers prepared from two or more different monomers and include terpolymers, tetrapolymers and the like. The monomers can join to form random, block, or segmented copolymers, as well as any variety of other structural arrangements.

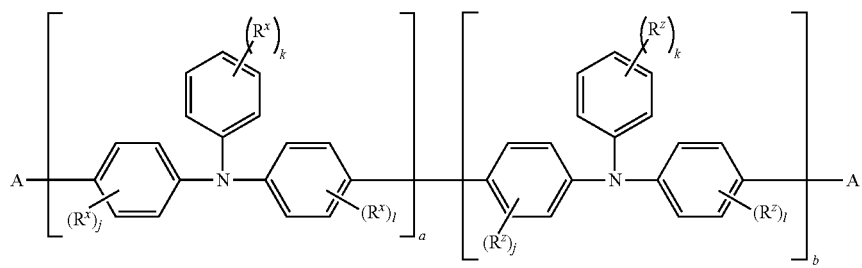
Formula (I)
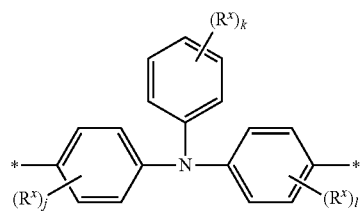
Formula (II)
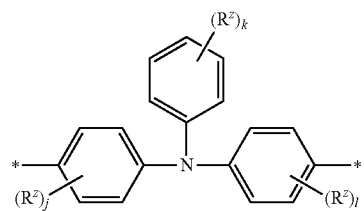
Formula (III)
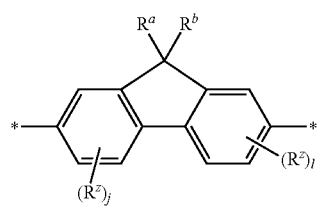
Formula (IV)
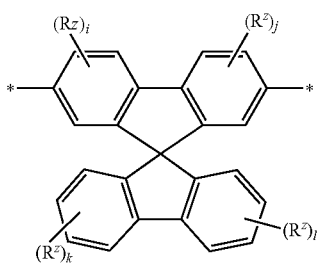
Formula (V)
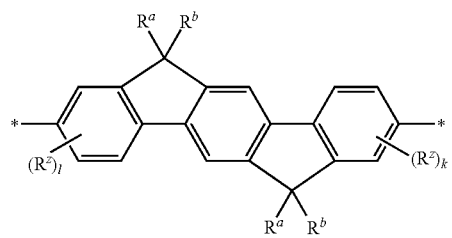
Formula (VIa)-trans isomer
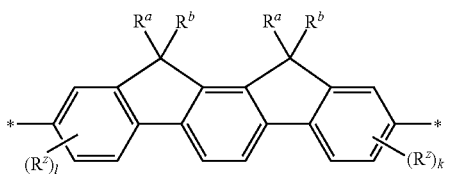
Formula (VIb)-cis isomer
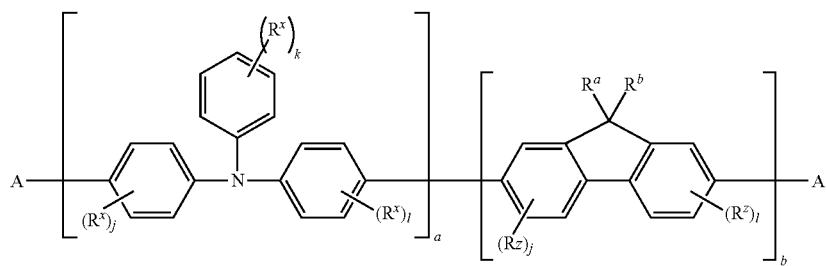
Formula (VII)

Formula (VIII)

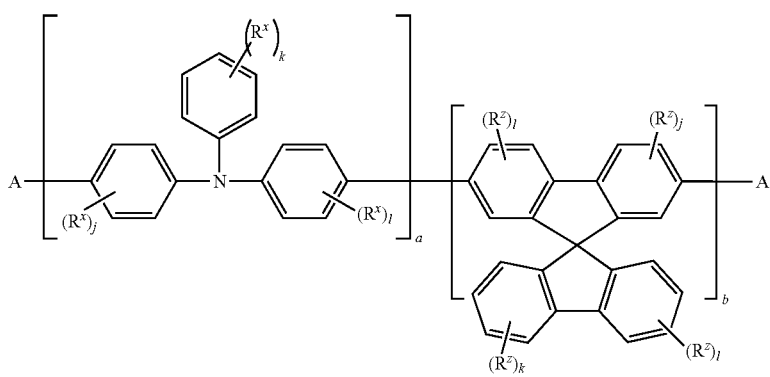

Formula (IXa)

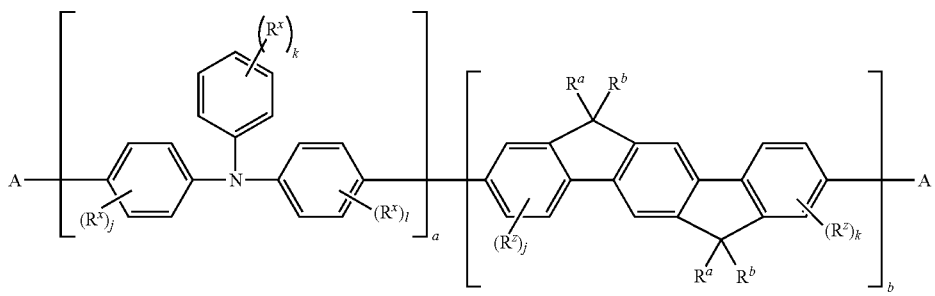

Formula (IXb)

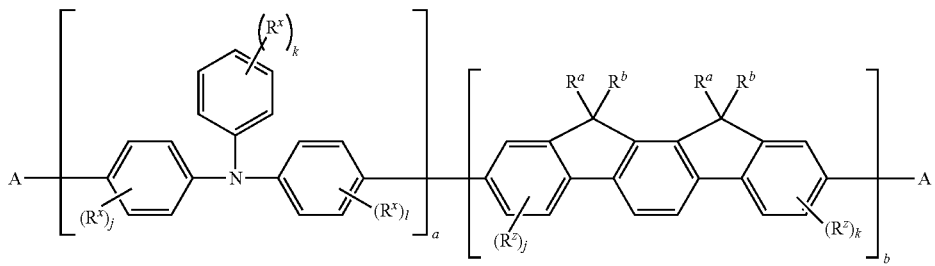

$R^x$ is independently hydrogen, an alkyl group preferably having 1 to 10 carbon atoms, an alkoxy group preferably having 1 to 10 carbon atoms, halogen, a nitro group or $R^{y'}$ where each $R^y$ is independently a cyano group (CN), or an organic group that includes at least one CN group, with the proviso that at least one repeat unit and preferably at least 30 percent of the repeat units in the triarylamine polymer includes an $R^y$ group and that the sum of indices (j+k+l) is at least one. Sufficient groups $R^y$ should be present in the polymer to ensure that its permittivity is greater than 3.4 at 1000 Hz. It will be appreciated that the $R^x$ groups may not be the same in all of the repeat units of the first part of Formula 1.

$R^z$ is independently in each occurrence an alkyl group and is intended to include not only pure open chain saturated hydrocarbon alkyl substituents such as methyl, ethyl, propyl, t-butyl and the like, but also alkyl substituents bearing further substituents known in the art, such as hydroxyl, alkoxy, alkylsulphonyl, halogen atoms, cyano, nitro, amino, carboxyl, etc. Thus "alkyl group" includes ether groups, haloalkyls, etc. Preferred $R^z$ groups include $C_1$-$C_{20}$ hydrocarbyl groups, and more preferably $C_1$-$C_5$ alkyl groups, more preferably methyl groups, Different selections from the alternatives within the definitions of $R^x$ and $R^y$ may be made in different units of the polymer.

A is independently in each occurrence hydrogen, halogen or any suitable end-capping group including those described in WO 1999/32537, j and l are independently in each occurrence 0 to 4, k is independently in each occurrence 0 to 5, more preferably the sum of indices (j+k+l), which may differ between different monomer units is at least 1 in at least 10% of the monomer units.

a is the number of monomer units of Formula (II) in the polytriarylamine compound, if it is a homopolymer then the polymer will have 100% of monomer of Formula (II). The copolymers preferably comprise between 5-100% of monomer of Formula (II), more preferably 10-80% of monomer of Formula (II), still more preferably 30-70% of monomer of Formula (II), b is the number of monomer units of monomer of Formula (III) in the polytriarylamine compound, in some cases b will equal 0, X is a halogen, for example Br or I but more preferably Cl.

* (asterisk)—represents halogen atoms or a suitable leaving group $R^a$ and $R^b$ each independently represent a hydrogen atom, a substituted or unsubstituted aromatic hydrocarbon cyclic group having 6 to 50 carbon atoms, a substituted or unsubstituted aromatic heterocyclic group having 5 to 50 carbon atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 atoms, a substituted or unsubstituted aralkyl group having 6 to 50 carbon atoms, a substituted or unsubstituted aryloxy group having 5 to 50 carbon atoms, a substituted or unsubstituted arylthio group having 5 to 50 carbon atoms, a substituted or unsubstituted alkoxycarbonyl group having 1 to 50 carbon atoms, a substituted or unsubstituted silyl group having 1 to 50 carbon atoms, a carboxy group, a halogen atom, a cyano group, nitro or hydroxyl group.

For certain embodiments, the semiconducting polymer includes a group that can be cross-linked and on cross-linking and patterning thereby renders the semiconducting layer less susceptible to dissolution when layers are solution coated on top of it.

In the case of copolymers comprising repeat units of fluorene (IV), spirobifluorene (V) and/or repeat units of Indenofluorene (VI) the same definitions apply for $R^x$, $R^y$, A, j, k, l, a, b, n and X; in addition the groups $R^a$ and $R^b$ are independently of each other selected from H, optionally substituted alkyl, alkaryl, aralkyl, alkoxy, or polyalkyloxy groups. It is preferred that the polytriarylamine polymer represented by Formula (I) comprises repeat units represented by Formulae (II) and (III) of which at least some are substituted by cyano groups or by groups which comprise cyano groups, or alkoxy groups.

In another embodiment of the invention the repeat units in the semiconducting polymer include the fluorene type repeat unit represented by Formula (IV), the spirobifluorene repeat unit represented by Formula (V) and/or the indenofluorene repeat unit represented by Formula (VI). Possible copolymers of the invention optionally include repeat units represented by Formulae (VII), (VIII), and (IX).

Suitable semiconducting polymers for use in the organic semiconductor layer include a portion that provides a relatively high dielectric constant to the overall polymer, which portions may be, the same or different. The high dielectric constant component may optionally, in part, reside in repeat units of Formulae (II), (IV), (V) and/or (VI). Copolymers comprising any combination of repeat units (II), (III), (IV), (V) and (VI) are included in this invention provided at least one type of repeat unit includes at least one $R^y$ group and the total number of such groups present in the molecule is sufficient to produce the desired permittivity.

The polymer preferably has cyano substitution and in the case where cyano groups are directly substituted onto the aromatic ring they should be in the 2 and/or 6 positions, the 2 position being preferred. It is preferred that such cyano substitution is on the "pendant" aromatic ring, that is, the aromatic ring which is not directly involved in the polymer chain. It is also preferred that the cyano group should not be directly substituted onto the aromatic ring but that it should be attached indirectly through a linking group; it may be substituted on any of the aromatic rings in the polytriarylamine units; more preferably on the pendant ring.

In a most preferred case, $R^x$ is a group having a linker group between the pendant aromatic ring and a cyano group. The linker group may be an alkyl group, a substituted alkyl group (for example —CH$_2$CN, —CR$_2$—CN) which is substituted with at least one additional cyano group. The linker group may be a phenylene group which may be substituted for example by an additional CN group; suitably $R^x$ may be a group of formula —C$_6$H$_4$CN, —C$_6$H$_4$—CH$_2$CN or —C$_6$H$_4$—(CR$_2$)CN.

In another preferred case the polymer represented by Formula (I) preferably has alkoxy substituents directly substituted onto the aromatic ring. These substituents should be in the 2, 4, and/or 6 positions. It is more preferred that such alkoxy substitution is on the pendant aromatic ring. If a cyano group is also present it is preferred that the cyano group is in the 2-position.

As used herein, the term "organic group" means a carbon atom, a hydrocarbon group (with optional elements other than carbon and hydrogen, such as cyano, oxygen, nitrogen, sulphur, silicon and halogens) that is classified as an aliphatic group, cyclic group, or combination of aliphatic and cyclic groups (e.g. alkaryl and aralkyl groups). The term aliphatic group means a saturated or unsaturated linear or branched hydrocarbon group. This term is used to encompass alkyl, alkenyl, and alkynyl groups for example.

The term "alkyl" group means a saturated linear or branched hydrocarbon group including for example, methyl, ethyl, isopropyl, t-butyl, hexyl, heptyl, 2-ethylhexyl and the like. The term "alkenyl group" means an unsaturated linear or branched hydrocarbon group with on or more carbon-carbon double bonds, such as a vinyl group. The term "alkynyl group" means an unsaturated linear or branched hydrocarbon group with one or more carbon-carbon triple bonds. The term "cyclic group" means a closed ring hydrocarbon group that is classified as an alicyclic, aromatic, or heterocyclic group. The term "alicyclic group" means a cyclic hydrocarbon having properties resembling those of aliphatic groups. The term "aromatic group" or aryl group means a mono- or polynuclear aromatic hydrocarbon group, including within its scope alkaryl or aralkyl groups. The term "heterocyclic group" means a closed ring hydrocarbon in which one or more of the atoms in the ring is an element other than carbon (e.g. nitrogen, oxygen, sulphur, etc.).

In one embodiment, of the invention, in Polymer (I), $R^x$ is preferably a cyano group; suitably two such groups may be present at the two and six positions of the pendant aromatic ring, that is the aromatic ring that is not in the conjugated polymer backbone. If only one cyano group is present in the repeat unit it is preferably in the 2 position of the pendant aromatic ring (see Example 1).

In another preferred case $R^x$ is a methoxy group on the pendant aromatic ring in polymers of Formula (I), in this case more preferably methoxy groups are substituted on the 2,4-positions on the pendant aromatic ring and k is at least two (see Example 2).

The number average molecular weight of the polymers is suitably in the range 1000 to 500,000, for example 5000 to 100,000.

A preferred repeat unit is represented by Formula (II a)

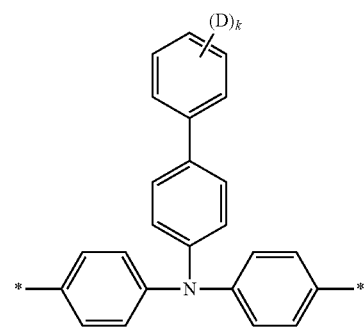

Formula (II a)

in which the group or groups D are independently CN groups or groups which comprise a CN group attached to the aromatic ring by a linking group, and/or D are alkoxy groups.

Some examples of the linker group are given in the table below,

---
Some examples of "linker" groups" that can be attached to the aromatic ring
---

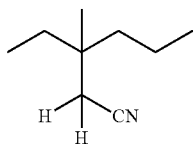

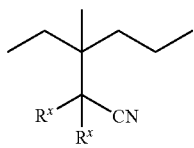

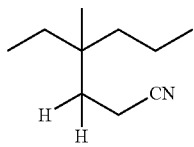

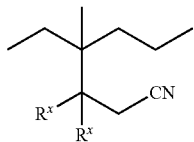

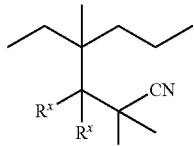

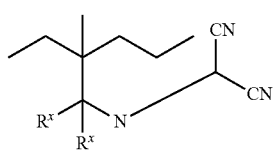

---

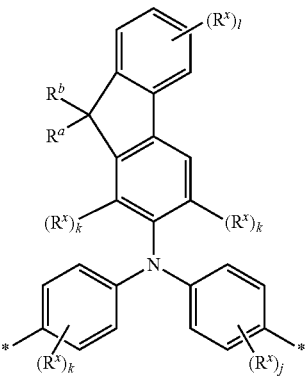

(II b)

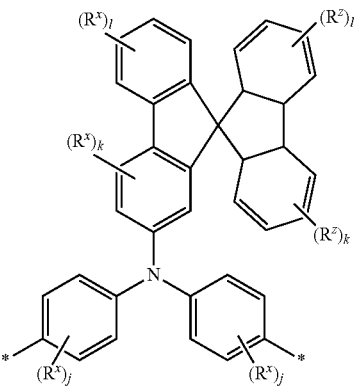

(II c)

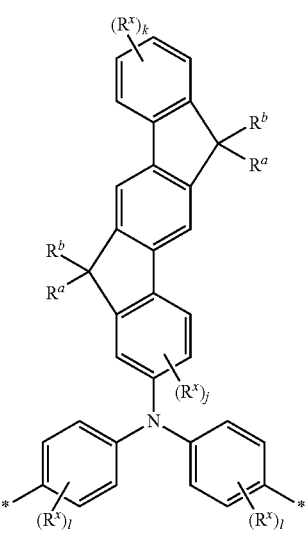

(II d)

In another preferred case, the pendant aromatic ring of the polytriarylamine unit constitutes one of the aromatic rings of the fluorene, spirobifluorene or indenofluorene structures as represented by Formulae (II b), (II c) and (II d). In Formulae (II b) to (II d), the groups $R^x$, and $R^y$ have the same definitions as previously stated.

In another preferred case, the 'backbone' aromatic ring of the polytriarylamine unit constitutes one of the aromatic rings of the fluorene, spirobifluorene or indenofluorene structures as represented by Formulae (II e), (II f) and (II g). In formulae (II e) to (II g), the groups $R^x$, $R^y$ and $R^z$ have the same definitions as previously stated.

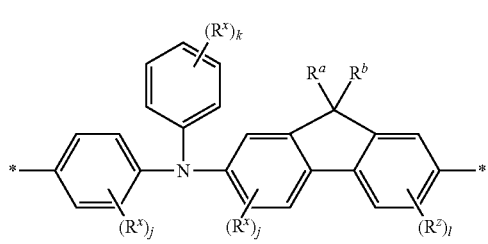

(II e)

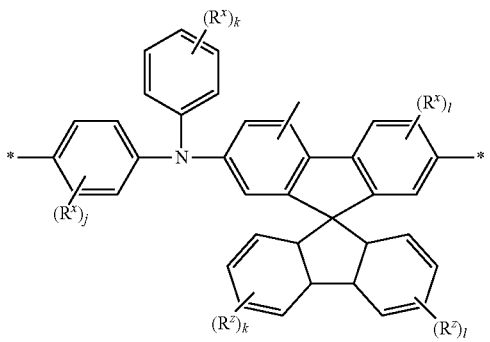

(II f)

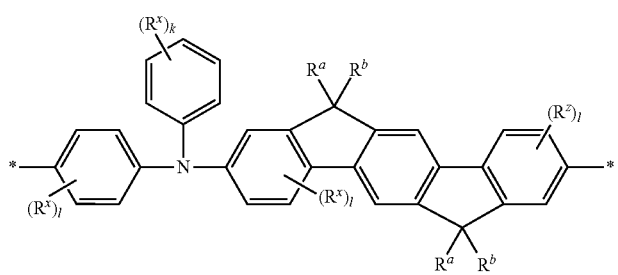

(II g)

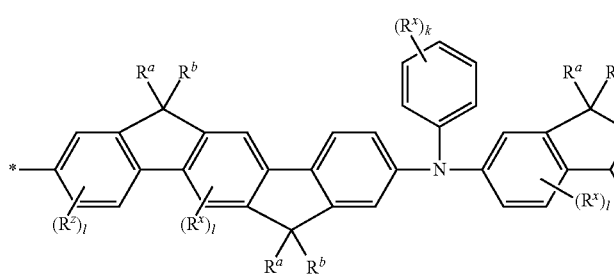

(II h)

Specific embodiments of devices, methods and preferred polymers are also provided. For example, specifically preferred devices include organic thin film transistors or transistor arrays, embedded capacitors and integrated circuits. The devices preferably include an organic semiconducting layer incorporating a semiconducting polymer having a dielectric constant greater than 3.4 and a polyacene organic semiconductor.

The organic semiconductor layer includes a layer that can be formed on a substrate; this may be glass, poly (ethylene naphthalate) (PEN), poly (ethylene terephthalate (PET) or polyimide. The term layer is synonymous with the term "film" frequently used in the printed electronics industry The high dielectric constant semiconducting polymers of the present invention can be made having the following characteristics: coatable from solution, high glass transition temperatures (greater than 100° C.), processable in air and are compatible with flexible substrates Cross linkable and/or photo-patternable polymers are optional; when cross-linkable groups are incorporated into the semiconducting polymer it may be photo-patterned using a variety of techniques well known to those skilled in the art. Photo-patterning is described in Application number WO 97/15173.

Suitable polyacene semiconductors for use in combination with the semiconducting polymers of this invention are described in Applications WO 2005/055248, WO2007/082584, WO 2008/107089 and WO2009/155106 and the definitions therein apply to the polyacene compounds included in this invention. Suitable syntheses methods for the polyacene semiconductors are described in these applications.

Preferred polyacenes of the present invention are those having formula (A):

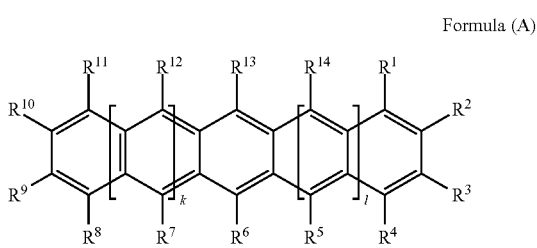

Formula (A)

In which each of the R groups may be the same or different, independently represents hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(C═O)NH$_2$); a haloformyl group (—C(C═O)—X, wherein X represents a halogen atom); a formyl group (—C(C═O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and wherein independently each pair of R$_2$ and R$_3$ and/or R$_8$ and R$_9$ may be cross-bridged to form a C$_4$-C$_{40}$ saturated or unsaturated ring, which saturated or unsaturated ring may be intervened by an oxygen atom, a sulphur atom or a group shown by formula —N(R$_3$)— (wherein R$_3$ is a hydrogen atom or an optionally substituted hydrocarbon group), or may optionally be substituted; and wherein one or more of the carbon atoms of the polyacene skeleton may optionally be substituted by a heteroatom selected from N, P, As, O, S, Se and Te; and wherein independently any two or more of the substituents R$_1$-R$_{12}$ which are located on adjacent ring positions of the polyacene may, together, optionally constitute a further C$_4$-C$_{40}$ saturated or unsaturated ring optionally interrupted by O, S or —N(R$_3$) where R$_3$ is as defined above) or an aromatic ring system, fused to the polyacene; and wherein k plus l in Formula A may be 0, 1, 2, 3 or 4.

It is preferred that the carbyl or hydrocarbyl groups should be substituted by a trisubstituted silyl group. It is preferred that the substituted carbyl group is a trisubstituted silyl ethynyl group.

It is preferred that an acene ring, which is preferably the central acene ring if the number of acene rings is odd, or one of the two central acene rings if the number is even, should be substituted by two trisubstituted silyl ethynyl groups. If the number of acene rings is three, suitably the substituent groups R of the terminal acene groups (shown as R$^2$. R$^3$, R$^9$ and R$^{10}$ in the above formula) may be cross-bridged forming a C$_4$-C$_8$ saturated or unsaturated ring, preferably five membered unsaturated rings which each comprise a nitrogen or sulphur hetero atom.

Especially preferred are compounds of Formula (A2)

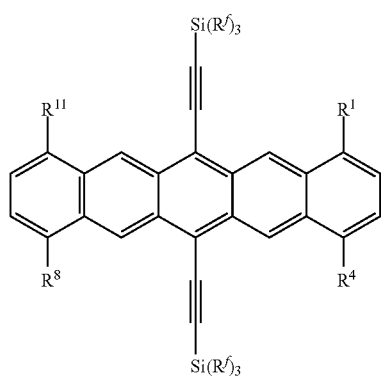

Formula (A2)

Wherein the 6 and 13 positions on the pentacene are both substituted by trialkylsilylethynyl groups where the silyl groups are substituted by three alkyl groups denoted by R$^f$ which may be the same or different and preferably have 1 to 4 and preferably two or three carbon atoms.

R$^1$, R$^4$, R$^8$ and R$^{11}$ are C$_1$ to C$_6$ hydrocarbyl or hydrocarbyloxy groups which are preferably C$_1$ to C$_6$ alkyl or alkoxy groups which are preferably identical for example, methyl, ethyl, propyl, isopropyl or butyl groups.

In one embodiment, when R$^1$, R$^4$, R$^8$, R$^{11}$ are methyl groups, R$^f$ are ethyl groups.

In another embodiment, when R$^1$, R$^4$, R$^8$, R$^{11}$ are methyl groups, R$^f$ are isopropyl groups.

In another preferred embodiment, R$^1$, R$^4$, R$^8$, R$^{11}$ are C$_1$ to C$_6$ alkoxy groups, for example methoxy, ethoxy, propyloxy, butyloxy, etc.

When R$^1$, R$^4$, R$^8$, R$^{11}$ are methoxy groups, R$^f$ are preferably ethyl groups, or isopropyl groups.

In another embodiment, R$^1$, R$^4$, R$^8$, R$^{11}$ are aryloxy groups and R$^f$ are individually alkyl groups having 1 to 4 and preferably two or three carbon atoms.

In a further embodiment of the invention, preferred compounds are represented by Formula (A3);

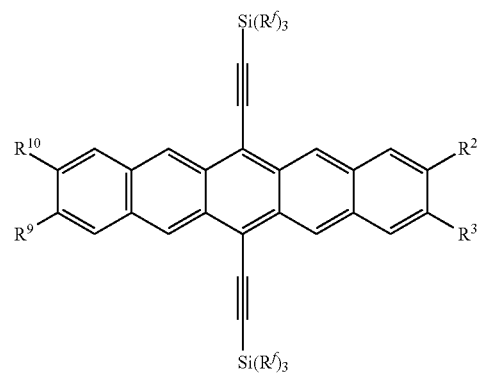

Formula (A3)

Wherein the 6 and 13 positions on the pentacene are both substituted by trialkylsilylethynyl groups on which the alkyl groups are denoted by R$^f$ which may be the same or different and preferably have 1 to 4 and preferably two or three carbon atoms.

R$^2$, R$^3$ R$^9$, R$^{10}$ are C$_1$ to C$_6$ hydrocarbyl groups which are preferably identical alkyl groups for example, methyl, ethyl, propyl, isopropyl or butyl groups;

In one embodiment, when R$^2$, R$^3$, R$^9$, R$^{10}$ are methyl groups, R$^f$ are ethyl groups.

In another embodiment, when R$^2$, R$^3$, R$^9$, R$^{10}$ are methyl groups, R$^f$ are isopropyl groups.

Alternatively R$^2$, R$^3$, R$^9$, R$^{10}$ may be C$_1$ to C$_6$ alkoxy groups, for example methoxy, ethoxy, propyloxy, butyloxy, etc.

When R$^2$, R$^3$, R$^9$, R$^{10}$ are methoxy groups, R$^f$ are ethyl groups.

or isopropyl groups.

In another embodiment, R$^2$, R$^3$, R$^9$, R$^{10}$ are aryloxy groups. In a further embodiment of the invention, preferred compounds are represented by Formula (B1);

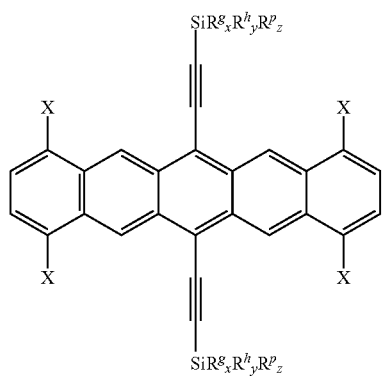

(B1)

Wherein for compounds having Formula (B1):
each R$^g$ group independently comprises (i) a branched or unbranched, substituted or unsubstituted alkyl group, (ii) a substituted or unsubstituted cycloalkyl group, or (iii) a substituted or unsubstituted cycloalkylalkylene group;
each R$^h$ independently comprises (i) a branched or unbranched, substituted or unsubstituted alkenyl group, (ii) a substituted or unsubstituted cycloalkyl group, or (iii) a substituted or unsubstituted cycloalkylalkylene group;
R$^p$ comprises (i) hydrogen, (ii) a branched or unbranched, substituted or unsubstituted alkynyl group, (iii) a substituted or unsubstituted cycloalkyl group, (iv) a substituted or unsubstituted cycloalkylalkylene group, (v) a substituted aryl group, (vi) a substituted or unsubstituted arylalkylene group (vii) an acetyl group, (viii) a substituted or unsubstituted heterocyclic ring comprising at least one of 0, N, S and Se in the ring:
x=1 or 2;
y=1 or 2;
z=1 or 2;
(x+y+z)=3;
X represents C$_1$ to C$_{20}$ hydrocarbyl groups which are preferably identical alkyl groups, more preferably, methyl; or X is C$_1$-C$_{20}$ alkoxy group, more preferably methoxy.

In a further embodiment of the invention, preferred compounds are represented by Formula (B2); the same definitions for the R$^g$, R$^h$, R$^p$, x, y, z and X apply as for formula (B1).

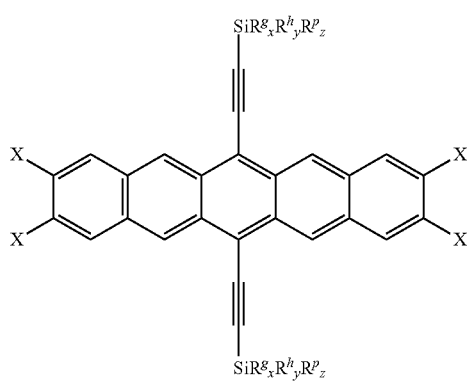

(B2)

Exemplary compounds of formula (B1) and (B2) are represented below;

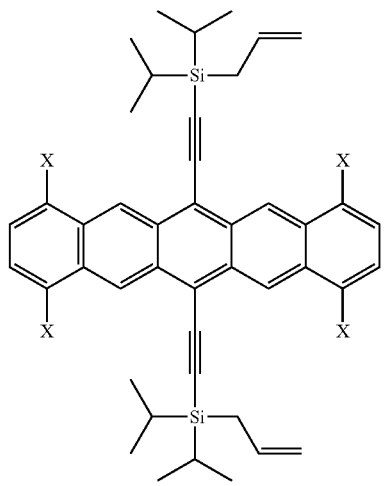

B1 (a)

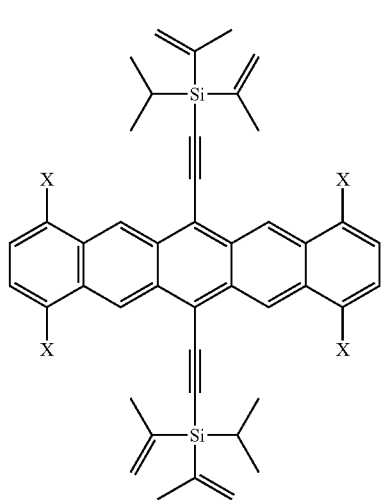

B1(b)

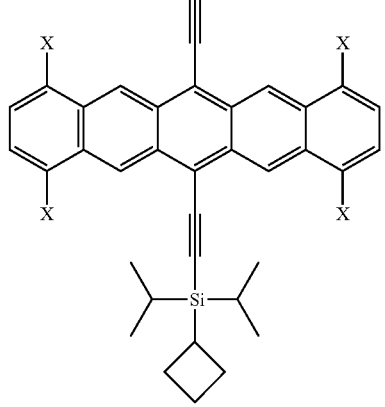

B1 (c)

-continued

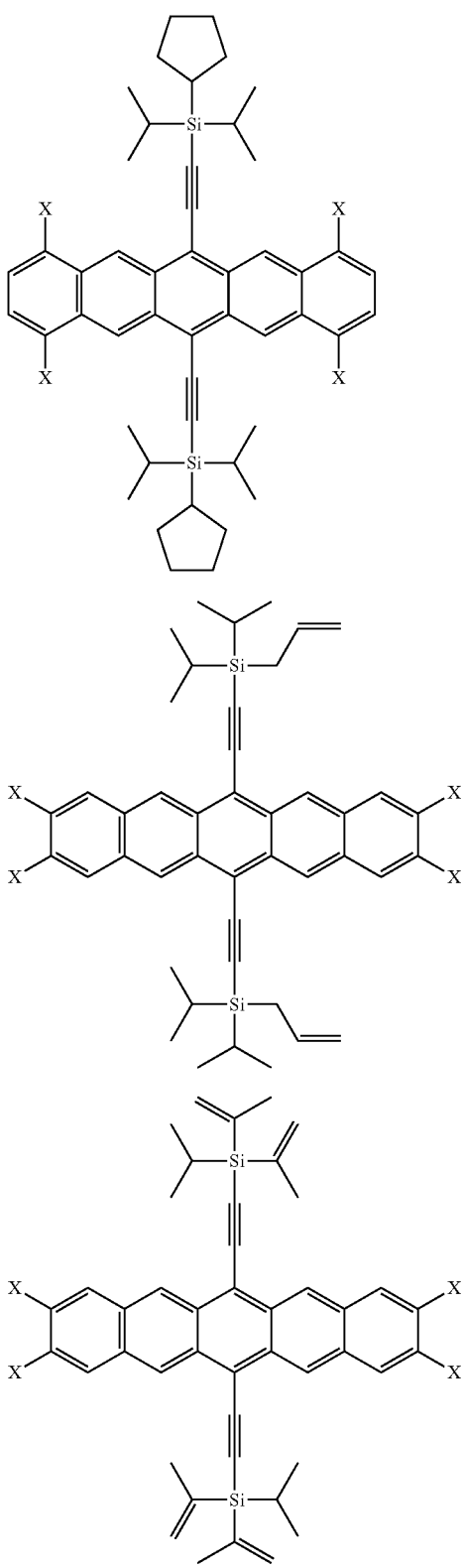

B1 (d)

B2(a)

B2(b)

The most preferred examples of compounds of Formula B1 include: 1,4,8,11-tetramethyl-bis(allyldiisopropylsilylethynyl)pentacene; 1,4,8,11-tetramethyl-bis(isopropenyldiisopropysilylethynyl)pentacene; 1,4,8,11-tetramethyl-bis(diisopropenylisopropylsilylethynyl)pentacene; 1,4,8,11-tetramethyl-bis(cylopropyldiisopropylsilylethynyl)pentacene; 1,4,8,11-tetramethyl-bis(cylobutyldiisopropylsilylethynyl)pentacene; 1,4,8,11-tetramethyl-bis(cylopentyldiisopropylysilylethynyl)pentacene and the corresponding 1,4,8,11-tetramethoxy substituted compounds.

The most preferred examples of compounds of Formula B2 include: 2,3,9,10-tetramethyl-bis(allyldiisopropylsilylethynyl)pentacene; 2,3,9,10-tetramethyl-bis(isopropenyldiisopropysilylethynyl)pentacene; 2,3,9,10-tetramethyl-bis(diisopropenylisopropylsilylethynyl)pentacene; 2,3,9,10-tetramethyl-bis(cyclopropyldiisopropylsilylethynyl)pentacene; 2,3,9,10-tetramethyl-bis(cyclobutyldiisopropylsilylethynyl)pentacene; 2,3,9,10-tetramethyl-bis(cyclopentyldiisopropylysilylethynyl)pentacene and the corresponding 2,3,9,10-tetramethoxy substituted compounds.

In a further embodiment of the invention, preferred compounds are represented by Formula (C);

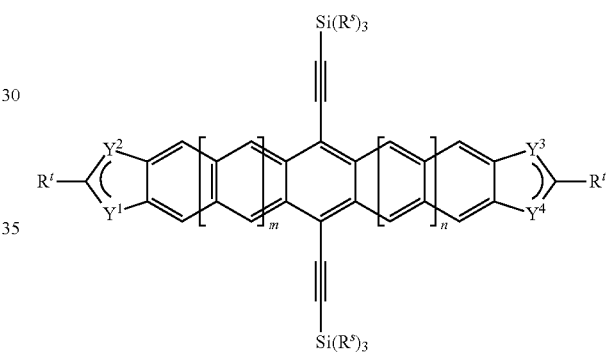

Formula (C)

wherein one of $Y^1$ and $Y^2$ denotes —CH= or =CH— and the other denotes —X'—, one of $Y^3$ and $Y^4$ denotes —CH= or =CH— and the other denotes —X'—, X is —O—, —S—, —Se—, or —NR'''—, $R^s$ is cyclic straight chain or branched alkyl or alkoxy having 1 to 20, preferably 1 to 8 C-atoms, or aryl having 2 to 30 C-atoms, all of which are optionally fluorinated or perfluorinated, with $SiR_3$ preferably being trialkylsilyl, $R^t$ is H, F, Cl, Br, I, CN, straight chain or branched alkyl or alkoxy having 1 to 20, preferably 1 to 8 C-atoms and optionally being fluorinated or perfluorinated, optionally fluorinated or perfluorinated aryl having 6 to 30 carbon atoms, preferably $C_6F_5$, or $CO_2R''$, with $R''$ being H, optionally fluorinated alkyl having 1 to 20 carbon atoms, or optionally fluorinated aryl having 2 to 30, preferably 5 to 20 carbon atoms, R''' is H or cyclic, straight chain or branched alkyl with 1 to 10 carbon atoms, preferably H, m is 0 or 1 n is 0 or 1

Especially preferred polyacenes of Formula (C) include:

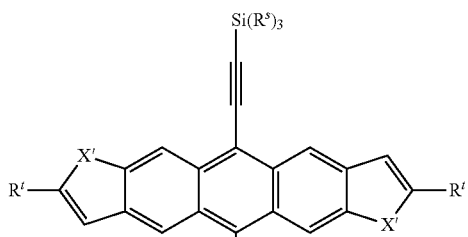

Formula (C1)

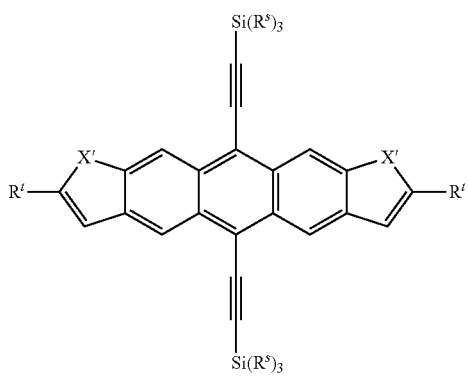

Formula (C2)

The ratio of binder to semiconductor is suitably from 20:1 to 1:20, preferably from 10:1 to 1:10 and more preferably from 5:1 to 1:5 by weight.

The organic semiconducting formulations are suitably deposited using solution coating techniques. Examples of such techniques include spin coating, drop casting, dip coating, ink jet printing, nozzle jet printing, spray coating, screen printing, offset printing, flexo-printing, gravure printing and transfer printing. Solvents suitable for use with the semiconducting polymers of the present invention include any solvent suitable for coating by any of the above methods.

Examples of useful solvents for solution coating the organic semiconducting layer include but are not limited to hydrocarbons, particularly aromatic hydrocarbons, ketonic solvents, alcohols, ethers, esters and chlorinated solvents. More particularly useful are solvents such as anisole, toluene, tetralin, cyclohexanone, cyclopentanone, methyl ethyl ketone, methyl isobutyl ketone, dimethylformamide, dimethyl sulphoxide, dimethylacetamide, butyl acetate, 1-methoxy-2-propyl acetate, ethyl lactate, 4-dimethylaminopyridine and dichlorobenzene and bromobenzene.

Method for the Measurement of the Permittivity, $\varepsilon_r$, of the Polymers The permittivities of the semiconducting polymers in examples 1 to 17 were measured by fabricating capacitors according to the method detailed below. 50 nm titanium bottom contact pads were prepared using sputter coating and standard photolithography and wet etching techniques. The semiconducting polymer of interest was then coated from solution, using a spin coater, to obtain a film thickness of typically greater than 500 nm. The solvents used to dissolve the materials are shown in the text below. A top contact pad of approximately 50 nm aluminium was then deposited using shadow mask evaporation. The capacitance was measured using a calibrated Agilent Precision LCR meter E4980A set at a frequency of 1000 Hz. Film thickness measurements were performed using a Dektak surface profilometer and cross correlated with a Taylor Hobson Talysurf CCI white light interferometer. The two techniques were found to agree to within +/−3% for all films studied. The area of overlap for the top and bottom contact pads, i.e. the area of the capacitor formed, were measured using a Zeiss stereo microscope equipped with image analysis software. Using these values the permittivities were then calculated using the equation:

$$\varepsilon_r = \frac{C \cdot d}{A \cdot \varepsilon_0}$$ Equation 1

Equation 1: Calculation of permittivity.
Where,
$\varepsilon_r$ is the permittivity of the polytriarylamine analogue
C is the measured capacitance of the capacitor
d is the thickness of the film of the polytriarylamine analogue
A is the area of the capacitor and $\varepsilon_o$ is the permittivity of free space (a constant with a value of $8.854 \times 10^{-12}$ F/m).

The capacitor array used contains 64 capacitors with areas of 0.11 cm$^2$ and 0.06 cm$^2$ respectively (32 of each size). The standard deviation for the value of permittivity on each array was calculated, which includes the standard deviation of capacitance, film thickness and area measurement combined. In addition, where possible, each semiconducting polymer was tested at two different film thicknesses to confirm that the permittivity value did not vary with film thickness.

Permittivity Data

Using the above described method the data included in Table 1(a) was obtained.

TABLE 1(a)

Details of capacitor arrays fabricated and measured for each polymer

| Polymer (Polytriarylamine = PTAA) | Average Film Thickness, nm | Permittivity, $\varepsilon_r$ (s.d, %) |
|---|---|---|
| 2-Cyano-PTAA homopolymer | 767 [c] | 3.88 (2.2) |
| Example (1) | 736 [c] | 3.64 (2.3) |
|  | 758 [c] | 3.97 (3.2) |
| 2,4-DiMeO-PTAA homopolymer | 2195 [d] | 4.09 (3.9) |
| Example (2) | 659 [c] | 3.77 (0.9) |
|  | 645 [c] | 3.70 (2.3) |
|  | 404 [q] | 3.84 (0.8) |
| 4-isopropylcyano-PTAA homopolymer | 998 [e] | 5.80 (2.3) |
| Example (3) | 936 [e] | 6.04 (1.1) |
|  | 481 [f] | 5.86 (3.9) |
| 50:50 random copolymer, 4-isopropylcyano-PTAA:2,4-dimethyl-PTAA | 706 [a] | 4.05 (5.1) |
|  | 466 [b] | 4.07 (2.6) |
| Example (4) | 467 [b] | 4.05 (1.0) |
| 30:70 random copolymer, 4-isopropylcyano-PTAA:2,4-dimethyl-PTAA | 606 [o] | 3.73 (2.1) |
|  | 604 [o] | 3.66 (0.4) |
| Example (5) | 453 [p] | 3.63 (1.3) |
| 2,4 Dimethoxyphenyl-PTAA homopolymer | 897 [r] | 3.47 (2.2) |
| Example (6) | 893 [r] | 3.55 (0.7) |
|  | 574 [s] | 3.50 (1.8) |
|  | 573 [s] | 3.52 (1.8) |

TABLE 1(a)-continued

Details of capacitor arrays fabricated and measured for each polymer

| Polymer (Polytriarylamine = PTAA) | Average Film Thickness, nm | Permittivity, $\epsilon_r$ (s.d, %) |
|---|---|---|
| 50:50 copolymer of 4-isopropylcyanophenyl-PTAA:2,4-Dimethyl-PTAA Example (7) | 105 [r] | 4.13 (0.9) |
| | 966 [r] | 3.92 (1.6) |
| | 535 [s] | 3.88 (2.1) |
| | 546 [s] | 4.22 (4.2) |
| 4-cyclohexylcyano-PTAA homopolymer Example (8) | 520 [u] | 4.12 (12.8) |
| | 293 [v] | 4.0 (18.9) |
| | 282 [v] | 4.10 (11.4) |
| 70:30 random copolymer, 4-isopropylcyano-triarylamine-dioctyl-fluorene Example (9) | 467 [o] | 4.49 (0.6) |
| | 467 [o] | 4.50 (0.7) |
| | 393 [t] | 4.61 (1.0) |
| | 398 [t] | 4.63 (1.1) |
| 70:30 random copolymer, 4-isopropylcyano-triarylamine-tetraoctyl-indenofluorene Example (10) | 569 [o] | 3.96 (2.4) |
| | 578 [o] | 4.03 (1.3) |
| | 432 [p] | 4.08 (0.5) |
| | 440 [p] | 3.99 (1.4) |
| 70:30 2,4-Dimethyl-PTAA:4-isopropylcyano-PTAA Bis-aryl end terminated copolymer Example (11) | 460 [o] | 3.52 (1.0) |
| | 458 [o] | 3.55 (4.1) |
| | 368 [p] | 3.66 (6.5) |
| | 367 [p] | 3.69 (3.0) |
| 2,4-Dimethyl-PTAA homopolymer Comparative Example (12) | 10641 [g, h] | 3.08 (8.3) |
| | 9307 [g, h] | 3.00 (12.8) |
| | 12510 [h, i] | 2.99 (9.3) |
| 3-Methoxy-PTAA homopolymer Comparative Example (13) | 12547 [i, j] | 3.29 (10.5) |
| | 9575 [i, j] | 3.29 (8.4) |
| 2,4-Difluoro-PTAA homopolymer Comparative Example (14) | 883 [k, l] | 3.22 (2.6) |
| | 846 [k, l] | 3.32 (3.8) |
| | 614 [g, l] | 3.24 (2.9) |
| 3,5-bis(trifluoromethyl)-PTAA homopolymer Comparative Example (15) | 730 [k, m] | 2.80 (2.1) |
| | 756 [k, m] | 2.84 (3.5) |
| Backbone-2-Methoxy-PTAA homopolymer Comparative Example (16) | 453 [o] | 3.30 (2.3) |
| | 436 [o] | 3.28 (2.7) |
| | 365 [y] | 3.26 (0.7) |
| | 378 [y] | 3.33 (1.5) |
| 4-Phenoxy-PTAA homopolymer Comparative Example (17) | 826 [w] | 2.90 (4.9) |
| | 435 [x] | 2.59 (3.8) |
| 50:50 2,4-methyl-triarylamine-dioctyl-fluorene copolymer Comparative Example (18) | 614 [o] | 2.68 (1.8) |
| | 608 [o] | 2.69 (0.8) |
| | 470 [p] | 2.63 (1.2) |
| | 457 [p] | 2.80 (2.8) |
| 50:50 4-secbutyl-triarylamine-tetraoctyl-indenofluorene copolymer Comparative Example (19) | 593 [o] | 2.56 (1.4) |
| | 601 [o] | 2.62 (1.7) |
| | 459 [p] | 2.66 (1.4) |
| | 454 [p] | 2.63 (1.1) |

[a] 5 wt % of polymer formulated in tetralin, coated at 300 rpm, 20 s
[b] 5 wt % of polymer formulated in tetralin, coated at 500 rpm, 20 s
[c] 5 wt % of polymer formulated in o-dichlorobenzene, coated at 300 rpm, 20 s
[d] 10 wt % of polymer formulated in o-dichlorobenzene, coated at 300 rpm, 20 s
[e] 3 wt % of polymer formulated in dichloromethane, coated at 300 rpm, 20 s
[f] 2 wt % of polymer formulated in dichloromethane, coated at 300 rpm, 20 s
[g] Prepared using gold top and bottom contacts and capacitors with an area of 0.24 $cm^2$
[h] 10 wt % of polymer formulated in toluene, coated at 700 rpm, 20 s
[i] Prepared using gold top and bottom contacts and capacitors with an area of 0.15 $cm^2$
[j] 10 wt % of polymer formulated in tetralin, coated at 500 rpm, 20 s
[k] Prepared using gold top and bottom contacts and capacitors with an area of 0.11 and 0.06 $cm^2$
[l] 10 wt % of polymer formulated in toluene, coated at 500 rpm, 20 s
[m] 5 wt % of polymer formulated in 50/50 vol THF/cyclohexanone, coated at 300 rpm, 20 s
[n] 5 wt % of polymer formulated in 50/50 vol THF/cyclohexanone, coated at 500 rpm, 20 s
[o] 5 wt % of polymer formulated in toluene, coated at 300 rpm, 20 s
[p] 5 wt % of polymer formulated in toluene, coated at 500 rpm, 20 s
[q] 5 wt % of polymer formulated in o-dichlorobenzene, coated at 500 rpm, 20 s
[r] 5 wt % of polymer formulated in bromobenzene, coated at 300 rpm, 20 s
[s] 5 wt % of polymer formulated in bromobenzene, coated at 500 rpm, 20 s
[t] 5 wt % of polymer formulated in toluene, coated at 450 rpm, 20 s
[u] 3 wt % of polymer formulated in phenetole, coated at 100 rpm, 20 s
[v] 3 wt % of polymer formulated in phenetole, coated at 200 rpm, 20 s
[w] 7 wt % of polymer formulated in tetralin, coated at 300 rpm, 20 s
[x] 7 wt % of polymer formulated in tetralin, coated at 500 rpm, 20 s
[y] 5 wt % of polymer formulated in toluene, coated at 400 rpm, 20 s OTFTs were fabricated in top gate configuration (refer to FIG. 1) using glass substrates. The method of fabrication is as described below.

Glass Based OTFT Devices

4" square glass substrates (ex Corning Eagle 2000) were cleaned using sonication 20 minutes in Deconex (3% in water) followed by rinsing in ultrapure water and dried using compressed air. The source and drain metal (Au 50 nm on top of Ti 5 nm) was sputter coated onto the glass. The source-drain (SD) electrodes were patterned using standard photolithography and wet chemical etching. The transistor SD pattern on the lithographic mask consisted of electrodes with channel lengths ranging from 4 µm, 10 µm, 30 µm, and 100 µm, and channel widths of 0.5 mm, 3 mm and 15 mm. The pattern was arrayed to produce 36 transistors of each channel length over a 4" square substrate. Following inspection of the etched pattern, the photoresist material was stripped chemically and the SD channel lengths were measured using a compound microscope. The substrates then underwent plasma treatment (model PE100, ex Plasma Etch Inc.) using 50 sccm argon/50 sccm oxygen plasma and a RF power of 250 W, treatment time 60 s. Prior to spin coating of the OSC solution, a 10 mM solution of pentafluorobenzenethiol was applied to the surface of the electrodes for 1 minute followed by spin coating and rinsing in 2-propanol, followed by drying on a hotplate at 100° C. The organic semiconductor (OSC) formulation was spin coated onto the SD electrodes using a Suss RC12 spinner set at 1000 rpm followed by baking on a hotplate for 60 seconds at 100° C. A solution of 2 parts Cytop CTL 809M (Asahi Glass) to 1 part FC43 solvent (Acros Organics) was spin coated at 1500 rpm and the sample was baked on a hotplate for 60 s at 100° C. Gate electrodes were defined by evaporation of gold through a shadow mask in a thermal evaporator system.

OTFT Characterisation

OTFTs were tested using a Wentworth Pegasus 300S semi-automated probe station in conjunction with a Keithley S4200 semiconductor parameter analyser. This allowed a statistically significant number of OTFT device measurements to be made on each substrate. The Keithley system calculated the linear mobility according to the equation shown below (Equation 2)

$$\mu = \frac{\partial I_{DS}}{\partial V_G} \frac{L}{W C_i V_{DS}}$$

Where L is the transistor length, W is the transistor width and $C_i$ is the dielectric capacitance per unit area. $V_{ds}$ was set at −2V unless otherwise stated. The mobility values reported are an average of the 5 highest points in accumulation for each transistor. The standard deviation of the mobility values is reported as a percentage of the mean, and the number of devices measured is also indicated in the table of results.

Table 1(b): TFT Mobility of Each Polymer, with Polymer Formulation Details

| Polymer (Polytriarylamine = PTAA) | Polymer formulation | Mobility at 4 μm channel length, cm2/Vs | Standard deviation of mobility, % | Number of working transistors tested on substrate (out of 36) |
|---|---|---|---|---|
| 2-cyano-PTAA homopolymer Example (1) | 1 wt % in bromobenzene | $1.2 \times 10^{-6}$ | 6.6 | 27 |
| 2,4-DiMeO-PTAA homopolymer Example (2) | 1 wt % in bromobenzene | $3 \times 10^{-4}$ | 11.7 | 12 |
| 4-isopropylcyano-PTAA homopolymer Example (3) | 1 wt % in dichloromethane | $1.1 \times 10^{-6}$ | 2.7 | 3 |
| 50:50 random copolymer, 4-isopropylcyano-PTAA:2,4-dimethyl PTAA Example (4) | 1 wt % in tetralin | $8 \times 10^{-5}$ | 15.4 | 25 |
| 30:70 random copolymer, 4-isopropylcyano-PTAA:2,4-dimethyl PTAA Example (5) | 1 wt % in toluene | $1 \times 10^{-4}$ | 14.7 | 35 |
| 2,4 Dimethoxyphenyl-PTAA homopolymer Example (6) | 1 wt % in bromobenzene | $5 \times 10^{-4}$ | 5.5 | 19 |
| 50:50 random copolymer of 4-isopropylcyano-phenyl-PTAA:2,4-Dimethyl-PTAA Example (7) | 1 wt % in bromobenzene | $1 \times 10^{-4}$ | 6.0 | 29 |
| 4-cyclohexylcyano PTAA homopolymer Example (8) | 1 wt % in phenetole | $1 \times 10^{-5}$ | 9.5 | 13 |
| 70:30 random copolymer 4-isopropylcyano triarylamine-dioctyl-fluorene Example (9) | 1 wt % in toluene | $1 \times 10^{-5}$ | 9.8 | 13 |
| 70:30 random copolymer 4-isopropylcyano triarylamine-tetraoctyl-indenofluorene Example (10) | 1 wt % in Toluene | $1.70 \times 10^{-5}$ | 16.8 | 33 |
| 70:30 2,4-Dimethyl-PTAA: 4-isopropylcyano-PTAA Bis-aryl end terminated copolymer from Suzuki coupling, Example (11) | 1 wt % in toluene | $1.7 \times 10^{-4}$ | 24.9 | 32 |
| 2,4-Dimethyl-PTAA homopolymer Comparative Example (12) | 1 wt % in toluene | $3.7 \times 10^{-3}$ | 12.7 | 27 |
| 3-Methoxy-PTAA homopolymer, Comparative Example (13) | 1 wt % in tetralin | $8.4 \times 10^{-4}$ | 5.4 | 17 |
| 2,4-Difluoro PTAA homopolymer, Comparative example (14) | 1 wt % in tetralin | $9.2 \times 10^{-5}$ | 29.8 | 25 |
| 3,5-bis(trifluoromethyl)-PTAA homopolymer, Comparative example (15) | 1 wt % in THF/cyclohexanone (1:3 by volume) | $9.3 \times 10^{-6}$ | 26.8 | 18 |
| Backbone 2-methoxy PTAA homopolymer Comparative example (16) | 1 wt % in toluene | $6.8 \times 10^{-5}$ | 4.0 | 27 |
| 4-Phenoxy-PTAA homopolymer Comparative Example (17) | 1 wt % in tetralin | $1.1 \times 10^{-3}$ | 6.6 | 32 |
| 50:50 2,4-methyl-triarylamine-dioctyl-fluorene copolymer Comparative Example (18) | 1 wt % in toluene | $2.9 \times 10^{-3}$ | 13.1 | 26 |
| 50:50 4-sec-butyl-triarylamine-tetraoctyl-indenofluorene copolymer Comparative Example (19) | 1 wt % in toluene | $7.7 \times 10^{-3}$ | 27.4 | 28 |

Method for Fabricating the Organic Thin Film Transistors (OTFTs) and for Characterising Mobility ($\mu$, cm$^2$/Vs)

Top gate and bottom gate OTFTs similar to those described as FIGS. 1 to 4 in Application WO 2007/078993 are provided in this invention.

OTFTs were fabricated in top gate and bottom gate configuration using either glass or plastic based substrates. The method of fabrication is as described below.

OTFTs Prepared on Polyethylenenaphthalate (PEN) Substrate

PEN substrates (tradename Teonex Q65FA, from DuPont Teijin films) were laminated onto a glass based carrier for processing using a double sided pressure sensitive adhesive. The source and drain metal (Au 50 nm on top of Ti 5 nm) was sputter coated onto the plastic. The source-drain (SD) electrodes were patterned using standard photolithography and wet chemical etching. The transistor SD pattern on the lithographic mask consisted of electrodes with channel lengths ranging from 4 µm, 10 µm, 30 µm, and 100 µm, and channel widths of 0.5 mm, 3 mm and 15 mm. The pattern was arrayed to produce 25 transistors of each channel length over a 4" square substrate. Following inspection of the etched pattern, the photoresist material was stripped chemically and the SD channel lengths were measured using a compound microscope. Prior to spin coating of the OSC solution, a 10 mM solution of pentafluorobenzenethiol was applied to the surface of the electrodes for 1 minute followed by spin coating and rinsing in 2-propanol, followed by drying on a hotplate. The organic semiconductor (OSC) formulation was spin coated onto the SD electrodes using a Suss RC12 spinner set at 1500 rpm followed by baking on a hotplate for 60 seconds at 100° C. A solution of 2 parts Cytop CTL 809M (Asahi Glass) to 1 part FC43 solvent (Acros Organics) was spin coated at 1500 rpm and the sample was baked on a hotplate for 60 s at 100° C. Gate electrodes were defined by evaporation of gold through a shadow mask in a thermal evaporator system.

Glass Based OTFT Devices

4" square glass substrates (ex Corning Eagle 2000) were cleaned using sonication 20 minutes in Deconex (3% in water) followed by rinsing in ultrapure water and dried using compressed air. Thereafter the substrates were processed in the same manner as the PEN substrates (omitting the lamination step) to pattern the SD electrodes (Au/Ti). The substrates then underwent a plasma treatment (model PE100, ex Plasma Etch Inc.) using 50 sccm argon/50 sccm oxygen plasma and a RF power of 250 W, treatment time 60 s. The thiol treatment was then carried out as for the PEN process described above. Following this the substrate was then treated with a 10 mM solution of phenylethyltrichlorosilane in toluene. This was deposited onto the substrate and left to form a self-assembled monolayer over a period of 1 minute. The excess solution was spun off using a spin condition of 1000 rpm for 20 seconds. Following this, the substrate was flooded with toluene, left for 1 minute before using the same spin conditions to spin off the excess solvent, followed by a final wash with toluene. The substrate was then placed on a pre-heated hot plate at 110° C. for 1 minute. The remainder of the process (OSC & dielectric coating and gate deposition) was the same as the PEN process described above.

Glass Based OTFT Devices with SU8 Planarisation Layer (Glass/SU8) (Refer to FIG. 1)

4" square glass substrates (layer 01) (ex Corning Eagle 2000) were cleaned using sonication 20 minutes in Deconex (3% in water) followed by rinsing in ultrapure water and dried using compressed air. The substrates were then sputter coated with a Ti (5 nm) layer followed by an Au (50 nm) layer. Bottom contact pads (layer 02) were patterned onto the glass surface by a combination of photolithographic and wet chemical etching of the deposited Ti/Au layer. The remaining resist layer was removed by UV flash exposure and subsequent immersion in resist developer. The substrates were then cleaned in an Oxford PlasmaLab 800Plus RIE system using oxygen plasma at a concentration of 100 sccm, a chamber pressure of 150 mTorr, and a RF power of 200 W for 5 minutes. The substrates were then coated with 4 ml of a 1.5:1 cyclopentanone:SU8 (2002; negative epoxy-type negative, near UV photoresist material, supplied by MicroChem Inc.) solution via spin coating at 2200 rpm. After spin coating, the substrates were first placed on a hotplate at 95° C. for 1 minutes, then UV flash exposed, post exposure baked at 95° C. for 2 minutes and finally baked at 115° C. for 10 minutes. The measured final thickness of the SU8 (layer 03) was measured to be 0.5 microns.

After the preparation of the SU8 sublayer the substrates were sputter coated with 50 nm of Au (no Ti layer), then source and drain electrodes (layer 04) were prepared with a combination of photolithographic and wet etching techniques as before for the bottom contacts pads. After removing the residual photolithographic resist from the source and drain contact by UV flash exposure and spin developing, the substrates were inspected under an optical microscopy and channel length features measured in several areas of the substrate.

Before proceeding with the OTFT fabrication, the substrates were treated again in an Oxford PlasmaLab 800Plus system in RIE mode, this time by means of an Ar/O$_2$ plasma at a concentration of 50 and 5 sccm respectively, a chamber pressure of 200 mTorr, a RF power of 200 W for 1 minute.

Prior to spin coating of the OSC solution, a 10 mM solution of pentafluorobenzenethiol was applied to the surface of the electrodes for 1 minute followed by spin coating and rinsing in 2-propanol, followed by drying on a hotplate. Unless otherwise stated, the OSC formulation was spin coated onto the SD electrodes using a Suss RC12 spinner set at 1500 rpm for 1 minute followed by baking on a hotplate for 60 s at 100° C. (layer 05). A solution of 2 parts Cytop 809M (Asahi Glass) to 1 part FC43 solvent (Acros Organics) was spin coated at 1000 rpm for 20 seconds and the sample was baked on a hotplate for 60 s at 100° C. (layer 06).

The substrates were then sputter coated with 50 nm of Au and the gate electrodes were patterned as before with a combination of photolithographic and wet etching (layer 07).

Glass Based OTFT Devices by Inkjet Printing (Glass/Inkjet) (Refer to FIG. 2)

4" square glass substrates (ex Corning Eagle 2000) were cleaned using sonication 20 minutes in Deconex (3% in water) followed by rinsing in ultrapure water and dried using compressed air. Thereafter the substrates were processed in the same manner as the previous glass based devices to pattern the SD electrodes (Au/Ti) (layer 02). Bank patterns are formed after SD electrodes step to define printing area precisely. The substrates were coated with 4 ml of SU8 (2002; negative epoxy-type negative, near UV photoresist material, supplied by MicroChem Inc.) via spin coating at 2500 rpm. After spin coating, the substrates were first placed on a hotplate at 95° C. for 1 minute, then exposed to UV with lithographic mask, followed by post-exposure bake at 95° C. for 2 minutes. SU8 developer (Microposit EC Solvent, Chestech Ltd., UK) is used for pattern development and the patterned substrates are hard-baked at 115° C. for 4.5 minutes. Thickness of the SU8 (layer 0.3) was measured to be 1.2 microns. 10 mM solution of pentafluorobenzenethiol was applied to the surface of the electrodes for 1 minute followed by spin coating and rinsing in 2-propanol, followed by drying on a hotplate at 110° C. for 1 minute. OSC is processed by inkjet printing. Drop-on-demand type inkjet printer (DMP2000, Fujifilm Dimatix, USA) and 10 pL nominal drop volume cartridge (DMC-11610, Fujifilm Dimatix, USA) is used. The substrate is dried on hotplate at 100° C. for 1 minute after inkjet printing. The remainder of the process (dielectric coating and gate deposition) was the same as the PEN or glass process described above.

Bottom Gate, Bottom Contact, OTFT Devices with SU8 Gate Dielectric

4" square glass substrates (Layer 01) were cleaned using sonication, 20 minutes in Deconex (3% in water) followed by rinsing in ultrapure water and dried using compressed air. The substrates were then sputter coated with a Ti (5 nm) layer followed by an Au (50 nm) layer. Gate electrodes (Layer 02) were patterned onto the glass surface by a combination of photolithographic and wet chemical etching of the deposited Ti/Au layer. The remaining resist was stripped by UV flash exposure and subsequent immersion in resist developer. The substrates were then cleaned in an Oxford PlasmaLab 800Plus RIE system using oxygen plasma at a concentration of 100 sccm, a chamber pressure of 150 mTorr, and a RF power of 200 W for 5 minutes. Substrates were then coated with 4 ml of a 1.5:1 cyclopentanone:SU8 (2002; negative epoxy-type negative, near UV photoresist material, supplied by MicroChem Inc.) solution via spin coating at 2200 rpm. After spin coating, the substrates were first placed on a hotplate at 95° C. for 1 minutes, then UV flood exposed, post exposure baked at 60° C. for 1 minute, followed by 95° C. for 1 minute. The layer was then developed and finally baked at 230° C. for 1 hour. The measured final thickness of the SU8 (layer 03) was measured to be 450 nm.

After the preparation of the SU8 sublayer the substrates were sputter coated with 50 nm of Au, then source and drain electrodes (Layer 04) were prepared with a combination of photolithographic and wet etching techniques as before, for the gate electrode. The residual photolithographic resist from the source and drain contact was removed by UV flash exposure and spin developing.

Prior to spin coating of the OSC solution, substrate electrodes were conditioned in a PlasmaEtch PE100 plasma chamber with concentration of 50 sccm $O_2$ and 50 sccm Ar, a chamber pressure of 200 mTorr, a RF power of 250 W for 1 minute. A 10 mM solution of 4-fluorothiophenol in 2-propanol was applied to the surface of the source/drain electrodes for 1 minute followed by spin coating and rinsing in 2-propanol, followed by drying on a hotplate.

The OSC formulation was spin coated using a Suss RC12 spinner with final spin of 1500 rpm for 1 minute followed by baking on a hotplate for 60 s at 100° C. (Layer 05).

A passivation layer (Layer 06) was formed by a solution of 1 part Cytop 809M (Asahi Glass) to 2 parts FC43 solvent (Acros Organics) spin coated at 1000 rpm for 20 seconds and baked on a hotplate for 60 s at 100° C.

Preparative Examples 1 to 11

NMR data was collected using instruments supplied by JEOL, specifically models ECX 300 and ECX 400.

All solvents used were of HPLC grade, unless otherwise stated.

Silica gel purifications were carried out using Davisil® 60A 40-63 μm, a product of Grace Davison Discovery Sciences, unless otherwise stated.

The number average molecular weight (Mn) quoted in the Examples herein were determined by gel permeation chromatography using a Hewlett Packard 1100 HPLC system with UV detection @ 254 nm, liquid chromatography data was processed using a CIRRUS GPC-Multi detector software calibrated against polystyrene standards (supplied by Varian 13 points molecular weight range 162-113300)

Also for convenience the Examples herein which are polymers are identified by the substituents on the aromatic rings in the repeat unit (for example the polytriarylamine having cyano substitution in the 2 position is called, 2-cyano-polytriarylamine polymer). Examples 1 to 5 were all synthesised by polymerising the corresponding dihalo substituted monomer(s), no end capping reagent as defined in WO 1999/32537 was used in this invention. The polymerisation method described in WO 1999/32537 is equally applicable to preparing the polymers of this invention.

Comparative Examples (i) to (iv)

The OTFT arrays fabricated and characterised as the Comparative Examples (i) to (iv) were fabricated and tested as described above. The formulations tested in the comparative examples included small molecule semiconductor however these formulations did not incorporate any semiconducting binders.

Comparative Example (i)

1,4,8,11-tetramethyl-bis-triethylsilylethynyl pentacene (TMTES) without semiconducting binder; TG OTFT 1,4,8,11-tetramethyl-bis-triethylsilylethynyl pentacene from the series of compounds represented by Formula (A2) was formulated in tetralin at 0.5% by weight total solids content. This was coated as an OSC layer in an OTFT device according to the method shown above for PEN substrate, with the exception that the OSC was coated at 500 rpm, for 35 seconds.

The TFT performance of this formulation is shown in Table (i) below:

TABLE (i)

| Composition | Channel length (microns) | Linear mobility [cm$^2$/Vs] | Standard deviation of mobility [%] | Number of transistors tested on substrate (out of 25) |
| --- | --- | --- | --- | --- |
| 1,4,8,11-tetramethyl-bis-triethylsilylethynyl pentacene | 100 | 2.55 | 48.5 | 15 |
| | 30 | 2.70 | 29.6 | 21 |
| | 10 | 1.90 | 32.8 | 15 |
| | 4 | 1.01 | 41.8 | 18 |

Comparative Example (ii)

1,4,8,11-tetramethyl-bis-triethylsilylethynyl pentacene (TMTES) without semiconducting binder; BG OTFT 1,4,8,11-tetramethyl-bis-triethylsilylethynyl pentacene from the series of compounds represented by Formula (A2) was formulated in tetralin at 0.5% by weight total solids content. This was coated as an OSC layer according to the method shown above for bottom gate, bottom contact OTFT devices with SU8 gate dielectric, with the exception that no plasma treatment was used; the thiol used was 10 mM pentafluorobenzenthiol in IPA and the coating speed for the OSC was 500 rpm for 35 seconds.

The TFT performance of this formulation is shown in Table (ii) below:

TABLE (ii)

| Composition | Channel length (microns) | Linear mobility [cm$^2$/Vs] | Standard deviation of mobility [%] | Number of transistors tested on substrate (out of 32) |
|---|---|---|---|---|
| 1,4,8,11-tetramethyl-bis-triethylsilylethynyl pentacene | 100 | 0.55 | 17.0 | 20 |
| | 30 | 0.42 | 33.6 | 28 |
| | 10 | 0.35 | 32.3 | 25 |
| | 4 | 0.27 | 30.5 | 25 |

Comparative Example (iii)

6,13-bis-triisopropvlsilylethynyl pentacene (TIPS) without semiconducting binder; TG OTFT 6,13-bis-triisopropylsilylethynyl pentacene from the series of compounds represented by Formula (A) was formulated in tetralin at 1% by weight total solids content. This was coated as an OSC layer in an OTFT device according to the method shown above for PEN substrate, with the exception that the OSC was coated at 750 rpm, 60 seconds.

The TFT performance of this formulation is shown in Table (iii) below:

TABLE (iii)

| Composition | Channel length (microns) | Linear mobility [cm$^2$/Vs] | Standard deviation of mobility [%] | Number of transistors tested on substrate (out of 25) |
|---|---|---|---|---|
| 6,13-bis-triisopropylsilylethynyl pentacene | 100 | 1.02 | 35.7 | 21 |
| | 30 | 1.00 | 44.2 | 21 |
| | 10 | 0.86 | 36.3 | 21 |
| | 4 | 0.57 | 33.7 | 22 |

Comparative Example (iv)

2,8-difluoro-5,11-triethylsilylethynyl anthradithiophene (DiF-TES ADT) without semiconducting binder; TG OTFT 2,8-difluoro-5,11-triethylsilylethynyl anthradithiophene from the series of compounds represented by Formula (C), (mixture of (C1) and C2 isomers) was formulated in tetralin at 2% by weight total solids content. This was coated as an OSC layer in an OTFT device according to the method shown above for PEN substrate, with the exception that the OSC was coated at 750 rpm, 60 seconds.

The TFT performance of this formulation is shown in Table (iv) below:

TABLE (iv)

| Composition | Channel length (microns) | Linear mobility [cm$^2$/Vs] | Standard deviation of mobility [%] | Number of transistors tested on substrate (out of 25) |
|---|---|---|---|---|
| 2,8-difluoro-5,11-triethylsilylethynyl anthradithiophene | 100 | 0.16 | 81.9 | 24 |
| | 30 | 0.17 | 75.0 | 22 |
| | 10 | 0.14 | 59.7 | 21 |

Example (1)

Synthesis of the 2-cyano-PTAA Polymer (1)

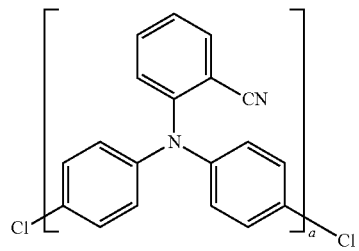

1(a) Synthesis of the 2-Cyano Monomer

A 500 milliliter (mL) 3-neck round bottom flask fitted with magnetic stirrer, thermometer, condenser and argon inlet was charged with 250 mL N-methylpyrrolidinone (GPR grade, Sigma Aldrich) which was then degassed for 15 minutes. 24.2 grams (g) of 2-fluorobenzonitrile (Fluorochem), 23.8 g of bis(4-chlorophenyl)amine (Example 3) and 30.4 g of caesium fluoride (Alfa-Aesar) were added to the vessel and was heated to 175° C. for 18 hours, before cooling to room temperature. The mixture was poured into water (1800 mL), extracting with toluene. The organic phase was dried (magnesium sulphate)(MgSO$_4$) and concentrated to give a brown solid. This material was slurried in methanol to give a tan solid, which was further purified by recrystallising from methanol and charcoal to give the product as a tan solid. Yield: 21 g. $^1$H NMR (400 MHz, CDCl$_3$): δ 7.6 (1H, m, ArH), 7.5 (1H, m, ArH), 7.3-7.15 (6H, m, ArH), 6.9 (4H, m, ArH)

Synthesis of the 2-cyano-PTAA homopolymer

A 500 ml three neck round bottom flask was fitted with overhead stirrer, thermometer, air condenser, Claisen adaptor and septum inlet. The apparatus was flushed with argon. 200 mL of anhydrous N,N-dimethylacetamide (Sigma Aldrich) was charged to the vessel via cannula needle and was degassed with argon for 15 minutes. Triphenylphosphine (7.78 g, Sigma Aldrich), 2,2'-bipyridyl (368 miligrams (mg), Sigma Aldrich), zinc (11.38 g, Alfa Aesar) and nickel (II) chloride (253 mg, Sigma Aldrich) were added to the vessel. The contents were heated to 70-80° C. where the mixture turned red-brown in colour. A few crystals of iodine were added, and the reaction was left to stir for 1 hour. The monomer (19.95 g) was added to the vessel. Anhydrous toluene (29 mL, Sigma Aldrich) was added, and the reaction was left to stir at 70-80° C. for 19 hours, before being cooled to room temperature. The reaction was filtered through celite, eluting with N,N-dimethylacetamide (50 mL). The filtrates were added dropwise to a stirred portion of methanol (1.5 liters (L)). The suspension was stirred for 1 hour, collected by vacuum filtration and washed with methanol. The filter cake was dissolved in dichloromethane (500 mL) and washed with 1M aqueous sodium hydroxide solution (250 mL), three times with water (3×250 mL), dried (sodium sulphate) ($NaSO_4$) and concentrated to give an orange solid. A solution of this material was prepared by dissolving the product in 120 mL of tetrahydrofuran at 50° C. and diluting with 60 mL of toluene. This solution was filtered through silica gel, eluting with 2:1 mixture of tetrahydrofuran:toluene (800 mL). The combined filtrates were concentrated to give a yellow solid. The material was dissolved in tetrahydrofuran (180 mL) and charged to a 500 mL round bottom flask equipped with magnetic stirrer and condenser. Activated charcoal (1.8 g) was added and the mixture was heated to 60° C. for 35 minutes. The mixture was filtered through filter paper in a Buchner funnel, washing with tetrahydrofuran. The carbon screening was repeated three times in total, filtering the third treatment through a glass sinter funnel. The filtrates were concentrated to give a yellow-orange solid. A solution of this material was prepared in tetrahydrofuran (100 mL) and added dropwise to a stirred portion of methanol (400 mL). The suspension was stirred for 1 hour, collected by vacuum filtration, washed with methanol and dried to constant weight to give the product as a yellow solid. This precipitation was then repeated, using 120 mL of LC tetrahydrofuran and 400 mL of methanol, to give the product as a yellow powder. Yield: 12.72 g. Mn=2514 g/mol.
n=9.4. Polydispersity=2.0.

The dielectric constant of polymer (1) was 3.8.

Formulation 1(a)

In these examples the ratio of polymer to the semiconductor is in parts by weight. Polymer 1 was formulated with 1,4,8,11-tetramethyl bis-triethylsilylethynyl pentacene from the series of compounds represented by Formula (A2) in a ratio 4:1 at a total solids loading of 2% by weight in tetralin and coated as an OSC layer in an OTFT device according to the method shown above for PEN substrate devices.

The TFT performance of this formulation is shown in the Table 2 (a) below:

| Composition | Channel length | Linear mobility [$cm^2$/Vs] | Standard deviation of mobility [%] | Number of transistors tested on substrate |
|---|---|---|---|---|
| 1,4,8,11-tetramethyl bis-triethylsilylethynyl pentacene + Polymer 1 | 100 | 1.83 | 27 | 12 |
| | 30 | 1.12 | 28 | 18 |

Formulation 1(b)

Polymer 1 was formulated with 1,4,8,11-tetramethyl bis-triethylsilylethynyl pentacene from the series of compounds represented by Formula (A2) in a ratio 2:1 at a total solids loading of 2 wt % by weight in bromobenzene and coated as an OSC layer in an OTFT device according to the method shown above for glass substrate devices.

The TFT performance of this formulation is shown in Table 2(b) below

| Composition | Channel length | Linear mobility [$cm^2$/Vs] | Standard deviation of mobility [%] | Number of transistors tested on substrate |
|---|---|---|---|---|
| 1,4,8,11-tetramethyl bis-triethylsilylethynyl pentacene + Polymer 1 | 100 | 3.12 | 27.9 | 17 |
| | 30 | 2.52 | 38 | 26 |

It should be noted that the work on formulations 1(a) and 1(b) was the first work carried out using these novel formulations and processes and consequently it should be pointed out that it is less reliable than later work carried out with the benefit of greater experience.

Example 1c

Polymer 1 was formulated with 1,4,8,11-tetramethyl bis-triethylsilylethynyl pentacene from the series of compounds represented by Formula (A2) at a ratio of 1:1 in bromobenzene at 1% by weight total solids content. This was coated as an OSC layer in an OTFT device according to the method shown above for PEN substrate with the exception of a plasma cleaning process was used to activate the surface (model PE100, ex Plasma Etch Inc.) using 50 sccm oxygen, 50 sccm argon, and a RF plasma power of 250 W, treatment time 65 s.

TABLE 2c

| Composition | Channel length (microns) | Linear mobility [$cm^2$/Vs] | Standard deviation of mobility [%] | Number of transistors tested on substrate |
|---|---|---|---|---|
| 1,4,8,11-tetramethyl bis-triethylsilylethynyl pentacene + Polymer 1 | 100 | 4.00 | 4.1 | 20 |
| | 30 | 3.20 | 4.6 | 24 |
| | 10 | 2.19 | 7.2 | 20 |
| | 4 | 1.44 | 8.0 | 20 |

Example (2)

Synthesis of the 2,4-dimethoxy-PTAA polymer (2)

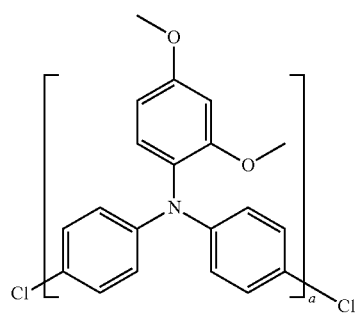

2(a): Synthesis of the 2,4-dimethoxy-PTAA monomer

A 2 liter (L) 3-neck round bottom flask fitted with magnetic stirrer, thermometer, argon inlet and condenser was charged with 875 mL of toluene, which was degassed for 15 minutes. 5.12 g of palladium (II) acetate (Precious Metals Online) and 13.19 g of 4,5-bis(diphenylphosphino)-

9,9-dimethylxanthene (Alfa-Aesar) were charged to the vessel. The mixture was heated to 50° C. with stirring, and once the internal temperature reached 50° C., was cooled to room temperature. The mixture was left to stir at room temperature for 1 hour. 2,4-dimethoxyaniline (35 g, Alfa-Aesar), 4-chloroiodobenzene (119.70 g, Apollo Scientific) and sodium-tert-butoxide (48.25 g, Alfa-Aesar) were added and the reaction was heated to 95° C. for 18 hours. The reaction was cooled to room temperature and filtered through a silica pad. The filtrates were concentrated to give a brown solid. This material was recrystallised from isopropyl alcohol/acetone. After cooling, the solids were collected by vacuum filtration and washed three times with cold isopropyl alcohol/acetone. The solids were recrystallised further from dichloromethane/methanol to give the product as a brown solid. Yield: 30.95 g. $^1$H NMR (300 MHz, CDCl$_3$): δ 7.1 (4H, m, ArH), 6.8 (4H, m, ArH) 3.8 (3H, s, ArOMe), 3.6 (3H, s, ArOMe).

Synthesis of the 2,4-dimethoxy-PTAA polymer (2)

A 500 mLl three neck round bottom flask was fitted with overhead stirrer, thermometer, air condenser, Claisen adaptor and septum inlet. The apparatus was flushed with argon. 150 mL of anhydrous N,N-dimethylacetamide (Sigma Aldrich) was charged to the vessel via cannula needle and was degassed with argon for 15 minutes. Triphenylphosphine (5.36 g, Sigma Aldrich), 2,2'-bipyridyl (250 mg, Sigma Aldrich), zinc (8.1 g, Alfa-Aesar) and nickel (II) chloride (150 mg, Sigma Aldrich) were added to the vessel and the contents were heated to 70-80° C. The solution turned red-brown and a few crystals of iodine were added to the mixture. The reaction was left to stir for 1 hour at this temperature before the monomer (15 g) and anhydrous toluene (24 mL, Sigma Aldrich) was added. The reaction was left to stir at 70-80° C. for 19 hours. The reaction was cooled to room temperature and filtered through a celite pad, eluting with N,N-dimethylacetamide. The filtrate was added dropwise into a stirred portion of methanol (1250 mL). The suspension was stirred for 1 hour, before being collected by vacuum filtration. The solids were dissolved in dichloromethane (250 mL) and washed with 1M aqueous hydrochloric acid (200 mL), water (2×200 mL), dried (sodium sulphate) and concentrated to give an orange-yellow solid. This was dissolved in tetrahydrofuran (200 mL) and filtered through silica gel, eluting with tetrahydrofuran. The filtrates were combined and concentrated to give an orange solid. The material was dissolved in tetrahydrofuran (250 mL) and charged to a 500 mL round bottom flask fitted with magnetic stirrer and condenser. Activated charcoal (1.14 g) was added and the mixture was heated to 60° C. for 30 minutes. The mixture was filtered through filter paper in a Buchner funnel and washed with tetrahydrofuran. The carbon screening was repeated three times in total, filtering the third treatment through a glass sinter funnel. The filtrates were concentrated to give an orange-yellow solid. A solution of this material in tetrahydrofuran (64 mL) was added dropwise to a stirred portion of methanol (320 mL). The suspension was stirred for 45 minutes, before being collected by vacuum filtration, washed with methanol, and dried. This precipitation procedure was repeated a second time using tetrahydrofuran (95 mL) and methanol (475 mL) to give a yellow solid. This solid was then stirred in methanol (350 mL) for 2 hours and filtered. A final precipitation using tetrahydrofuran (60 ml) and methanol (300 mL) gave, after drying, the product as a yellow solid. Yield: 6.3 g. Mn=3471 g/mol. n=11.5. Polydispersity=2.6. The dielectric constant of polymer (2) was 3.9

Example 2a

Polymer 2 was formulated with 1,4,8,11-tetramethyl bis-triethylsilylethynyl pentacene from the series of compounds represented by Formula (A2) in a ratio 2:1 at a total solids loading of 2% by weight in bromobenzene and coated as an OSC layer in an OTFT device according to the method shown above for glass substrate devices.

The TFT performance of this formulation is shown in Table 3(a) below:

| Composition | Channel length (microns) | Linear mobility [cm$^2$/Vs] | Standard deviation of mobility [%] | Number of transistors tested on substrate |
|---|---|---|---|---|
| 1,4,8,11-tetramethyl bis-triethylsilylethynyl pentacene + Polymer 2 | 100 | 1.42 | 23 | 19 |

Example 2b

Polymer 2 was formulated with 1,4,8,11-tetramethyl bis-triethylsilylethynyl pentacene from the series of compounds represented by Formula (A2) at a ratio of 2:1 in bromobenzene at 2% by weight total solids content. This was coated as an OSC layer in an OTFT device according to the method shown above for PEN substrate devices with the exception that prior to the thiol treatment a plasma cleaning process was used to activate the surface (model PE100, ex Plasma Etch Inc.) using 50 sccm oxygen, 50 sccm argon, and a RF plasma power of 250 W, treatment time 65 s.

The TFT performance of this formulation is shown in Table 3(b) below:

| Composition | Channel length (microns) | Linear mobility [cm$^2$/Vs] | Standard deviation of mobility [%] | Number of transistors tested on substrate |
|---|---|---|---|---|
| 1,4,8,11-tetramethyl bis-triethylsilylethynyl pentacene + Polymer 2 | 100 | 2.67 | 18.6 | 20 |
| | 30 | 1.35 | 30.3 | 21 |

Example 2c

Polymer 2 was formulated with 1,4,8,11-tetramethyl bis-triethylsilylethynyl pentacene from the series of compounds represented by Formula (A2) at a ratio of 2:1 in bromobenzene at 2% by weight total solids content. This was coated as an OSC layer in an OTFT device according to the method shown above for PEN substrate devices with the exception that the thiol used for work function modification was 4-fluorothiophenol and plasma cleaning process was used to activate the surface (model PE100, ex Plasma Etch Inc.) using 50 sccm oxygen, 50 sccm argon, and a RF plasma power of 250 W, treatment time 65 s.

The TFT performance of this formulation is shown in Table 3(c) below:

TABLE 3c

| Composition | Channel length (microns) | Linear mobility [cm²/Vs] | Standard deviation of mobility [%] | Number of transistors tested on substrate (out of 25) |
|---|---|---|---|---|
| 1,4,8,11-tetramethyl bis-triethylsilylethynyl pentacene + Polymer 2 | 100 | 4.90 | 1.9 | 24 |
| | 30 | 4.13 | 5.0 | 24 |
| | 10 | 2.84 | 4.3 | 23 |
| | 4 | 1.83 | 5.9 | 25 |

Example 2d

A bottom gate transistor was prepared by the following process. Polymer 2 was formulated with 1,4,8,11-tetramethyl bis-triethylsilylethynyl pentacene from the series of compounds represented by Formula (A2) in a ratio of 1:2 in bromobenzene at 1% by weight total solids content. This was coated as an OSC layer according to the method shown above for bottom gate, bottom contact OTFT devices with SU8 gate dielectric.

The TFT performance of this formulation is shown in Table 3(d) below:

| Composition | Channel length (microns) | Linear mobility [cm²/Vs] | Standard deviation of mobility [%] | Number of transistors tested on substrate (out of 32) |
|---|---|---|---|---|
| 1,4,8,11-tetramethyl bis-triethylsilylethynyl pentacene + Polymer 2 | 100 | 1.83 | 7.7 | 13 |
| | 30 | 2.02 | 6.7 | 22 |
| | 10 | 1.91 | 7.5 | 18 |
| | 4 | 1.57 | 8.9 | 26 |

Example 2e

Polymer 2 was formulated with 6,13-triisopropylsilylethynyl pentacene from the series of compounds represented by Formula (A) in a ratio of 1:1 in bromobenzene at 1% by weight total solids content. This was coated as an OSC layer in an OTFT device according to the method shown above for PEN substrate with the exception that the thiol used for work function modification was 4-fluorothiophenol and plasma cleaning process was used to activate the surface (model PE100, ex Plasma Etch Inc.) using 50 sccm oxygen, 50 sccm argon, and a RF plasma power of 250 W, treatment time 65 s.

The TFT performance of this formulation is shown in Table 3e below:

| Composition | Channel length (microns) | Linear mobility [cm²/Vs] | Standard deviation of mobility [%] | Number of transistors tested on substrate (out of 25) |
|---|---|---|---|---|
| 6,13 bis-triisopropylsilylethynyl pentacene + Polymer 2 | 100 | 0.74 | 3.3 | 19 |
| | 30 | 0.64 | 7.5 | 25 |
| | 10 | 0.48 | 9.6 | 23 |
| | 4 | 0.32 | 9.2 | 21 |

Example 3

Synthesis of the 4-isopropylcyano polytriarylamine homopolymer (3)

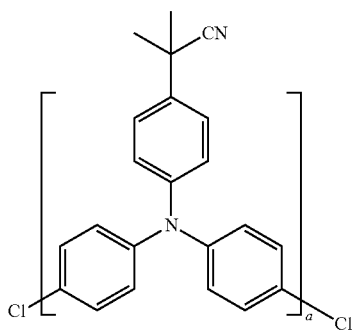

3(a): Synthesis of intermediate compound, 4-Iodophenylacetonitrile

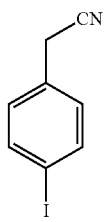

A round bottomed flask fitted with a magnetic stirrer was charged with 1.22 g of copper iodide (Sigma Aldrich), 25 g of 4-bromophenylacetonitrile (Apollo Scientific) and 38.37 g of sodium iodide (Sigma Aldrich) under argon. The round bottomed flask was evacuated and backfilled with argon three times. N,N'-Dimethylethylenediamine (1.38 mL, Sigma Aldrich) and 25 mL dioxane were added and the mixture was heated to 110° C. for 2 hours (h). The reaction was allowed to cool to room temperature (rt) and 125 mL of 30% aqueous ammonia was added. The mixture was then poured onto 500 mL water and extracted three times with dichloromethane (DCM) and the combined organics dried over MgSO$_4$. The solvent was removed under reduced pressure to afford the title compound as brown oil that solidified on standing. Yield: 29.97 g. $^1$H NMR (400 MHz, CDCl$_3$), δ 7.71 (2H, d, Ar—H), 7.08 (2H, d, Ar—H), 3.66 (2H, s, CH$_2$).

3(b): Synthesis of the intermediate compound 2-(4-iodophenyl)-2-methylpropanenitrile

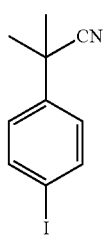

A three necked round bottom flask, fitted with a thermometer, argon inlet and stirrer bar, was charged with 15.82 g sodium tert-butoxide (Alfa-Aesar) in 25 mL tetrahydrofuran (THF, Univar) under argon and cooled to 0° C. N-Methylpyrrolidinone (NMP) (25 mL) was then added. A solution of 10 g of 4-iodophenylacetonitrile and 10.2 mL methyl iodide (Sigma Aldrich) in 22 mL THF:NMP (1:1, volume: volume (v/v)) was prepared and this was added to the cooled reaction mixture at such a rate as to keep the temperature below 10° C. On completion of the addition, the reaction was allowed to warm to rt and stirred for 2 h. 3M aqueous hydrochloric acid (HCl) (120 mL) was added followed by 120 mL toluene, the phases were separated and the aqueous layer extracted two more times with 120 mL toluene. The combined organic layers were washed with saturated aqueous sodium bicarbonate (120 mL), brine (120 mL), aqueous sodium thiosulfate solution (120 mL) and dried over MgSO$_4$. Removal of the solvent under reduced pressure gave the crude product as a brown oil. Purification by column chromatography in ethyl acetate/heptane mixtures gave the title compound as a pale yellow oil. Yield: 4.55 g. $^1$H NMR (400 MHz, CDCl$_3$), δ 7.71 (2H, d, Ar—H), 7.23 (2H, d, Ar—H), 1.70 (6H, s, CH$_3$).

3(c): Synthesis of intermediate compound Bis(4-chlorophenyl)amine

A 10 L jacketed vessel fitted with overhead stirrer, temperature probe, argon inlet and condenser was charged with 6.6 L of anhydrous toluene (Sigma Aldrich) and then degassed for 15 minutes. 7.46 g of palladium (II) acetate (Precious Metals Online) and 20.64 g of racemic 2,2'-bis (diphenylphosphino)-1,1'-binaphthyl (Alfa-Aesar) were added to the vessel, and the contents were heated to 50° C. with stirring, before being cooled back to room temperature once internal temperature reached 50° C., and left to stir for an hour. 4-chloroaniline (443.98 g, Alfa-Aesar), 4-chloroiodobenzene (794.49 g, Apollo Scientific) and sodium-tert-butoxide (318.63 g, Alfa-Aesar) were charged to the vessel and the contents were heated to reflux for 2 hours, whereupon HPLC analysis showed no remaining starting materials. The reaction was cooled to room temperature and washed with water (3.3 L), 2M aqueous hydrochloric acid (3.3 L), water (3.3 L) and brine (3.3 L). The organic phase was dried (sodium sulphate) and concentrated to give a brown solid. This was recrystallised in 6:1 methanol:water (total volume of 6.53 L) to give the product as a light brown solid. Yield: 362 g. $^1$H NMR (400 MHz, CDCl$_3$): δ 7.22-7.20 (4H, m, ArH), 6.96-6.94 (4H, m, ArH), 5.62 (1H, s, Ar$_2$NH)

3(d):Synthesis of 2-(4-(bis(4-chlorophenyl)amino) phenyl)-2-methylpropanenitrile; also called the 4-isopropylcyano-PTAA monomer

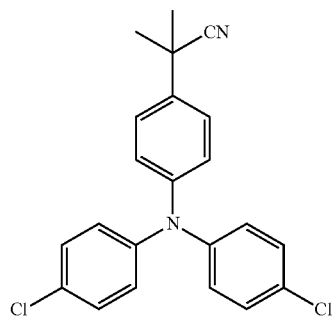 [SMILES: CC(C)(C#N)c1ccc(N(c2ccc(Cl)cc2)c2ccc(Cl)cc2)cc1]

Palladium acetate (261 mg, Precious Metals Online) and (+/−) 2,2'-bis(diphenylphosphino)-1,1'-binaphthyl (723 mg, Alfa-Aesar) were added to 400 mL of degassed toluene which was then heated under argon to 45° C. over 30 minutes. The solution was cooled and 2-(4-iodophenyl)-2-methylpropanenitrile (28.6 g), bis-(4-chlorophenyl)amine (25.12 g) and sodium tert-butoxide (11.15 g) were added over ten minutes. On completion of addition, the reaction mixture was heated to reflux for 20 h. The reaction mixture was cooled, filtered through a silica plug and solvent removed under reduced pressure. Purification by column chromatography using EtOAc/heptane mixtures gave the product as a yellow solid. The product was then refluxed in methanol (150 mL) and filtered hot to give a cream solid. The solids from the filtrate were also collected and the combined solids recrystallised from 57 mL industrial methylated spirits (IMS): EtOAc (1:2, v/v), filtered and washed with IMS (30 mL) to give a cream solid. Yield: 10.5 g. $^1$H NMR (400 MHz, CDCl$_3$) δ 7.31 (2H, d, Ar—H), 7.21 (4H, d, Ar—H), 6.97-7.02 (6H, m, Ar—H), 1.71 (6H, s, 2×CH$_3$).

Synthesis of the 4-isopropylcyano-PTAA homopolymer (3)

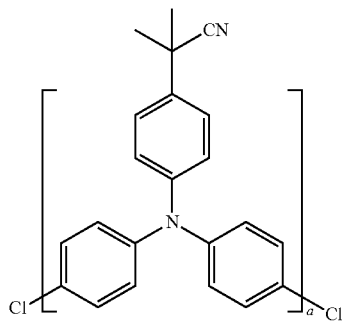

A 500 ml three neck round bottom flask was fitted with overhead stirrer, thermometer, air condenser, Claisen adaptor and septum inlet. The apparatus was flushed with argon. 150 mL of anhydrous N,N-dimethylacetamide (Sigma Aldrich) was charged to the vessel via cannula needle and was degassed with argon for 15 minutes. Triphenylphosphine (3.53 g, Sigma Aldrich), 2,2'-bipyridyl (169 mg, Sigma Aldrich), zinc (5.37 g, Alfa-Aesar) and nickel (II) chloride (99 mg, Sigma Aldrich) were added to the vessel and the contents were heated to 70-80° C. The solution turned red-brown and a few crystals of iodine were added to the mixture. The reaction was left to stir for 1 hour at this temperature before the monomer (10.8 g) and anhydrous toluene (18 mL, Sigma Aldrich) were added. The reaction was left to stir at 70-80° C. for 18 hours. The reaction was cooled to room temperature, causing the mixture to slowly gel. Once at room temperature, the mixture fully gelled. This was filtered, and the collected solid was dissolved in dichloromethane (500 mL) and filtered through celite, eluting with dichloromethane (2×500 mL). The filtrates were concentrated to give a damp residue, which was triturated in methanol (500 mL) and filtered to give a yellow solid. This solid was dissolved in dichloromethane (500 mL) with sonication and washed with 1M aqueous sodium hydroxide solution (250 mL) and water (3×250 mL), before drying (sodium sulphate) and concentrating to give a yellow solid. A solution of this material was prepared in dichloromethane (100 mL), requiring extended sonication, and filtered through a silica pad, eluting with dichloromethane. The filtrates were concentrated to give a yellow solid. This was dissolved in dichloromethane (50 mL), requiring extended sonication, and added slowly to a stirred portion of methanol (250 mL). The suspension was stirred for 2 hours, before being filtered, washed with the filtrate and methanol and dried to constant weight to give product as a yellow solid. Yield: 3.11 g.

The dielectric constant of polymer (3) was 5.9.

Example 4

Polymer (4), 50:50 4-isopropylcyano-PTAA: 2,4-dimethyl-PTAA copolymer

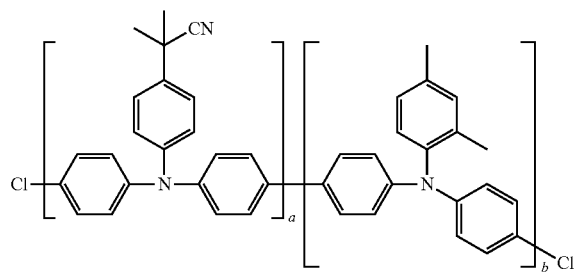

Synthesis of the 2,4-dimethyl PTAA monomer

A 10 L jacketed vessel fitted with overhead stirrer, temperature probe, argon inlet and condenser was charged with 4.5 L of toluene, which was degassed for 15 minutes. 5.56 g of palladium (II) acetate (Precious Metals Online) and 15.47 g of racemic 2,2'-bis(diphenylphosphino)-1,1'-binaphthyl (Alfa-Aesar) were charged to the vessel. The mixture was heated to 50° C. with stirring, and once the internal temperature reached 50° C., was cooled to room temperature. The mixture was left to stir at room temperature for 1 hour. 2,4-Dimethylaniline (300.03 g, Alfa-Aesar), 4-chloroiodobenzene (1306.51 g, Apollo Scientific) and sodium-tert-butoxide (523.87 g, Alfa-Aesar) were added and the reaction was heated at reflux for 24 hours, whereupon HPLC analysis showed complete reaction. The reaction was cooled to room temperature and washed twice with water (2×4 L) and the organic phase was filtered through celite, giving a second split, which was separated. The organics were then concentrated to give a brown solid (935.5 g). 838.46 g of this material was recrystallised from 3:1 industrial methylated spirits (IMS): ethyl acetate (4450 mL) in a 6 L jacketed vessel fitted with overhead stirrer, temperature probe, argon inlet and condenser. The suspension was cooled to 0° C. for 1 hour, then the solids collected by vacuum filtration and washed three times with cold 3:1 IMS:ethyl acetate (3×840 mL). The solids were dried overnight to give the product as a grey solid. Yield: 699 g. $^1$H NMR (300 MHz, CDCl$_3$): δ 7.16-6.86 (11H, m, ArH), 2.35 (3H, s, ArMe), 1.99 (3H, s, ArMe).

Synthesis of the 50:50 2,4-dimethyl: 4-isopropylcyano PTAA copolymer (4)

A 500 mL three neck round bottom flask was fitted with overhead stirrer, thermometer, air condenser, Claisen adaptor and septum inlet. The apparatus was flushed with argon. 200 mL of anhydrous N,N-dimethylacetamide (Sigma Aldrich) was charged to the vessel via cannula needle, and degassed with argon for 15 minutes. Triphenylphosphine (6.5 g, Sigma Aldrich), 2,2'-bipyridyl (0.29 g, Sigma Aldrich), zinc (9.52 g, Alfa-Aesar) and nickel (II) chloride (0.19 g, Sigma Aldrich) were added to the vessel. The contents were heated to 70-80° C. A few crystals of iodine were added to facilitate catalyst formation, turning the solution red-brown. The mixture was stirred at this temperature for a further hour. The 2,4-dimethyl monomer (8.12 g) and the 4-isopropylcyano monomer (9 g) were added to the vessel, followed by anhydrous toluene (27.5 mL, Sigma Aldrich). The reaction was stirred at 70-80° C. for 20 hours, before being cooled to room temperature. The solids were collected by vacuum filtration and redissolved in toluene at 50° C. The mixture was cooled and the excess zinc was removed by filtration. The filtrates were washed with 1M aqueous sodium hydroxide solution (250 mL), water (250 mL) and 10% aqueous sodium chloride solution (250 mL), before being dried (sodium sulphate) and concentrated to give a yellow solid. This material was dissolved in toluene (100 mL) and filtered through silica, eluting with toluene. The filtrates were concentrated to give a yellow solid. The material was dissolved in toluene (250 mL) and charged to a 500 mL round bottom flask fitted with magnetic stirrer and condenser. Activated charcoal (0.4 g) was added and the mixture heated to 50° C. for 30 minutes. The mixture was filtered through filter paper in a Buchner funnel and washed with toluene. The carbon screening was repeated three times in total, filtering the third treatment through a glass sinter funnel. The filtrates were concentrated to give a yellow solid. A solution of this material was prepared in tetrahydrofuran (80 mL), which was added dropwise to a stirred portion of methanol (400 mL). The resulting suspension was stirred for 1 hour, before being collected by vacuum filtration, washing with methanol, and drying to a constant weight, to yield the product as a yellow powder. Yield: 2.6 g. Mn=15091 g/mol. n=26. Polydispersity=1.2.

The dielectric constant of polymer (4) was 4.1.

Example 4a

Polymer 4 was formulated with 1,4,8,11-tetramethyl bis-triethylsilylethynyl pentacene from the series of compounds represented by Formula (A2) in a ratio of 4:1 in tetralin at 2% by weight total solids content. This was coated as an OSC layer in an OTFT device according to the method shown above for PEN substrate devices with the exception that prior to the thiol treatment a plasma cleaning process was used to activate the surface (model PE100, ex Plasma Etch Inc.) using 10 sccm oxygen, 50 sccm argon, and a RF plasma power of 250 W, treatment time 65 s.

The OTFT performance of this formulation is shown in the Table 5(a) below:

| Composition | Channel length (microns) | Linear mobility [cm$^2$/Vs] | Standard deviation of mobility [%] | Number of working transistors tested on substrate (out of 25) |
|---|---|---|---|---|
| 1,4,8,11-tetramethyl bis-triethylsilylethynyl pentacene + Polymer 4 | 100 | 3.11 | 28 | 22 |
| | 30 | 1.82 | 28 | 23 |

Example 4b

Polymer 4 was formulated with 1,4,8,11-tetramethyl bis-triethylsilylethynyl pentacene from the series of compounds represented by Formula (A2) in a ratio of 4:1 in tetralin at a total solids content of 2% by weight and coated as an OSC layer in an OTFT device according to the method shown above for glass/SU8 substrate devices.

The OTFT performance of this formulation is shown in Table 5(b) below:

| Composition | Channel length (microns) | Linear mobility (cm$^2$/Vs) | Standard deviation of mobility (%) | Number of working transistors tested on substrate (out of 32) |
|---|---|---|---|---|
| 1,4,8,11-tetramethyl bis-triethylsilylethynyl pentacene + Polymer 4 | 101 | 3.44 | 13 | 27 |
|  | 31 | 3.5 | 12 | 27 |
|  | 11 | 2.7 | 12 | 27 |
|  | 5 | 2.11 | 14 | 27 |

Example 4 (c)

Polymer 4 was formulated with 1,4,8,11-tetramethyl bis-triethylsilylethynyl pentacene from the series of compounds represented by Formula (A2) in a ratio of 1:1 in tetralin at a total solids content of 0.5% by weight and ink jetted as an OSC layer into banks with a size of 100 μm×100 μm. Measured channel width and length for transistor are 100 and 7 μm.

The OTFT performance of this formulation is shown in Table 5(c) below:

| Composition | Drops per pixel | Linear mobility (cm$^2$/Vs) | Standard deviation of mobility (%) | Number of working transistors tested on substrate (out of 6) |
|---|---|---|---|---|
| 1,4,8,11-tetramethyl bis-triethylsilylethynyl pentacene + Polymer 4 | 45 | 0.89 | 36 | 6 |

Example 4(d)

Polymer 4 was formulated with 1,4,8,11-tetramethyl bis-triethylsilylethynyl pentacene from the series of compounds represented by Formula (A2) at a ratio of 1:2 in tetralin at 1% by weight total solids content. This was coated as an OSC layer according to the method shown above for bottom gate, bottom contact OTFT devices with SU8 gate dielectric, with the exception that the SAM used to alter the work function was 10 mM pentafluorobenzenethiol in IPA and there was no plasma treatment of the surface prior to the OSC coating.

The TFT performance of this formulation is shown in Table 5(d) below:

| Composition | Channel length (microns) | Linear mobility [cm$^2$/Vs] | Standard deviation of mobility [%] | Number of transistors tested on substrate (out of 32) |
|---|---|---|---|---|
| 1,4,8,11-tetramethyl bis-triethylsilylethynyl pentacene + Polymer 4 | 100 | 1.36 | 9.5 | 6 |

Example (5)

Polymer (5) 30:70 4-isopropylcyano-PTAA: 2,4-Dimethyl PTAA copolymer

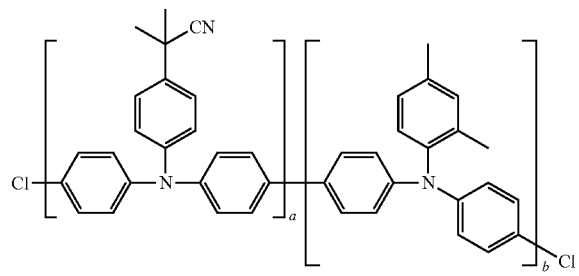

5(a):Synthesis of 4-Iodophenylacetonitrile

A mixture of potassium cyanide (33.23 g, Sigma-Aldrich) and 4-iodobenzyl bromide (101 g, Apollo Scientific) in 3:1 IMS/water (1 L) was heated to reflux for 2 hours then cooled to room temperature. The organics were removed in vacuo and the aqueous was extracted with EtOAc (2×750 mL). The combined organics were washed with brine (300 mL), dried (magnesium sulphate) and concentrated in vacuo to give the product as oil that solidified on standing. Yield: 78.4 g. $^1$H NMR (400 MHz, CDCl$_3$): δ 7.71 (2H, d, ArH), 7.08 (2H, d, ArH) 3.66 (2H, s, ArCH$_2$CN).

5(b): Synthesis of 2-(4-Iodophenyl)-2-methylpropanenitrile

NMP (197 mL, Sigma-Aldrich) was added to a suspension of sodium tert-butoxide (124.0 g, Alfa-Aesar) in THF (197 mL, Univar) under argon. The mixture was cooled to 0° C. and a solution of iodomethane (87.9 mL, Sigma-Aldrich) and 4-iodophenylacetonitrile (78.4 g) in a 50:50 mixture of NMP/THF (173 mL) was added dropwise keeping the internal temperature below 10° C. The mixture was warmed to room temperature and stirred overnight. 2M HCl (930 mL) and toluene (930 mL) were added then the aqueous layer was separated and extracted with toluene (2×465 mL). The combined organics were washed with saturated sodium bicarbonate (930 mL), brine (930 mL), 2M sodium thiosulfate (930 mL), dried (magnesium sulphate) and concentrated in vacuo to a yellow/orange solid. Purification by column chromatography eluting with EtOAc/heptane mixtures gave the title compound as a pale yellow oil. Yield 4.55 g, $^1$H NMR (400 MHz, CDCl$_3$): δ 7.71 (2H, d, Ar—H), 7.23 (2H, d, Ar—H), 1.70 (6H, s, CH$_3$).

5(c):2-(4-(bis(4-chlorophenyl)amino)phenyl)-2-methylpropanenitrile:4-isopropyl-cyano-PTAA monomer Palladium acetate (261 mg, Precious Metals Online) and (±) 2,2'-bis(diphenylphosphino)-1,1'-binaphthyl (BINAP)

(723 mg, Alfa-Aesar) were added to 400 mL of degassed toluene which was then heated under argon to 45° C. over 30 minutes. The solution was cooled and 2-(4-iodophenyl)-2-methylpropanenitrile (28.6 g), bis-(4-chlorophenyl)amine (25.12 g) and sodium tert-butoxide (11.15 g) (were added over ten minutes. On completion of addition, the reaction mixture was heated to reflux for 20 h. The reaction mixture was cooled, filtered through a silica plug and solvent removed under reduced pressure. Purification by column chromatography using EtOAc/heptane mixtures gave the product as a yellow solid. The product was then refluxed in methanol (150 mL) and filtered hot to give a cream solid. The solids from the filtrate were also collected and the combined solids recystallised from acetonitrile, washing the solids with acetonitrile (×2). Yield 10.5 g. $^1$H NMR (400 MHz, CDCl$_3$) δ 7.31 (2H, d, Ar—H), 7.21 (4H, d, Ar—H), 6.97-7.02 (6H, m, Ar—H), 1.71 (6H, s, 2×CH$_3$).

Synthesis of 30:70 4-isopropylcyano-PTAA: 2,4-Dimethyl PTAA copolymer

A 500 mL three neck round bottom flask was fitted with overhead stirrer, thermometer, air condenser, Claisen adaptor and septum inlet. The apparatus was flushed with argon. N,N-dimethylacetamide (278.5 mL, Sigma Aldrich) was charged and degassed for 15 minutes. Triphenylphosphine (10.74 g, Aldrich), 2,2'-bipyridyl (500 mg, Sigma Aldrich), zinc (15.85 g, Alfa-Aesar) and nickel (II) chloride (300 mg, Aldrich) were added to the vessel. The contents were heated to 70-80° C. where the mixture turned red-brown in colour. A few crystals of iodine were added, and the reaction was left to stir for 1 hour. The 2,4-dimethyl (18.87 g) and 4-isopropylcyano (8.99 g) monomers were added to the vessel. Anhydrous toluene (45 mL, Sigma Aldrich) was added. The reaction was left to stir at 70-80° C. for 19 hours, before being cooled to room temperature. The reaction was filtered, washing the solids with N,N-dimethylacetamide. The filter cake was dissolved in toluene (500 mL) and filtered through celite. The filtrates were washed with 1M sodium hydroxide solution (250 mL), water (250 mL) and 10% NaCl solution (250 mL), dried (sodium sulphate) and concentrated to give a yellow solid. This material was dissolved into toluene (250 mL) and filtered through silica, eluting with toluene. The silica was also flushed with tetrahydrofuran to remove all product from the pad. Product fractions were combined and concentrated to give a yellow solid (14.5 g). This was dissolved in toluene (500 mL) and charcoal treated. The filtrates were then concentrated to give a yellow solid. This material was dissolved in tetrahydrofuran (80 mL) and added dropwise to methanol (400 mL) with stirring. After stirring for 1 hour, the resulting suspension was collected by filtration to give a pale yellow powder. Yield: 9.9 g. Mn=9694 g/mol. n=34. Polydispersity=1.9.

The dielectric constant of polymer (5) was 3.7

Example 5 (a)

Polymer 5 was formulated with 1,4,8,11-tetramethyl bis-triethylsilylethynyl pentacene from the series of compounds represented by Formula (A2) in a ratio of 2:1 in tetralin at 1.2% by weight total solids content. This was coated as an OSC layer in an OTFT device according to the method shown above for PEN substrate devices.

The OTFT performance of this formulation is shown in Table 6(a) below:

| Composition | Channel length (microns) | Linear mobility [cm$^2$/Vs] | Standard deviation of mobility [%] | Number of working transistors tested on substrate (out of 25) |
|---|---|---|---|---|
| 1,4,8,11-tetramethyl bis-triethylsilylethynyl pentacene + Polymer 5 | 100 | 4.08 | 12.7 | 15 |
| | 30 | 3.55 | 15.9 | 18 |
| | 10 | 2.67 | 26.1 | 16 |
| | 4 | 2.02 | 15.6 | 15 |

Example 5(b)

Polymer 5 was formulated with 1,4,8,11-tetramethyl bis-triethylsilylethynyl pentacene from the series of compounds represented by Formula (A2) in a ratio of 1:1 in bromobenzene at a total solids content of 0.5% by weight and ink jet printed as an OSC layer into banks having a size of 100 μm×100 μm. Measured channel width and length for the transistor are 100 and 7 μm.

The OTFT performance of this formulation is shown in Table 6 (b) below:

| Composition | Drops per pixel | Linear mobility (cm$^2$/Vs) | Standard deviation of mobility (%) | Number of working transistors tested on substrate (out of 6) |
|---|---|---|---|---|
| 1,4,8,11-tetramethyl bis-triethylsilylethynyl pentacene + Polymer 5 | 14 | 1.50 | 11.1 | 6 |

Example 5(c)

Polymer 5 was formulated with 6,13-bis-triisopropylsilylethynyl pentacene from the series of compounds represented by Formula (A) at a ratio of 1:1 in tetralin at 4% by weight total solids content. This was coated as an OSC layer in an OTFT device according to the method shown above for PEN substrate, with the exception that a plasma cleaning process was used to activate the surface (model PE100, ex Plasma Etch Inc.) using 50 sccm oxygen, 50 sccm argon, and a RF plasma power of 250 W, treatment time 65 s and that the OSC was coated at 2000 rpm.

The TFT performance of this formulation is shown in Table 6(c) below:

| Composition | Channel length (microns) | Linear mobility [cm$^2$/Vs] | Standard deviation of mobility [%] | Number of transistors tested on substrate (out of 25) |
|---|---|---|---|---|
| 6,13-bis-triisopropylsilylethynyl pentacene + Polymer 5 | 100 | 0.87 | 6.2 | 25 |
| | 30 | 0.67 | 7.8 | 24 |
| | 10 | 0.44 | 9.0 | 24 |
| | 4 | 0.21 | 10.0 | 23 |

Example 5(d)

Polymer 5 was formulated with 1,4,8,11-tetramethyl bis-triethylsilylethynyl pentacene from the series of compounds represented by Formula (A2) at a ratio of 1:2 in tetralin at 1% by weight total solids content. This was coated as an OSC layer according to the method shown above for bottom gate, bottom contact OTFT devices with SU8 gate dielectric, with the exception that the SAM used to alter the work function was 10 mM pentafluorobenzenethiol in IPA.

The TFT performance of this formulation is shown in Table 6(d) below:

| Composition | Channel length (microns) | Linear mobility [cm$^2$/Vs] | Standard deviation of mobility [%] | Number of transistors tested on substrate (out of 32) |
|---|---|---|---|---|
| 1,4,8,11-tetramethyl bis-triethylsilylethynyl pentacene + Polymer 5 | 100 | 1.24 | 12.9 | 15 |

Example 6

Polymer (6), 2,4-Dimethoxyphenyl-PTAA homopolymer

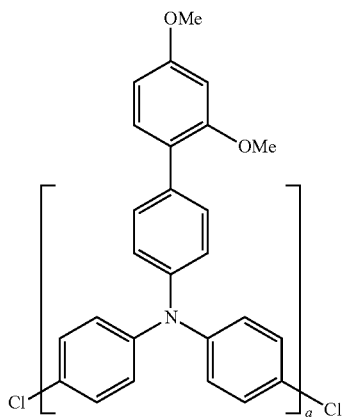

Synthesis of the 2,4-dimethoxyphenyl monomer

Tetrakis(triphenylphosphine)palladium(0) (Pd(PPh$_3$)$_4$) (6.62 g, Peakdale Molecular) was added to a mixture of 4-bromo-N,N-bis(4-chlorophenyl)aniline (Example 7a (i)) (75 g), 2,4-dimethoxyboronic acid (38.2 g, Alfa-Aesar) and sodium carbonate (64.7 g) in tetrahydrofuran (1120 mL) and H$_2$O (750 mL) under argon and the mixture was heated to reflux overnight. The organics were separated, the aqueous layer was extracted with ethyl acetate (×2) and the combined organics were dried and concentrated to a black solid. The solid was adsorbed onto silica and columned eluting ethyl acetate/heptane mixtures to give a green/brown solid. Methanol was added and the mixture was stirred for 20 minutes then filtered and washed with methanol (×2). Methanol was added, the mixture was heated to 40° C. and dichloromethane was added portion wise until all solids had dissolved. The solution was stirred for 10 minutes, cooled in an ice-bath for 1 h then the solids were filtered, washed with 50:50 methanol/dichloromethane (×2) and dried to give the product as a light green/brown solid. Yield: 40.8 g. $^1$H NMR (400 MHz, CDCl$_3$): δ 7.40 (2H, d, ArH), 7.19-7.25 (5H, m, ArH), 7.00-7.05 (6H, m, ArH), 6.55 (2H, m, ArH), 3.84 (3H, s, OMe), 3.81 (3H, s, OMe).

Synthesis of the 2,4-dimethoxyphenyl-PTAA polymer

A 500 mL three neck round bottom flask was fitted with overhead stirrer, thermometer, air condenser, Claisen adaptor and septum inlet. The apparatus was flushed with argon. N,N-dimethylacetamide (150 mL, Sigma Aldrich) was charged and degassed for 15 minutes. Triphenylphosphine (4.54 g, Sigma Aldrich), 2,2'-bipyridyl (210 mg, Sigma-Aldrich), zinc (6.71 g, Alfa-Aesar) and nickel (II) chloride (130 mg, Sigma Aldrich) were added to the vessel and the contents were heated to 70-80° C. where the mixture turned red-brown in colour. A few crystals of iodine were added, and the reaction was left to stir for 1 hour. The monomer (15 g) was added to the vessel followed by anhydrous toluene (24 mL, Sigma-Aldrich). The reaction was left to stir for 15 hours before being cooled to room temperature. The reaction was filtered, washing the solids with N,N-dimethylacetamide. The filter cake was dissolved in dichloromethane (500 mL) and filtered through celite. The filtrates were washed with 1M hydrochloric acid (250 mL), water (250 mL) and 10% brine solution (250 mL), dried (magnesium sulphate) and concentrated to give a yellow solid. This material was dissolved into dichloromethane (500 mL) and filtered through silica, eluting with dichloromethane. Product fractions were combined and concentrated to give a yellow solid. This was dissolved in chloroform (250 mL) and charcoal treated. The filtrates were then concentrated to give a yellow solid. This material was dissolved in chloroform (150 mL) and added dropwise to a stirred portion of methanol (750 mL). The resulting suspension was stirred for 1 hour before being collected by filtration to give a pale yellow powder. Yield: 6.67 g. Mn=3368 g/mol. n=8.8. Polydispersity=2.4.

The dielectric constant of polymer (6) was 3.5

Example 7 polymer (7), 50:50 4-Isopropylcyanophenyl-PTAA: 2,4-Dimethyl PTAA copolymer

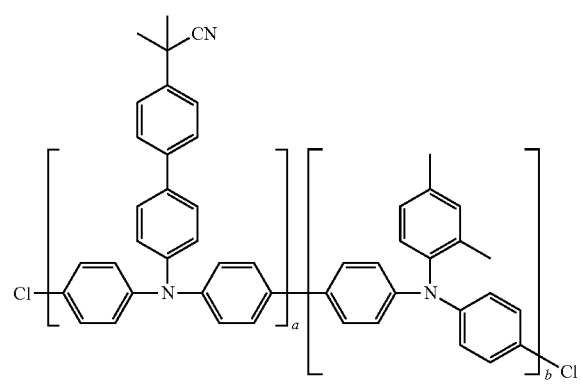

7 (a): Synthesis of the 4-Isopropylcyanophenyl-PTAA monomer

(i) 4-bromo-N,N-bis(4-chlorophenyl) aniline

A 5 L three neck flat bottomed flask, fitted with a condenser, thermometer and argon inlet, was flushed with argon. The flask was then charged with toluene (1.4 L), bis(4-chlorophenyl)amine, Compound of Example 3(c), (40 g), 4-bromo iodobenzene (52.3 g, Apollo Scientific), tris(dibenzylideneacetone)dipalladium(0)$Pd_2$-$(dba)_3$) (461 mg, Acros), (±)-2,2'-bis(diphenylphosphino)-1,1'-binaphthyl (1.05 g, Alfa-Aesar) and sodium-tert-butoxide (35.5 g, Alfa-Aesar). The resulting black solution was heated to 100° C. for 48 hours then cooled and filtered through a pad of celite, washing with toluene. The filtrate was concentrated to approximately half volume before washing with water (1 L), saturated brine (14 drying over $MgSO_4$ and concentrating to a green oil. Purification by dry flash column chromatography eluting with ethyl acetate/heptane mixtures followed by recrystallisation from acetonitrile gave the target compound. Yield: 32 g, off-white solid. $^1$H NMR (400 MHz, $CDCl_3$): δ 7.35 (2H, m, Ar—H), 7.20 (4H, m, Ar—H), 6.98 (4H, m, Ar—H), 6.92 (2H, m, Ar—H).

(ii) 4-(bis(4-chlorophenyl)amino)phenyl) boronic acid

A three neck round bottomed flask was fitted with a thermometer, argon inlet and a pressure equalizing dropping funnel. The flask was charged with anhydrous 2-methyltetrahydrofuran (1.1 L) and 4-bromo-N,N-bis(4-chlorophenyl) aniline (60.9 g) before being cooled to −78° C. n-Butyllithium (1.95M solution in hexanes, 95.4 mL) was added dropwise and the solution was stirred at −78° C. for 1 hour. Trimethyl borate (26 mL, Sigma-Aldrich) was then added dropwise via syringe and the reaction left to stir at −78° C. for 1.5 hours then warmed to room temperature overnight. 1M hydrochloric acid (630 mL) was added portionwise to the reaction mixture, the layers were split and the organics washed with water (600 mL), brine (600 mL), dried over $MgSO_4$ and concentrated to a pale yellow solid. The solid was slurried in heptane and stirred at room temp. for 1 hour. The solid was filtered off and washed with heptane before being dried under vacuum to give a pale yellow powder. Yield: 39.3 g. $^1$H NMR (400 MHz, $CDCl_3$): δ 8.02 (2H, m, Ar—H), 7.27 (4H, m, Ar—H), 7.05 (6H, m, Ar—H).

(iii) 2-(4'-(bis(4-chlorophenyl)amino)-[1,1'-biphenyl]-4-yl)-2-methylpropanenitrile A 2 L flat bottomed flask fitted with an argon inlet and condenser was charged with (4-(bis(4-chlorophenyl)amino)phenyl)boronic acid (39.3 g), 2-(4-iodophenyl)-2-methylpropanenitrile, compound from Example 5 (c) (27.1 g) and tetrahydrofuran (591 mL). Sodium carbonate (33.9 g) was dissolved in water (393 mL) and this was added to the tetrahydrofuran mixture. The reaction mixture was then heated to 75° C. for 16 hours. Ethyl acetate (200 mL) and water (200 mL) were added and the mixture filtered through a celite pad. The layers were split, the organic layers washed with brine (600 mL), dried over $MgSO_4$ and concentrated. The resulting material was purified by flash column chromatography eluting with ethyl acetate/heptane mixtures. The fractions were concentrated to a thick slurry and the solid filtered off, washed with heptane and dried under vacuum to give an off-white solid. Yield: 27 g. $^1$H NMR (400 MHz, $CDCl_3$): δ 7.56-7.42 (6H, m, Ar—H), 7.21 (4H, m, Ar—H), 7.15-7.02 (6H, m, Ar—H), 1.77 (6H, s, $CH_3$).

Isopropylcyanophenyl-PTAA:2,4-dimethyl-PTAA 50:50 copolymer

A 250 mL three-necked round bottom flask was fitted with overhead stirrer, thermometer, air condenser, Claisen adaptor and septum inlet. The apparatus was flushed with argon. N,N-dimethylacetamide (128 mL, Sigma Aldrich) was charged and degassed for 15 minutes. Triphenylphosphine (4.17 g, Sigma Aldrich), 2,2'-bipyridyl (191 mg, Sigma-Aldrich), zinc (6.16 g, Alfa-Aesar) and nickel (II) chloride (120 mg, Sigma Aldrich) were added to the vessel. The contents were heated to 70-80° C. where the mixture turned red-brown in colour. A few crystals of iodine were added, and the reaction was left to stir for 1 hour. The 2,4-dimethyl monomer (5.8 g) and 2-(4'-(bis(4-chlorophenyl)amino)-[1,1'-biphenyl]-4-yl)-2-methylpropanenitrile (7.0 g) were added to the reaction followed by anhydrous toluene (21 mL, Sigma Aldrich) and the reaction was stirred at this temperature for 16 hours. The reaction was cooled and the solids were filtered off, washing with N,N-dimethylacetamide. Toluene (600 mL) was added and the mixture was heated to 50° C. then filtered through a pad of celite. The remaining solids were dissolved in dichloromethane (500 mL), warmed to 40° C. then filtered through a pad of celite. The toluene filtrates were concentrated to a sticky solid, dichloromethane (500 mL) was added and combined with the previous dichloromethane filtrates. The combined organics were washed with 1M aqueous sodium hydroxide (800 mL), water (800 mL), 10% brine (800 mL), dried over $MgSO_4$ and concentrated. The resulting solid was dissolved in dichloromethane (250 mL) and passed through a silica pad, washing with dichloromethane. The combined fractions were concentrated to a solid which was dissolved in tetrahydrofuran (400 mL) and charcoal treated and concentrated to a yellow solid. The solid was dissolved in tetrahydrofuran (100 mL) and added dropwise to methanol (500 mL), filtered and dried under vacuum to give the target compound. Yield: 4.85 g. Mn=7139 g/mol. n=10.8. Polydispersity=1.6.

The dielectric constant of polymer (7) was 4.0

Example 7(a)

Polymer 7 was formulated with 1,4,8,11-tetramethyl bis-triethylsilylethynyl pentacene from the series of compounds represented by Formula (A2) at a ratio of 1:2 in bromobenzene at 1.2% by weight total solids content. This was coated as an OSC layer in an OTFT device according to the method shown above for PEN substrate devices with the exception that a plasma cleaning process was used to activate the surface (model PE100, ex Plasma Etch Inc.) using 50 sccm oxygen, 50 sccm argon, and a RF plasma power of 250 W, treatment time 65 s, and the spin speed of the OSC coating was 2000 rpm, 60 s.

The TFT performance of this formulation is shown in Table 8(a) below:

| Composition | Channel length (microns) | Linear mobility [cm²/Vs] | Standard deviation of mobility [%] | Number of transistors tested on substrate (out of 25) |
|---|---|---|---|---|
| 1,4,8,11-tetramethyl bis-triethylsilylethynyl pentacene + Polymer 7 | 100 | 4.40 | 4.4 | 20 |
| | 30 | 3.76 | 8.5 | 21 |
| | 10 | 2.73 | 5.4 | 20 |
| | 4 | 1.75 | 6.0 | 20 |

Example 7(b)

Polymer 7 was formulated with 1,4,8,11-tetramethyl bis-triethylsilylethynyl pentacene from the series of compounds represented by Formula (A2) at a ratio of 1:2 in tetralin at 1% by weight total solids content. This was coated as an OSC layer according to the method shown above for bottom gate, bottom contact OTFT devices with SU8 gate dielectric, with the exception that the SAM used to alter the work function was 10 mM pentafluorobenzenethiol in IPA.

The TFT performance of this formulation is shown in Table 8(d) below:

| Composition | Channel length (microns) | Linear mobility [cm²/Vs] | Standard deviation of mobility [%] | Number of transistors tested on substrate (out of 32) |
|---|---|---|---|---|
| 1,4,8,11-tetramethyl bis-triethylsilylethynyl pentacene + Polymer 7 | 100 | 0.90 | 11.6 | 7 |

Example 8

Polymer (8), 4-cyclohexylcyano-PTAA homopolymer

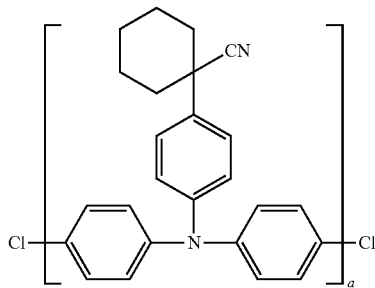

Synthesis of the 4-cyclohexylcyano PTAA oligomer 1-(4-iodophenyl)cyclohexanecarbonitrile N-Methylpyrrolidinone (NMP) (197 mL, Sigma-Aldrich) was added to a suspension of sodium tert-butoxide (124.0 g, Alfa-Aesar) in tetrahydrofuran (THF) (197 mL, Univar) under argon. The mixture was cooled to 0° C. and a solution of 1,5-dibromopentane (87.9 mL, Sigma-Aldrich) and 4-iodophenylacetonitrile (78.4 g) in a 50:50 mixture of NMP/THF (173 mL) was added dropwise keeping the internal temperature below 10° C. The mixture was warmed to room temperature and stirred overnight. 2M hydrochloric acid (930 mL) and toluene (930 mL) were added then the aqueous layer was separated and extracted with toluene (2×465 mL). The combined organics were washed with saturated sodium bicarbonate (930 mL), brine (930 mL), 2M sodium thiosulfate (930 mL), dried (magnesium sulphate) and concentrated in vacuo to a yellow/orange solid. Dichloromethane was added and the solid was filtered and washed with dichloromethane to give the product as a white solid. Yield: 22.55 g. $^1$H NMR (400 MHz, CDCl$_3$): δ 7.70-7.72 (2H, m, ArH), 7.22-7.25 (2H, m, ArH), 2.10-2.13 (2H, m, —CH$_2$—), 1.67-1.89 (7H, m, —CH—), 1.22-1.32 (1H, m, —CH—).

1-(4-(bis(4-chlorophenyl)amino)phenyl)cyclohexanecarbonitrile-4-cyclohexylcyano PTAA monomer A solution of palladium acetate (179 mg) and (±)-2,2'-bis(diphenylphosphino)-1,1'-binaphthyl (496 mg) in toluene (338 mL) was heated to 50° C. then cooled to room temperature. 1-(4-Iodophenyl)cyclohexanecarbonitrile (22.55 g), bis(4-chlorophenyl)amine (17.26 g) and sodium tert-butoxide (7.66 g) were added and the mixture was heated to reflux overnight. The mixture was cooled to room temperature, filtered through a pad of silica then concentrated in vacuo to an oil. Purification by column chromatography eluting ethyl acetate/heptane mixtures followed by recrystallisation from IPA gave the product as a white solid. Yield: 12.5 g. $^1$H NMR (400 MHz, CDCl$_3$): δ 7.31-7.35 (2H, m, ArH), 7.19-7.23 (4H, m, ArH), 6.97-7.04 (4H, m, ArH), 2.14-2.17 (2H, m-CH$_2$—), 1.68-1.86 (7H, m, —CH$_2$—), 1.20-1.32 (1H, m, —CH—).

Synthesis of 4-cyclohexylcyano PTAA oligomer 500 ml three neck round bottom flask was fitted with overhead stirrer, thermometer, air condenser, Claisen adaptor and septum inlet. The apparatus was flushed with argon. N,N-dimethylacetamide (125 mL, Sigma-Aldrich) was charged and degassed for 15 minutes. Triphenylphosphine (4.04 g, Sigma-Aldrich), 2,2'-bipyridyl (200 mg, Sigma-Aldrich), zinc (6.00 g, Alfa-Aesar) and nickel (II) chloride (120 mg, Sigma-Aldrich) were added to the vessel and the contents were heated to 70-80° C. where the mixture turned red-brown in colour. A few crystals of iodine were added and the reaction was left to stir for 1 hour. The 4-cyclohexylcyano monomer (12.5 g) was added to the vessel followed by anhydrous toluene (20 mL, Sigma-Aldrich) and the reaction was left to stir for 19 hours before being cooled to room temperature. The reaction was filtered, washing the solids with N,N-dimethylacetamide. The filter cake was dissolved in dichloromethane (250 mL) and filtered through celite. The filtrates were washed with 1M sodium hydroxide (250 mL), water (250 mL), 10% NaCl solution (250 mL), dried (sodium sulphate) and concentrated to give a yellow solid. This material was dissolved into dichloromethane (250 mL) and filtered through silica, eluting with dichloromethane. Product fractions were combined and concentrated to give an off white solid (8 g). The solid was dissolved in chloroform (250 mL) and charcoal treated three times (3×0.8 g charcoal). The filtrates were then concentrated to give an off white solid. This material was dissolved in chloroform (125 mL) and added dropwise to a stirred portion of methanol (625 mL). The resulting suspension was stirred for 1 hour before being collected by filtration to give an off white powder. Yield: 6.5 g. Due to insolubility, no GPC data was obtained.

The dielectric constant of polymer (8) was 4.1.

Example 9

Polymer (9), 30:70 Poly-9,9-dioctyl fluorene:$^i$PrCN-TAA copolymer

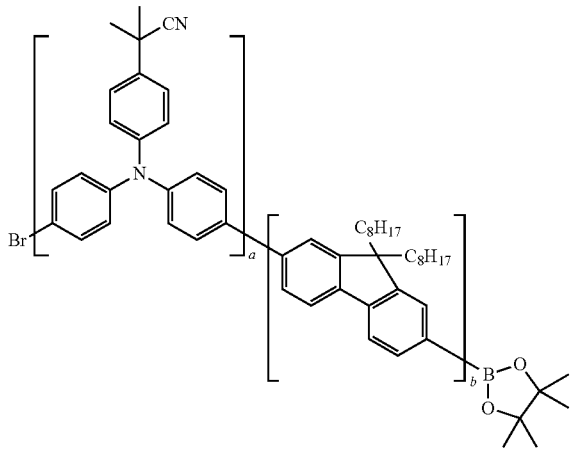

Synthesis of 30:70 Poly-9,9-dioctyl fluorene:$^i$PrCN-TAA copolymer 2-(4-(diphenylamino)phenyl)-2-methylpropanenitrile Palladium(II) acetate (3.01 g) and 4,5-bis(diphenylphosphino)-9,9-dimethylxanthene (7.76 g, Manchester Organics) were dissolved in toluene (550 mL) and the solution was degassed. Diphenylamine (22.7 g, Alfa-Aesar), sodium tert-butoxide (28.4 g) and 2-(4-iodophenyl)-2-methylpropanenitrile (40 g) were added and the solution heated to 90° C. for 18 hours. The reaction was cooled, filtered through a celite pad, washed with water, brine, dried (MgSO$_4$) and concentrated. The residue purified by flash column eluting ethyl acetate:heptane mixtures to give an oil. Heptane was added to the oil and the resulting solid was filtered to give the product as a white solid. Yield; 17.5 g. $^1$H NMR (400 MHz, CDCl$_3$); 7.22-7.32 (9H, m), 7.00-7.10 (6H, m), 1.71 (6H, s)

2-(4-(bis(4-bromophenyl)amino)phenyl)-2-methylpropanenitrile 2-(4-(diphenylamino)phenyl)-2-methylpropanenitrile (7.5 g) was dissolved in ethyl acetate (128 mL). N-Bromosuccinimide (8.55 g, Apollo Scientific) was added portionwise before leaving the reaction to stir at room temperature for 18 hours. The reaction mixture was washed with water, sodium carbonate, brine, dried (MgSO$_4$) and concentrated. Heptane was added to the residue and the resulting solid was filtered off to give the product as a grey solid. Yield; 6.4 g. $^1$H NMR (400 MHz, CDCl$_3$); 7.30 (6H, m), 7.04 (2H, d), 6.93 (4H, d), 1.71 (6H, s).

2-(4-(bis(4-(4,4,5,5-tetramethyl-1,3,2-dioxaborolan-2-yl)phenyl)amino)phenyl)-2-methylpropanenitrile-iPrCN TAA diboronate monomer A round bottom flask was charged with 2-(4-(bis(4-bromophenyl)amino)phenyl)-2-methylpropanenitrile (5 g), potassium acetate (3.65 g, Alfa-Aesar) and bis-pinacolato diboron (5.94 g, Allychem) in dioxane (150 mL). The mixture was degassed with argon for 15 minutes then [1,1'-Bis(diphenylphosphino)ferrocene]dichloropalladium (II) (389 mg, Peakdale) was added and the reaction mixture heated to 100° C. for 18 hours. The mixture was concentrated and the residue was taken up in DCM and filtered through a pad of celite washing with DCM. The organic layer was washed with water, brine, dried (MgSO$_4$) and concentrated onto silica. Purification by dry flash column eluting with heptane/ethyl acetate mixtures gave a white solid which was recrystallised from THF/MeCN to give the target compound as a white solid. Yield: 2.97 g. $^1$H NMR (400 MHz, CDCl$_3$); 7.69 (4H, m), 7.31 (2H, m) 7.09 (2H, m), 7.04 (4H, m), 1.72 (6H, s), 1.32 (24H, s).

30:70 Poly-9,9-dioctyl fluorene:$^i$PrCN-TAA copolymer 2,7-dibromo-9,9-dioctyl-9H-fluorene (1.69 g, Sigma-Aldrich), 2-(4-(bis(4-bromophenyl)amino)phenyl)-2-methylpropanenitrile (967 mg), 2-(4-(bis(4-(4,4,5,5-tetramethyl-1,3,2-dioxaborolan-2-yl)phenyl)amino)phenyl)-2-methylpropanenitrile (2.90 g), potassium phosphate (4.36 g, Alfa-Aesar) and Aliquat 336 (2 drops, Alfa-Aesar) were dissolved in a mixture of toluene (22 mL), dioxane (22 mL) and water (11 mL). The solution was degassed for 15 minutes before adding tris(dibenzylideneacetone)dipalladium(0) (24 mg, Acros) and tri(o-tolyl)phosphine (47 mg, Sigma-Aldrich) and heating to 90° C. for 17 hours. The reaction mixture was poured onto methanol (280 mL) and the resulting precipitate was filtered, dissolved in toluene (250 mL), washed with 1N NaOH, brine, water, dried (MgSO$_4$) and concentrated. The residue was dissolved in toluene (80 mL) and passed through a pad of silica, washing with toluene, toluene/THF and THF. The filtrates were concentrated and charcoal treated (3×0.33 g). The filtrates were concentrated and the solid taken up in THF (60 mL) and added dropwise to methanol (300 mL). The solid was filtered to give the target compound as a yellow solid. Yield; 2.46 g. Mn=9731 g/mol, n=13.9, Polydispersity=1.8.

The dielectric constant of polymer (9) was 4.6.

Example 9(a)

Polymer 9 was formulated with 1,4,8,11-tetramethyl bis-triethylsilylethynyl pentacene from the series of compounds represented by Formula (A2) at a ratio of 2:1 in tetralin at 1.2% by weight total solids content. This was coated as an OSC layer in an OTFT device according to the method shown above for glass/SU8 substrate devices with the exception that the thiol used was 4-fluorothiophenol and a plasma cleaning process was used to activate the surface (model PE100, ex Plasma Etch Inc.) using 50 sccm oxygen, 50 sccm argon, and a RF plasma power of 250 W, treatment time 65 s.

The TFT performance of this formulation is shown in Table 10(a) below:

| Composition | Channel length (microns) | Linear mobility [cm$^2$/Vs] | Standard deviation of mobility [%] | Number of transistors tested on substrate (out of 32) |
|---|---|---|---|---|
| 1,4,8,11-tetramethyl bis-triethylsilylethynyl pentacene + Polymer 9 | 102 | 4.36 | 3.6 | 24 |
| | 32 | 4.32 | 3.1 | 29 |
| | 12 | 3.95 | 7.2 | 24 |
| | 6 | 3.62 | 9.6 | 26 |

Example 10 polymer (10), 30:70 Poly-tetraoctyl-indenofluorene: 4-$^i$PrCN-TAA copolymer

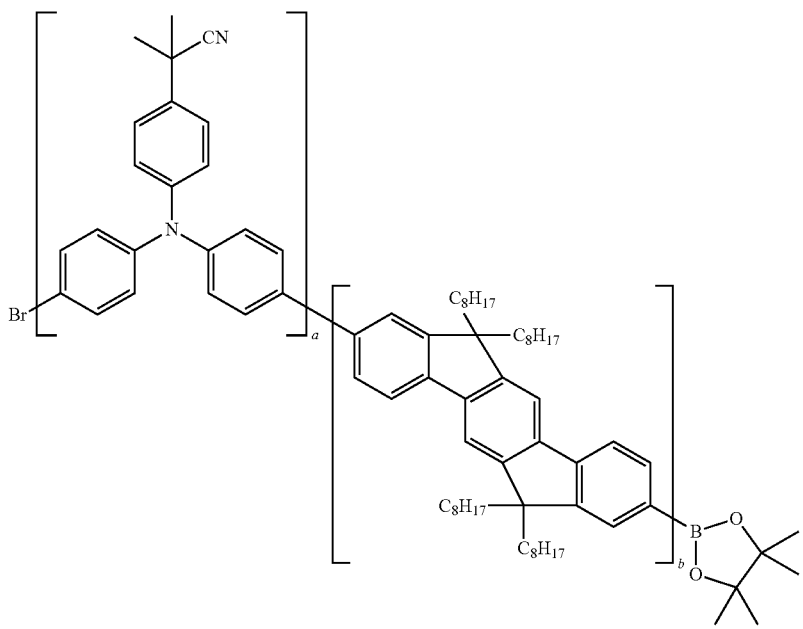

30:70 Poly-tetraoctyl-indenofluorene:$^i$PrCN-TAA copolymer

2',5'-dimethyl-1,1':4',1"-terphenyl 1,4-Dibromo-2,5-dimethylbenzene (166.3 g, Sigma-Aldrich), phenylboronic acid (157.25 g, Apollo Scientific), potassium carbonate (401.2 g, Sigma-Aldrich), tetra-n-butylammonium bromide (375.0 g, Alfa-Aesar) and palladium (II) acetate (2.74 g) were mixed together in water (1570 mL) and heated to 70° C. for 18 hours. The reaction was diluted with water (1500 mL), stirred for 10 minutes and the solids collected by vacuum filtration. The solids were washed with water (2×300 mL) and dried to give the product as a grey solid. Yield; 180.9 g. $^1$H NMR (400 MHz, CDCl$_3$); 7.39 (10H, m), 7.16 (2H, s), 2.28 (6H, s).

[1,1':4',1"-terphenyl]-2',5'-dicarboxylic acid

2',5'-Dimethyl-1,1':4',1"-terphenyl (180.9 g) was dissolved in pyridine (4296 mL), water (405 mL) was added and the reaction mixture heated to 90° C. Potassium permanganate (KMnO$_4$) (516 g, Sigma-Aldrich) was carefully added and refluxing continued. Additional KMnO$_4$ (235 g) and water (677 mL) were added every 30 minutes for 2 hours. Once addition was complete, refluxing was continued for 18 hours. The reaction mixture was filtered hot through a celite pad, washing the filter cake with boiling water (3×2000 mL). The filtrates were concentrated to remove most of the pyridine before adjusting to pH-1 with concentrated hydrochloric acid. The solids were collected by vacuum filtration, washed with water (2×1400 mL) and dried to give a cream solid. The solid was then refluxed in ethyl acetate (840 mL), cooled, collected by vacuum filtration and washed with ethyl acetate (2×233 mL) to give the product as a cream solid. Yield; 183.8 g.

indeno[1,2-b]fluorene-6,12-dione

[1,1':4',1"-Terphenyl]-2',5'-dicarboxylic acid (183.85 g) was added portionwise to sulfuric acid (1804 mL, Fisher Scientific) and stirred for 2 hours. The reaction mixture was poured onto an ice-water mixture (5900 mL) and stirred for 10 minutes. The solid was collected by vacuum filtration and washed with water (2×831 mL). The solid was then stirred in methanol (1663 mL) for 1 hour, solids collected by vacuum filtration, washed with water (2×831 mL) and dried to give the product as a purple solid. Yield; 148.2 g. $^1$H NMR (400 MHz, CDCl$_3$); 7.81 (2H, m), 7.68 (2H, m), 7.57 (4H, m), 7.34 (2H, m).

6,12-dihydroindeno[1,2-b]fluorene

Potassium hydroxide (163.7 g), diethylene glycol (1412 mL, Alfa-Aesar) and indeno[1,2-b]fluorene-6,12-dione (28.23 g) were charged to a suitable vessel under argon. Hydrazine-hydrate (152 mL, Alfa-Aesar) was added and the reaction heated to 170° C. for 18 hours. The reaction mixture was slowly added to a mixture of ice (2 kg) and concentrated hydrochloric acid (1 L) and the resulting slurry stirred for 10 minutes. The solids were collected by vacuum filtration, washed with water (3×500 mL) and dried to give the product as a grey solid. Yield; 24.49 g. $^1$H NMR (400 MHz, CDCl$_3$); 7.95 (2H, m), 7.80 (2H, m), 7.54 (2H, m), 7.39 (2H, m), 7.30 (2H, m).

6,6,12,12-tetraoctyl-6,12-dihydroindeno[1,2-b]fluorene 6,12-Dihydroindeno[1,2-b]fluorene (24.03 g) was dissolved in DMSO (372.4 mL, Sigma-Aldrich) and sodium tert-butoxide (56.18 g) was added before heating to 80° C. Octyl bromide (110.6 g, Fluorochem) was added dropwise keeping the temperature below 90° C. The reaction was cooled, dissolved in heptane (2400 mL), washed with water (3×746 mL), dried (Na$_2$SO$_4$) and concentrated to give a dark solid. The solid was refluxed in methanol (480 mL) for 10 minutes, cooled to room temperature and collected by vacuum filtration. The solids were washed with methanol (2×480 mL) and dried to give the product as a dark solid. Yield; 82.56 g. $^1$H NMR (400 MHz, CDCl$_3$); 7.74 (2H, m), 7.60 (2H, m), 7.32 (6H, m), 2.00 (8H, m), 1.05 (40H, m), 0.80 (12H, m), 0.60 (8H, m).

2,8-dibromo-6,6,12,12-tetraoctyl-6,12-dihydroindeno[1,2-b]fluorene 6,6,12,12-Tetraoctyl-6,12-dihydroindeno[1,2-b]fluorene (60.24 g) and iodine (33.6 mg, Alfa-Aesar) were dissolved in DCM (143 mL) in a suitable vessel under argon. Sodium carbonate (23.98 g) in water (85.7 mL) was added and the mixture cooled to −5° C. A solution of bromine (32.04 g, Sigma-Aldrich) in DCM (57 mL) was added keeping the temperature below 5° C. The reaction was then warmed to room temperature and stirred for 16 hours. The mixture was diluted with DCM (285 mL), washed with 20% sodium thiosulfate (143 mL), water (2×143 mL), dried (Na$_2$SO$_4$) and concentrated to give a yellow solid. Recrystallisation from acetone gave the product as a white solid. Yield; 68.54 g. $^1$H NMR (400 MHz, CDCl$_3$); 7.57 (4H, m), 7.47 (4H, m), 1.97 (8H, m), 1.09 (40H, m), 0.80 (12H, m), 0.60 (8H, br m).

2-(4-(bis(4-(4,4,5,5-tetramethyl-1,3,2-dioxaborolan-2-yl)phenyl)amino)phenyl)-2-methylpropanenitrile-iPrCN-TAA diboronate monomer A round bottomed flask was charged with 2-(4-(bis(4-bromophenyl)amino)phenyl)-2-methylpropanenitrile (5 g), potassium acetate (3.65 g) and bis-pinacolato diboron (5.94 g) in dioxane (150 mL). The solution was degassed with argon for 15 minutes. [1,1'-Bis(diphenylphosphino)ferrocene]dichloropalladium(II) (389 mg) was added and the reaction mixture heated to 100° C. for 18 hours. The mixture was concentrated and the residue was taken up in DCM and filtered through a pad of celite washing with DCM. The organic layer was washed with water, brine, dried (MgSO$_4$) and concentrated onto silica. Purification by dry flash column eluting with heptane/ethyl acetate mixtures gave a white solid which was recrystallised from THF/MeCN to give the target compound as a white solid. Yield; 2.84 g. $^1$H NMR (400 MHz, CDCl$_3$); 7.69 (4H, m), 7.31 (2H, m) 7.09 (2H, m), 7.04 (4H, m), 1.72 (6H, s), 1.32 (24H, s).

30:70 Poly-tetraoctylindenofluorene:$^i$PrCN TAA copolymer 2,8-dibromo-6,6,12,12-tetraoctyl-6,12-dihydroindeno[1,2-b]fluorene (2.60 g), 2-(4-(bis(4-bromophenyl)amino)phenyl)-2-methylpropanenitrile (947 mg), 2-(4-(bis(4-(4,4,5,5-tetramethyl-1,3,2-dioxaborolan-2-yl)phenyl)amino)phenyl)-2-methylpropanenitrile (2.84 g), potassium phosphate (4.27 g) and Aliquat 336 (2 drops) were dissolved in a mixture of toluene (32 mL), dioxane (16 mL) and water (16 mL). The solution was degassed for 15 minutes before adding tris(dibenzylideneacetone)dipalladium(0) (23 mg) and tri(o-tolyl)phosphine (46 mg) and heating to 90° C. for 17 hours. The reaction mixture was poured onto methanol (320 mL) and the resulting precipitate was filtered, dissolved in toluene (200 mL), washed with 1N NaOH, brine, water, dried (MgSO$_4$) and concentrated. The residue was dissolved in toluene (150 mL) and passed through a pad of silica, washing through with toluene, toluene/THF and THF. The filtrates were concentrated and charcoal treated (3×0.53 g). The filtrates were concentrated and the solid taken up in THF (70 mL) and added dropwise to methanol (350 mL). The solid was filtered to give the target compound as a yellow solid. Yield: 3.3 g. Mn=11341 g/mol, n=11.2, Polydispersity=1.9.

The dielectric constant of polymer (10) was 4.2.

Example 10(a)

Polymer 10 was formulated with 1,4,8,11-tetramethyl bis-triethylsilylethynyl pentacene from the series of compounds represented by Formula (A2) at a ratio of 2:1 in bromobenzene at 2% by weight total solids content. This was PEN substrate devices with the exception that a plasma cleaning process was used to activate the surface (model PE100, ex Plasma Etch Inc.) using 50 sccm oxygen, 50 sccm argon, and a RF plasma power of 250 W, treatment time 65 s.

The TFT performance of this formulation is shown in Table 11(a) below:

| Composition | Channel length (microns) | Linear mobility [cm$^2$/Vs] | Standard deviation of mobility [%] | Number of transistors tested on substrate (out of 25) |
|---|---|---|---|---|
| 1,4,8,11-tetramethyl bis-triethylsilylethynyl pentacene + Polymer 10 | 100 | 3.62 | 10.2 | 22 |
| | 30 | 2.52 | 8.5 | 23 |
| | 10 | 1.24 | 14.4 | 20 |

Example 11 polymer (9), 30:70 isopropylcyano-PTAA: 2,4-Dimethyl PTAA Bis-aryl end terminated copolymer

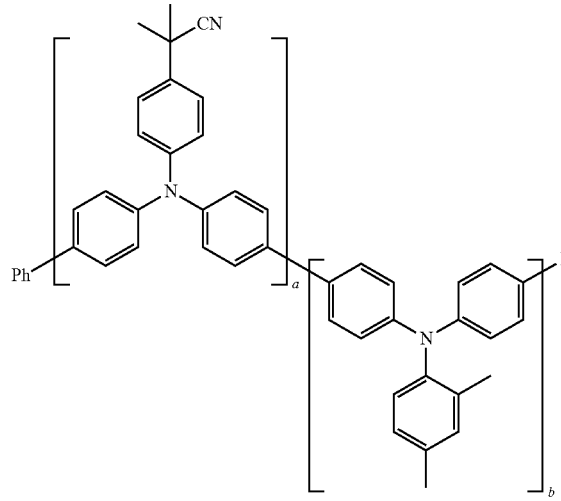

2,4-dimethyl-N,N-diphenylaniline

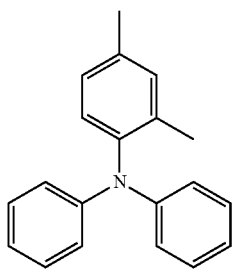 [SMILES: Cc1ccc(N(c2ccccc2)c2ccccc2)c(C)c1]

Toluene (735 mL) was degassed for 10 minutes then diphenylamine (15 g), 4-iodoxylene 5 (21.6 g, Alfa-Aesar) and sodium tert-butoxide (10.65 g) were added before degassing for a further 5 minutes. Tris(dibenzylideneacetone)dipalladium(0) (812 mg) and tri-tert-butylphosphine (1.08 mL) were added and the mixture was heated to 95° C. for 3.5 hours. The reaction was cooled, quenched with water (750 mL), stirred for 10 minutes then filtered through celite. The organic layer was separated, washed with brine (2×500 mL), dried (MgSO$_4$) and concentrated to a brown oil. The oil was redissolved in toluene and passed through a silica plug. The filtrates were concentrated to give the title compound as a brown oil. $^1$H NMR (400 MHz, CDCl$_3$): δ 7.16-7.23 (4H, m, ArH), 6.86-7.05 (9H, m, ArH), 2.33 (3H, s, CH$_3$), 2.00 (3H, s, CH$_3$).

N,N-Bis(4-bromophenyl)-2,4-dimethylaniline

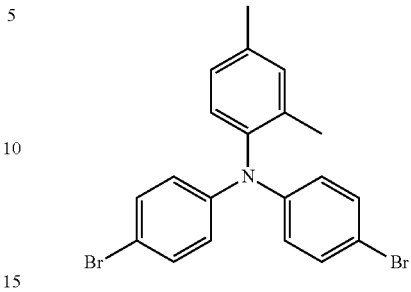

NBS (31.55 g) was added to a solution of 2,4-dimethyl-N,N-diphenylaniline 6 (24.23 g) in EtOAc (410 mL). The mixture slowly warmed over 5 minutes and was stirred for a further 1 hour until the solution had re-cooled. The mixture was washed with water (250 mL), Na$_2$CO$_3$ (2×375 mL), brine (250 mL), dried (MgSO$_4$) and concentrated to a dark brown solid. Recrystallisation from THF/MeCN gave the title compound as a grey solid. $^1$H NMR (400 MHz, CDCl$_3$): δ 7.22-7.30 (4H, m, ArH), 7.05 (1H, d, ArH), 7.00 (1H, dd, ArH), 6.95 (1H, d, ArH), 2.33 (3H, s, CH$_3$), 1.97 (3H, s, CH$_3$).

2,4-Dimethyl-N,N-bis(4-(4,4,5,5-tetramethyl-1,3,2-dioxaborolan-2-yl)phenyl)aniline

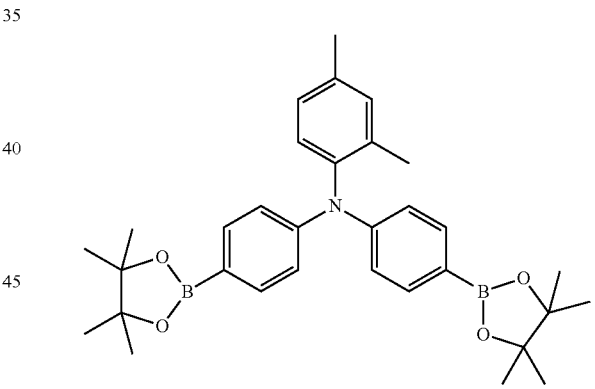

A mixture of N,N-bis(4-bromophenyl)-2,4-dimethylaniline 7 (10 g), bis(pinacolato)diboron (12.96 g, Allychem), and potassium acetate (7.97 g, Alfa-Aesar) in dioxane (250 mL) was degassed for 10 minutes then [1,1'-bis(diphenylphosphino)ferrocene]dichloropalladium (II) complex with dichloromethane (947 mg) was added and the mixture was heated to 100° C. overnight. The mixture was concentrated and the residue was dissolved in DCM (300 mL) and passed through a plug of celite. The filtrates were washed with water (2×200 mL), dried (MgSO$_4$) and concentrated to a dark brown solid. Purification by column chromatography eluting with EtOAc/heptane mixtures followed by recrystallisation from THF/MeCN gave the title compound as a white solid. $^1$H NMR (400 MHz, CDCl$_3$): δ 7.62-7.64 (4H, m, ArH), 6.92-7.05 (7H, m, ArH), 2.34 (3H, s, CH$_3$), 1.95 (3H, s, CH$_3$), 1.29 (24H, s, CH$_3$).

Synthesis of 30:70 4-isopropylcyano-PTAA:2,4-Dimethyl-PTAA copolymer 11a

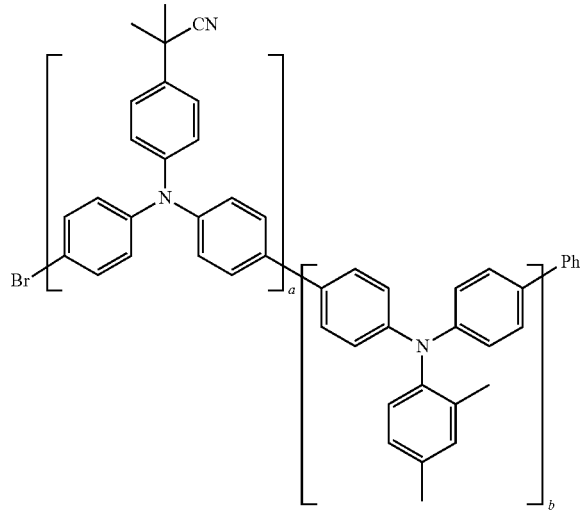

11(a): Synthesis of 2-(4-(bis(4-bromophenyl)amino)phenyl)-2-methylpropanenitrile

(i) 2-(4-(diphenylamino)phenyl)-2-methylpropanenitrile

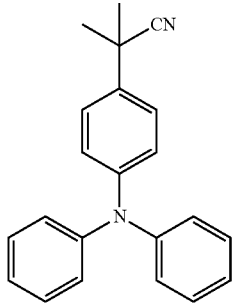 [SMILES: CC(C)(C#N)c1ccc(N(c2ccccc2)c2ccccc2)cc1]

Palladium(II) acetate (3.01 g, Precious Metals Online) and 4,5-bis(diphenylphosphino)-9,9-dimethylxanthene (7.76 g, Manchester Organics) were dissolved in toluene (550 mL) and the solution was degassed. Diphenylamine (22.7 g, Alfa-Aesar), sodium tert-butoxide (28.4 g, Alfa-Aesar) and 2-(4-iodophenyl)-2-methylpropanenitrile (40 g) were added and the solution heated to 90° C. for 18 hours. The reaction was cooled, filtered through a celite pad, washed with water, brine, dried (MgSO$_4$) and concentrated. The residue purified by flash column eluting ethyl acetate: heptane mixtures to give an oil. Heptane was added to the oil and the resulting solid was filtered to give the product as a white solid. Yield; 17.5 g. $^1$H NMR (400 MHz, CDCl$_3$); 7.22-7.32 (9H, m), 7.00-7.10 (6H, m), 1.71 (6H, s)

(ii) 2-(4-(bis(4-bromophenyl)amino)phenyl)-2-methylpropanenitrile

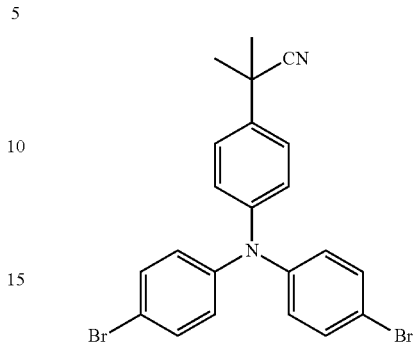

2-(4-(diphenylamino)phenyl)-2-methylpropanenitrile (7.5 g) was dissolved in ethyl acetate (128 mL). N-Bromosuccinimide (NBS) (8.55 g, Apollo Scientific) was added portionwise before leaving the reaction to stir at room temperature for 18 hours. The reaction mixture was washed with water, sodium carbonate, brine, dried (MgSO$_4$) and concentrated. Heptane was added to the residue and the resulting solid was filtered off to give the product as a grey solid. Yield; 6.4 g. $^1$H NMR (400 MHz, CDCl$_3$); 7.30 (6H, m), 7.04 (2H, d), 6.93 (4H, d), 1.71 (6H, s).

11(b): Synthesis of 2-(4-(bis(4-bromophenyl)amino)phenyl)-2-methylpropanenitrile

(i) 2,4-dimethyl-N,N-diphenylaniline

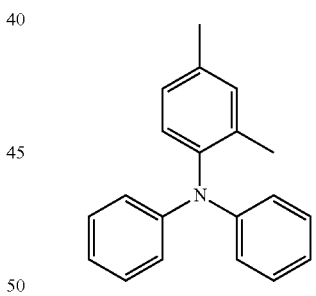

Toluene (735 mL) was degassed for 10 minutes then diphenylamine (15 g, Alfa Aesar), 4-iodoxylen (21.6 g, Alfa-Aesar) and sodium tert-butoxide (10.65 g, Alfa Aesar) were added before degassing for a further 5 minutes. Pd$_2$(dba)$_3$ (812 mg, Acros) and tri-tert-butylphosphine (1.08 mL, Alfa Aesar) were added and the mixture was heated to 95° C. for 3.5 hours. The reaction was cooled, quenched with water (750 mL), stirred for 10 minutes then filtered through celite. The organic layer was separated, washed with brine (2×500 mL), dried (MgSO$_4$) and concentrated to a brown oil. Yield: 24.46 g. The oil was redissolved in toluene and passed through a silica plug. The filtrates were concentrated to give the title compound as a brown oil. $^1$H NMR (400 MHz, CDCl$_3$): δ 7.16-7.23 (4H, m, ArH), 6.86-7.05 (9H, m, ArH), 2.33 (3H, s, CH$_3$), 2.00 (3H, s, CH$_3$).

(ii) N,N-Bis(4-bromophenyl)-2,4-dimethylaniline

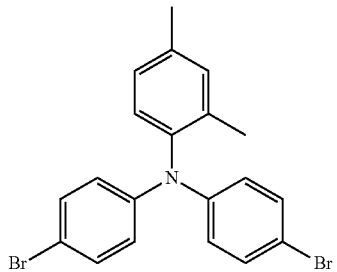 [SMILES: Cc1ccc(N(c2ccc(Br)cc2)c2ccc(Br)cc2)c(C)c1]

NBS (31.55 g, Apollo Scientific) was added to a solution of 2,4-dimethyl-N,N-diphenylaniline (24.23 g) in EtOAc (410 mL). The mixture slowly warmed over 5 minutes and was stirred for a further 1 hour until the solution had re-cooled. The mixture was washed with water (250 mL), Na$_2$CO$_3$ (2×375 mL), brine (250 mL), dried (MgSO$_4$) and concentrated to a dark brown solid. Recrystallisation from THF/MeCN gave the title compound as a grey solid. Yield: 27.70 g. $^1$H NMR (400 MHz, CDCl$_3$): δ 7.22-7.30 (4H, m, ArH), 7.05 (1H, d, ArH), 7.00 (1H, dd, ArH), 6.95 (1H, d, ArH), 2.33 (3H, s, CH$_3$), 1.97 (3H, s, CH$_3$).

11(C): Synthesis of 2,4-Dimethyl-N,N-bis(4-(4,4,5,5-tetramethyl-1,3,2-dioxaborolan-2-yl)phenyl)aniline

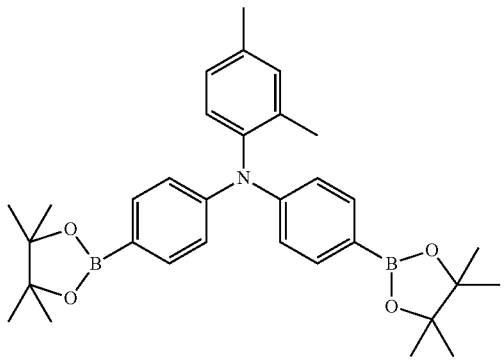

A mixture of N,N-bis(4-bromophenyl)-2,4-dimethylaniline 7 (10 g), bis(pinacolato)diboron (12.96 g, Allychem), and potassium acetate (7.97 g, Alfa-Aesar) in dioxane (250 mL) was degassed for 10 minutes then [1,1'-bis(diphenylphosphino)ferrocene]dichloropalladium (II) complex with dichloromethane (947 mg, Peakdale Molecular) was added and the mixture was heated to 100° C. overnight. The mixture was concentrated and the residue was dissolved in DCM (300 mL) and passed through a plug of celite. The filtrates were washed with water (2×200 mL), dried (MgSO$_4$) and concentrated to a dark brown solid. Purification by column chromatography eluting with EtOAc/heptane mixtures followed by recrystallisation from THF/MeCN gave the title compound as a white solid. Yield: 5.60 g. $^1$H NMR (400 MHz, CDCl$_3$): δ 7.62-7.64 (4H, m, ArH), 6.92-7.05 (7H, m, ArH), 2.34 (3H, s, CH$_3$), 1.95 (3H, s, CH$_3$), 1.29 (24H, s, CH$_3$).

Synthesis of 30:70 4-isopropylcyano-PTAA:
2,4-Dimethyl-PTAA copolymer 11a

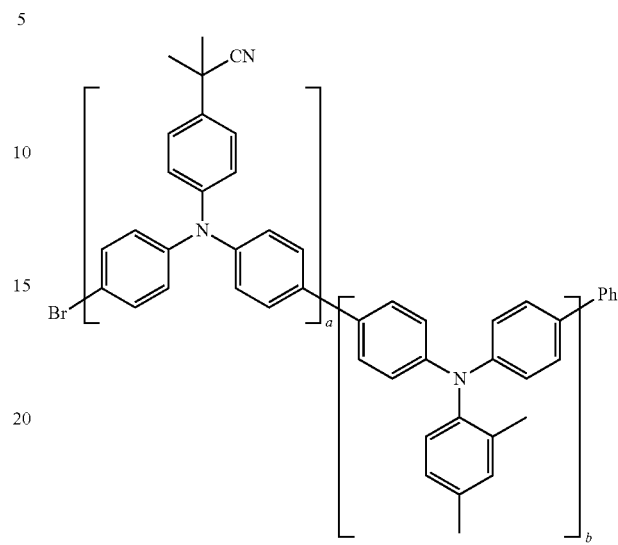

2-(4-(Bis(4-bromophenyl)amino)phenyl)-2-methylpropanenitrile (Example 11a (ii) (537.4 mg), N,N-bis(4-bromophenyl)-2,4-dimethylaniline (Example 11 b (ii) (328.5 mg) and 2,4-dimethyl-N,N-bis(4-(4,4,5,5-tetramethyl-1,3,2-dioxaborolan-2-yl)phenyl)aniline (Example 11 (c) (1.01 g) were added to a mixture of toluene:dioxane:water (9.3 mL:4.6 mL:4.6 mL) followed by potassium phosphate (1.61 g, Alfa-Aesar) and Aliquat 336 (4 drops, Alfa Aesar). The mixture was degassed for 10 minutes then Pd$_2$(dba)$_3$ (8.8 mg, Acros) and tri(o-tolyl)phosphine] (17.4 mg, Sigma-Aldrich) were added and the mixture was heated to 90° C. until the required Mn was reached. Mn was determined by sampling the reaction every hour and analysing by GPC. At this point, the pinacolatoboron moieties were substituted by addition of bromobenzene (1.5 g, Sigma Aldrich) and heating the mixture at 90° C. overnight. The mixture was cooled, poured into MeOH (92.5 mL) and the precipitate was filtered and dissolved in toluene (100 mL). The solution was washed with 1M NaOH (92.5 mL), water (92.5 mL), brine (92.5 mL), dried (magnesium sulphate) and concentrated to give an orange solid. The solid was dissolved in toluene (10 mL) and filtered through a silica plug eluting THF:toluene (50:50). The filtrates were concentrated to an orange solid that was dissolved in THF (10 mL) and added dropwise to MeOH (50 mL). The suspension was stirred for 15 minutes then filtered to give a yellow solid that was dissolved in toluene, treated with charcoal (3×80 mg) and the filtrates were concentrated. The solid was dissolved in THF (10 mL) and added dropwise to MeOH (50 mL). The resulting solid was filtered and dried to give the title compound as a yellow solid. Yield: 620 mg. Mn=3900 g/mol. n=13.8. Polydispersity=2.3.

Synthesis of 30:70 4-isopropylcyano-PTAA:
2,4-Dimethyl-PTAA

Toluene (170 mL) was degassed for 10 minutes then 2-(4-(bis(4-bromophenyl)amino)phenyl)-2-methylpropanenitrile (2.70 g), N,N-bis(4-bromophenyl)-2,4-dimethylaniline (1.66 g) and 2,4-dimethyl-N,N-bis(4-(4,4,5,5-tetramethyl-1,3,2-dioxaborolan-2-yl)phenyl)aniline (5.01 g)

were added followed by (Ph$_3$P)$_4$Pd (27.7 mg, Peakdale Molecular) and 1M Na$_2$CO$_3$ (95 mL). The mixture was heated to 95° C. until the required Mn was reached. Mn was determined by sampling the reaction and analysing by GPC. At this point, the pinacolatoboron moieties were substituted by addition of bromobenzene (7.5 g, Sigma Aldrich) and heating the mixture at 95° C. overnight. The mixture was then cooled and poured into methanol (1325 mL). The resulting suspension was collected by filtration, dissolved in toluene (250 mL) and filtered through celite. The filtrates were washed with 1M NaOH (250 mL), water (250 mL), brine (250 mL), dried (MgSO$_4$) and concentrated to give a yellow solid. To remove the bromide moieties, this was dissolved into degassed toluene (170 mL) and to it was added 1M Na$_2$CO$_3$ (95 mL), (Ph$_3$P)$_4$Pd (27.7 mg, Peakdale Molecular) and phenylboronic acid (5.81 g, Apollo Scientific). This was heated to 95° C. overnight. The workup was repeated as above, concentrating to 150 mL. This was filtered through silica, eluting with 50:50 toluene:THF mixture. The filtrates were concentrated to a brown solid which was dissolved in toluene (100 mL), treated with charcoal (3×500 mg) and the filtrates were concentrated. The solid was dissolved in THF (50 mL) and precipitated into MeOH (250 mL). The resulting suspension was filtered to yield the title compound as a grey solid. Yield: 4.0 g. Mn=1992 g/mol. n=7.0. Polydispersity=3.4. The dielectric constant of polymer 9 was 3.6.

Alternative Method

Toluene (34 mL) was degassed for 10 minutes then 2-(4-(bis(4-bromophenyl)amino)phenyl)-2-methylpropanenitrile (537.4 mg), N,N-bis(4-bromophenyl)-2,4-dimethylaniline (328.7 mg) and 2,4-dimethyl-N,N-bis(4-(4,4,5,5-tetramethyl-1,3,2-dioxaborolan-2-yl)phenyl)aniline (1.00 g) were added followed by (Ph$_3$P)$_4$Pd (5.7 mg, Peakdale Molecular) and 1M Na$_2$CO$_3$ (19 mL). The mixture was heated to 95° C. for 12 hours then the pinacolatoboron moieties were substituted by addition of bromobenzene (1.5 g, Sigma Aldrich) and heating the mixture at 95° C. overnight. The bromide moieties were then substituted by addition of phenylboronic acid (1.16 g, Apollo Scientific) and heating the mixture overnight. Purification as above gave the product as a grey solid. Yield: 825 mg. Mn=2300 g/mol. n=8.1. Polydispersity=3.1

Comparative Example (12), Synthesis of the 2,4-dimethyl-PTAA polymer

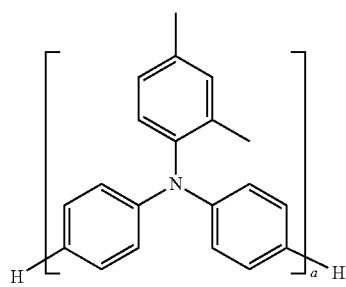

Synthesis of the 2,4-Dimethyl polytriarylamine polymer (12)

A 1 L three neck round bottom flask was fitted with overhead stirrer, thermometer, air condenser, Claisen adaptor and septum inlet. The apparatus was flushed with argon. 500 ml of anhydrous N,N-dimethylacetamide (Sigma Aldrich) was charged to the vessel using a cannula needle, and the solution was degassed with argon for 15 minutes. Triphenylphosphine (19.65 g, Sigma Aldrich), 2,2'-bipyridyl (0.92 g, Sigma Aldrich), zinc (29.65 g, Alfa-Aesar) and nickel (II) chloride (0.51 g, Sigma Aldrich) were added and the reaction mass heated to 70-80° C., whereupon the mixture turned red-brown in colour. After 20 minutes, a few crystals of iodine were added and the mixture was left stirring at 70-80° C. for a further 40 minutes. The 2,4-dimethyl PTAA monomer (49.88 g, see Example 4) was added, followed by anhydrous toluene (75 mL, Aldrich). The reaction was left to stir at 70-80° C. for 19 hours. The reaction was cooled to room temperature and filtered. The solids were washed with the filtrate before being transferred back into the vessel and dissolved into toluene (500 mL) at 50° C. The mixture was cooled to room temperature, and the excess zinc was quenched by slow addition of concentrated hydrochloric acid (80 mL). The layers were separated and the organic phase washed with 10% aqueous sodium chloride solution (3×250 mL). The organic phase was then dried (sodium sulphate) and filtered through a celite pad. The filtrates were concentrated to give a yellow solid. This was dissolved in toluene (200 mL) and filtered through a pad of silica gel (100 g), eluting with toluene until no further product was seen by UV spot on a TLC plate. The filtrates were combined and concentrated to give a yellow solid. A solution of this solid in 150 mL of tetrahydrofuran was prepared and then added into a stirred portion of methanol (750 mL) over 1 hour. The suspension was stirred for 1 hour before being filtered, washed with methanol (2×100 mL) and dried to give a yellow powder. Yield: 25.78 g. Mn=3263 g/mol, n=12.0, polydispersity=1.7.

Hydrodechlorination Process

A 1 L autoclave fitted with magnetic stirrer was charged with 11.22 g of the 2,4-dimethyl polytriarylamine polymer and 500 mL of toluene (Fisher Scientific). To this was added a slurry of 10% palladium on carbon (5.6 g, Sigma Aldrich) in water (90 mL). Triethylamine (17 mL, Alfa-Aesar) was added to this stirred solution and the reaction mixture hydrogenated at 300 psi/50° C. for 72 hours. After cooling and venting, the mixture was filtered through celite, eluting with toluene. The filtrates were washed with water (4×500 mL), dried (sodium sulphate) and concentrated to give a yellow solid. This material was dissolved in toluene (100 mL) and filtered through a silica pad, eluting with toluene until no further product was seen by a UV spot on a TLC plate. The filtrates were then concentrated to give a yellow solid. A 500 mL round bottom flask was charged with a solution of the product in toluene (250 mL) and activated charcoal (1.2 g). The mixture was heated to 60° C. for 30 minutes, then filtered hot through a Buchner funnel, washing with the minimum amount of toluene. This carbon screening process was repeated twice more, filtering the third treatment through a glass sinter. The filtrates were concentrated to give a dark yellow solid. A solution of this material in tetrahydrofuran (60 mL) was prepared and added slowly to a stirred portion of methanol (300 mL). The resulting suspension was stirred for 1 hour, collected by vacuum filtration, washed with methanol (3×50 mL) and dried to give the product as a pale yellow powder. Yield: 9.75 g. Mn=3138 g/mol. n=11.6. Polydispersity=1.8. Chlorine content=19 ppm. The dielectric constant of the 2,4-Dimethyl PTAA polymer (6) was 3.0

The Comparative Example polymers (13) and (14), namely the 3-Methoxy-PTAA homopolymer (13) and the 2,4-Difluoro-PTAA homopolymer (14) were synthesised using the same methodology as described in Examples 1 to 11; the permittivities of the corresponding PTAA polymers are listed in Table 1.

Polymer (13)

Polymer (14)

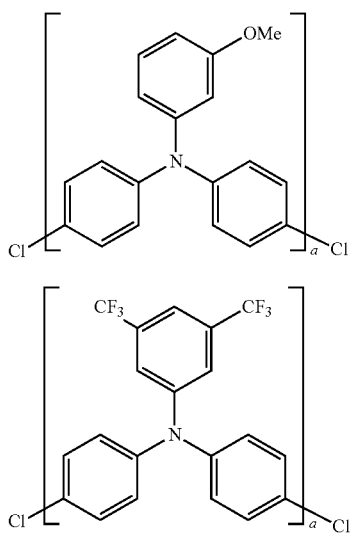

Comparative Example 15

Polymer (15) 3,5-bistrifluoromethyl polytriarylamine homopolymer

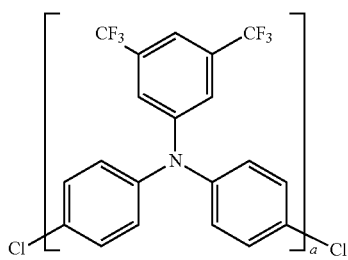

Synthesis of the 3,5-bis(trifluoromethyl) PTAA Polymer

Synthesis of the 3,5-bis(trifluoromethyl) monomer

A 2 L 3-neck round bottom flask fitted with mechanical stirrer, thermometer, condenser and argon inlet was charged with toluene (1.125 L), palladium acetate (494.4 mg, Precious Metals) and (±)-2,2'-bis(diphenylphosphino)-1,1'-binaphthyl (1.37 g, Alfa-Aesar) were added to the vessel and the contents were heated to 50° C. and then cooled to room temperature once reached and left to stir for 1 hour. 3,5-bis (trifluoromethyl)iodobenzene (75 g, Maybridge), bis(4-chlorophenyl)aniline (52.5 g) and sodium-tert-butoxide (23.28 g, Alfa-Aesar) were added to the vessel which was heated to 110° C. for 8 hours. The reaction was cooled and water (750 ml) was added. The mixture was filtered and the layers separated. The organic phase was washed with water, filtered through a pad of celite and concentrated. The crude product was purified by chromatography using heptane as an eluent, followed by recrystallising twice from methanol. Yield: 35 g. $^1$H NMR (400 MHz, CDCl$_3$): δ 7.31-7.29 (7H, m, ArH), 7.04-7.02 (3H, m, ArH).

Synthesis of the 3,5-bis(trifluoromethyl) PTAA oligomer (15)

A 1 L three neck round bottom flask was fitted with overhead stirrer, thermometer, air condenser, Claisen adaptor and septum inlet. The apparatus was flushed with argon. N,N-dimethylacetamide (250 mL, Sigma-Aldrich) was charged and degassed for 15 minutes. Triphenylphosphine (7.58 g, Sigma-Aldrich), 2,2'-bipyridyl (346.2 mg, Sigma-Aldrich), zinc (11.17 g, Alfa-Aesar) and nickel (II) chloride (216.7 mg, Sigma-Aldrich) were added to the vessel. The contents were heated to 70-80° C. where the mixture turned red-brown in colour. A few crystals of iodine were added, and the reaction was left to stir for 1 hour. The 3,5-bis (trifluoromethyl) monomer (24.98 g) was added to the vessel. Anhydrous toluene (41 mL, Sigma-Aldrich) was added and the reaction was left to stir for 19 hours, before being cooled to room temperature. The reaction was filtered, washing the solids with N,N-dimethylacetamide (100 mL). The filter cake was dissolved in tetrahydrofuran (300 mL), filtered through a celite pad and concentrated. This material was dissolved into tetrahydrofuran (250 mL) and filtered through silica, eluting with tetrahydrofuran. Product fractions were combined and concentrated to give a yellow solid. This was dissolved in 2-methyltetrahydrofuran (230 mL), washed with 1M sodium hydroxide solution (200 mL), water (200 mL), 10% sodium chloride solution (200 mL) and water (200 mL) before being concentrated to give a yellow solid (8.5 g). This was dissolved in tetrahydrofuran (50 mL) and charcoal treated three times (3×0.85 g of charcoal) then concentrated. This material was dissolved in tetrahydrofuran (60 mL) and added dropwise to a stirred portion of methanol (300 mL). The resulting suspension was stirred for 1 hour before being collected by filtration and dried. Yield: 7.5 g. Mn=5350 g/mol. n=14.1. Polydispersity=1.3.

The dielectric constant of polymer (11) was 2.8

Comparative Example 16

Polymer (16), 2-Methoxy backbone monomer

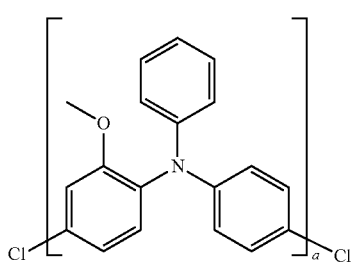

Synthesis of the 2-methoxy backbone monomer (a) Synthesis of 4-chloro-2-methoxyaniline A mixture of 5-chloro-2-nitroanisole (1.0 g, Sigma-Aldrich), ammonium formate (3.36 g, Alfa-Aesar) and 10% platinum on carbon (100 mg) in MeOH (10 mL) was heated to reflux for 45 minutes then cooled to room temperature and filtered through celite, washing with MeOH. The filtrates were concentrated and the residue was dissolved in EtOAc and water. The organics were dried (MgSO$_4$) and concentrated to a brown oil. The material was absorbed onto silica and columned eluting ethyl acetate/heptane mixtures to give the product as a brown oil. Yield: 0.7 g. $^1$H NMR (400 MHz, CDCl$_3$): δ 6.72-6.78 (2H, m, ArH), 6.58-6.62 (1H, m, ArH), 3.83 (3H, s, OMe).

(b) Synthesis of 4-chloro-N-(4-chlorophenyl)-2-methoxyaniline

A solution of palladium (II) acetate (949 mg, Precious Metals Online) and (+/−)-2,2'-bis(diphenylphosphino)-1,1'-binaphthyl (2.63 g, Alfa-Aesar) in toluene (1000 mL) was heated to 50° C. under argon then cooled to room temperature. 4-Chloro-2-methoxyaniline (66.6 g), 4-iodochlorobenzene (105.81 g, Apollo Scientific) and sodium tert-butoxide (44.68 g, Alfa-Aesar) were added and the mixture was heated to reflux for 90 minutes. The mixture was cooled to room temperature, quenched with water (500 mL) then the organics were separated, dried (MgSO$_4$) and concentrated. The residue was absorbed onto silica and columned eluting ethyl acetate/heptane mixtures to give the product as a dark orange oil that solidified on standing. Yield: 97.86 g. $^1$H NMR (400 MHz, CDCl$_3$): δ 7.18-7.23 (2H, m, ArH), 7.12 (1H, d, ArH), 7.00-7.05 (2H, m, ArH), 6.82-6.85 (2H, m, ArH), 6.00 (1H, br s, NH), 3.87 (3H, s, OMe).

(c) Synthesis of 4-chloro-N-(4-chlorophenyl)-2-methoxy-N-phenylaniline-2-MeO-backbone PTAA monomer Palladium(II) acetate (3.84 g, Precious Metals Online) and 4,5-bis(diphenylphosphino)-9,9-dimethylxanthene (9.91 g, Manchester Organics) were dissolved in toluene (690 mL) and stirred at room temperature under argon for 1 hour. 4-Chloro-N-(4-chlorophenyl)-2-methoxyaniline (45.9 g), iodobenzene (47.9 mL, Sigma-Aldrich) and sodium tert-butoxide (42.78 g, Alfa Aesar) were added and the mixture was heated to 85° C. overnight. The mixture was cooled to room temperature, quenched with water (690 mL) and filtered through celite. The organics were separated, dried (MgSO$_4$) and concentrated to a black oil. The material was absorbed onto silica and columned eluting ethyl acetate/heptane mixtures to give a brown oil. MeOH was added and the mixture was cooled to 0° C. and stirred for 1 hour. The solid was filtered and recrystallised from DCM/MeOH to give the product as a white solid. Yield: 14.5 g. $^1$H NMR (400 MHz, CDCl$_3$): δ 7.18-7.23 (2H, m, ArH), 7.10-7.15 (2H, m, ArH), 7.05 (1H, d, ArH), 6.89-6.99 (5H, m, ArH), 6.84-6.88 (2H, m, ArH), 3.63 (3H, s, OMe).

Synthesis of the 2-methoxy backbone PTAA polymer 16

A 500 mL three neck round bottom flask was fitted with overhead stirrer, thermometer, air condenser, Claisen adaptor and septum inlet. The apparatus was flushed with argon. N,N-dimethylacetamide (150 mL, Sigma-Aldrich) was charged and degassed for 15 minutes. Triphenylphosphine (5.75 g, Sigma-Aldrich), 2,2'-bipyridyl (263.1 mg, Sigma-Aldrich), zinc (8.48 g, Alfa-Aesar) and nickel (II) chloride (163.8 mg, Sigma-Aldrich) were added to the vessel and the contents were heated to 70-80° C. where the mixture turned red-brown in colour. A few crystals of iodine were added, and the reaction was left to stir for 1 hour. The monomer (14.5 g) was added to the vessel followed by anhydrous toluene (24 mL, Sigma-Aldrich) and the mixture was left to stir overnight before being cooled to room temperature. The reaction was filtered and the filtrates were added dropwise to MeOH (1150 mL). The solids were filtered, washed with MeOH and dried before being redissolved in toluene (750 mL). The solution was washed with 1M hydrochloric acid (250 mL), water (250 mL), 10% brine (250 mL), dried (MgSO$_4$) and concentrated to give a yellow solid. This was dissolved in toluene and passed through a silica pad eluting toluene then 50:50 toluene:THF. The filtrates were concentrated then redissolved in toluene and charcoal treated (3×1.24 g). The filtrates were then concentrated to give a yellow solid. This material was dissolved in THF (250 mL) and added dropwise to a stirred portion of methanol (1250 mL). The resulting suspension was stirred for 30 minutes before being collected by filtration to give a pale yellow powder. Yield: 8.93 g. Mn=3221 g/mol. n=11.8. Polydispersity=2.4.

The dielectric constant of polymer (16) was 3.3

Comparative Example 17

Polymer (17) 4-Phenoxy-PTAA homopolymer

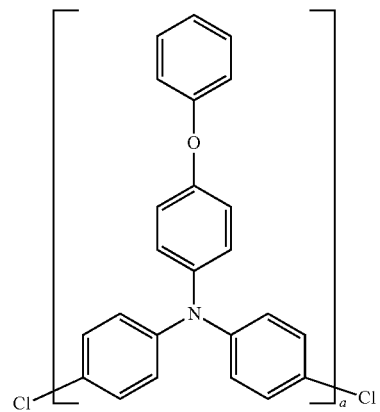

Synthesis of the 4-phenoxy monomer

A 1 liter (L) 3-neck round bottom flask fitted with magnetic stirrer, thermometer, condenser and argon inlet was charged with 300 milliliters (mL) toluene, palladium acetate (250 milligrams (mg), Precious Metals) and (±)-2,2'-bis(diphenylphosphino)-1,1'-binaphthyl (0.69 grams (g), Alfa-Aesar) were added to the vessel and the contents were heated to 50° C. and then cooled to room temperature once reached and left to stir for 1 hour. 4-phenoxyaniline (20.02 g, Alfa-Aesar), 4-chloroiodobenzene (59.96 g, Apollo Scientific) and sodium-tert-butoxide (22.83 g, Alfa-Aesar) were added to the vessel which was heated to 110° C. for 54 hours. The reaction was cooled and water (200 ml) was added. The mixture was filtered and the layers separated. The organic phase washed with water, filtered through a pad of celite, dried over sodium sulphate and concentrated. The crude product was purified by automated chromatography, using 2% ethyl acetate in heptane as an eluent, and then by silica pad using heptane to remove impurities and then 10% ethyl acetate in heptane. Product fractions were combined and concentrated Yield: 29 g. $^1$H NMR (400 MHz, CDCl$_3$): δ 7.5-6.9 (17H, m, ArH)

Synthesis of the 4-phenoxy PTAA oligomer

A 500 ml three neck round bottom flask was fitted with overhead stirrer, thermometer, air condenser, Claisen adaptor and septum inlet. The apparatus was flushed with argon. N,N-dimethylacetamide (130 mL, Aldrich) was charged and degassed for 15 minutes. Triphenylphosphine (1.50 g, Aldrich), 2,2'-bipyridyl (69.8 mg, Aldrich), zinc (2.24 g, Alfa-Aesar) and nickel (II) chloride (42.4 mg, Aldrich) were added to the vessel. The contents were heated to 70-80° C. where the mixture turned red-brown in colour. A few crystals of iodine were added, and the reaction was left to stir for 1 hour. The monomer (13 g) was added to the vessel, followed by anhydrous toluene (45.5 mL, Aldrich). After 3 hours, further nickel (II) chloride (42.8 mg) was added and the reaction was left to stir for 15 hours, before being cooled to room temperature. The reaction was filtered through celite, eluting with N,N-dimethylacetamide (50 mL). Solids began precipitating in the filtrates which were collected by filtration. The filtrates were measured (350 mL) and added dropwise to a stirred portion of methanol (1750 mL). The suspension was stirred for 1 hour, collected by vacuum filtration and washed with methanol. The solids were combined with the solids collected from the celite filtration and dissolved in tetrahydrofuran (250 mL), washed three times with 10% sodium chloride solution (200 ml) and concentrated to give a yellow solid. This material was dissolved into tetrahydrofuran (250 mL) and filtered through silica, eluting with tetrahydrofuran. Product fractions were combined and concentrated to give a yellow solid (15 g). This material was dissolved in tetrahydrofuran (250 mL) and charcoal treated three times (3×1.5 g of charcoal). The filtrates were concentrated. This material was dissolved in tetrahydrofuran (120 mL) and added dropwise to a stirred portion of methanol (120 mL). The resulting suspension was stirred for 1 hour before being collected by filtration and dried. Yield: 8.6 g. Mn=2047 g/mol. N=6.1. Polydispersity=2.1.

The dielectric constant of polymer (17) was 2.7.

Comparative Example (18)

Synthesis of 50:50 2,4-dimethyltriarylamine-dioctylfluorene copolymer (18)

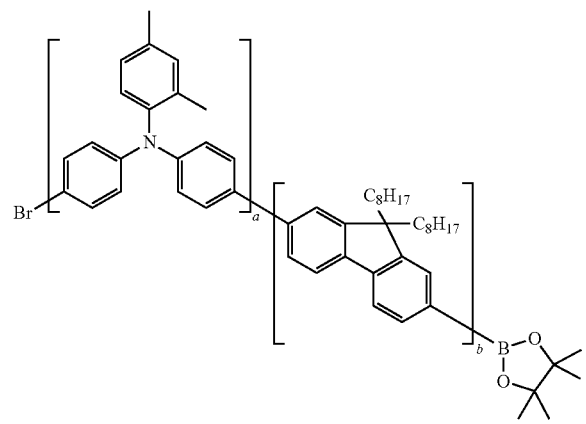

(a) Synthesis of 2-(4-(bis(4-bromophenyl)amino) phenyl)-2-methylpropanenitrile (i) 2,4-dimethyl-N,N-diphenylaniline Toluene (735 mL) was degassed for 10 minutes then diphenylamine (15 g, Alfa-Aesar), 4-iodoxylene (21.6 g, Alfa-Aesar) and sodium tert-butoxide (10.65 g, Alfa-Aesar) were added before degassing for a further 5 minutes. Pd$_2$(dba)$_3$ (812 mg, Acros) and tri-tert-butylphosphine (1.08 mL, Alfa-Aesar) were added and the mixture was heated to 95° C. for 3.5 hours. The reaction was cooled, quenched with water (750 mL), stirred for 10 minutes then filtered through celite. The organic layer was separated, washed with brine (2×500 mL), dried (MgSO$_4$) and concentrated to a brown oil. The oil was redissolved in toluene and passed through a silica plug. The filtrates were concentrated to give the title compound as a brown oil. Yield: 24.46 g. $^1$H NMR (400 MHz, CDCl$_3$): δ 7.16-7.23 (4H, m, ArH), 6.86-7.05 (9H, m, ArH), 2.33 (3H, s, CH$_3$), 2.00 (3H, s, CH$_3$).

(ii) N,N-Bis(4-bromophenyl)-2,4-dimethylaniline

NBS (31.55 g, Apollo Scientific) was added to a solution of 2,4-dimethyl-N,N-diphenylaniline (24.23 g) in EtOAc (410 mL). The mixture slowly warmed over 5 minutes and was stirred for a further 1 hour until the solution had re-cooled. The mixture was washed with water (250 mL), Na$_2$CO$_3$ (2×375 mL), brine (250 mL), dried (MgSO$_4$) and concentrated to a dark brown solid. Recrystallisation from THF/MeCN gave the title compound as a grey solid. Yield: 27.70 g. $^1$H NMR (400 MHz, CDCl$_3$): δ 7.22-7.30 (4H, m, ArH), 7.05 (1H, d, ArH), 7.00 (1H, dd, ArH), 6.95 (1H, d, ArH), 2.33 (3H, s, CH$_3$), 1.97 (3H, s, CH$_3$).

(b) Synthesis of 2,2'-(9,9-dioctyl-9H-fluorene-2,7-diyl)bis(4,4,5,5-tetramethyl-1,3,2-dioxaborolane)

A round bottom flask was charged with 2,7-dibromo-9,9-dioctyl-9H-fluorene (10 g, Sigma-Aldrich), potassium acetate (6.26 g, Alfa-Aesar) and bis(pinacolato)diboron (10.19 g, Allychem) in dioxane (300 mL). The mixture was degassed for 15 minutes then [1,1'-bis(diphenylphosphino) ferrocene]dichloropalladium(II) (745 mg, Peakdale) was added and the reaction mixture heated to 100° C. for 18 hours. The mixture was concentrated and the residue was taken up in DCM and filtered through a pad of celite washing with DCM. The organic layer was washed with water, brine, dried (MgSO$_4$) and concentrated onto silica. Purification by dry flash column eluting with heptane/ethyl acetate mixtures gave a pale yellow solid which was recrystallised from THF/MeCN to give the target compound as a yellow solid. Yield: 7.89 g. $^1$H NMR (400 MHz, CDCl$_3$); 7.80 (2H, m), 7.72 (4H, m), 2.00 (4H, m), 1.38 (24H, s), 0.95-1.25 (20H, m), 0.78 (6H, m), 0.48-0.60 (4H, br m).

Synthesis of 50:50 Poly-9,9-dioctylfluorene:2,4-di-Me TAA copolymer

N,N-bis(4-bromophenyl)-2,4-dimethylaniline (7.37 g), 2,2'-(9,9-dioctyl-9H-fluorene-2,7-diyl)bis(4,4,5,5-tetramethyl-1,3,2-dioxaborolane) (10.99 g), potassium phosphate (14.97 g, Alfa-Aesar) and Aliquat 336 (56 drops, Alfa-Aesar) were stirred in a mixture of toluene (77 mL), dioxane (77 mL) and water (38.5 mL) and degassed. Tri-(o-tolyl) phosphine (161 mg, Sigma-Aldrich) and tris(dibenzylideneacetone)palladium(0) (81 mg, Acros) were added and the reaction heated to 100° C. for 18 h. The reaction mixture was poured onto methanol (960 mL), the resulting solid collected by filtration and washed with 1M HCl (500 mL), saturated bicarbonate (500 mL), water (500 mL) and acetone (500 mL). The solid was dissolved in toluene:THF and filtered through a pad of silica and the filtrates concentrated to a yellow plastic. This was dissolved in THF (250 mL) and precipitated with methanol (1250 mL). The solid was collected by filtration to give the target compound as a yellow powder. Yield: 10.5 g. Mn=14885, n=22.6, Polydispersity=2.0. The dielectric constant of polymer (18) was 2.7.

Comparative Example (19)

Synthesis of 50:50 4-sec-butyl-triarylamine-tetraoctyl indenofluorene copolymer (19)

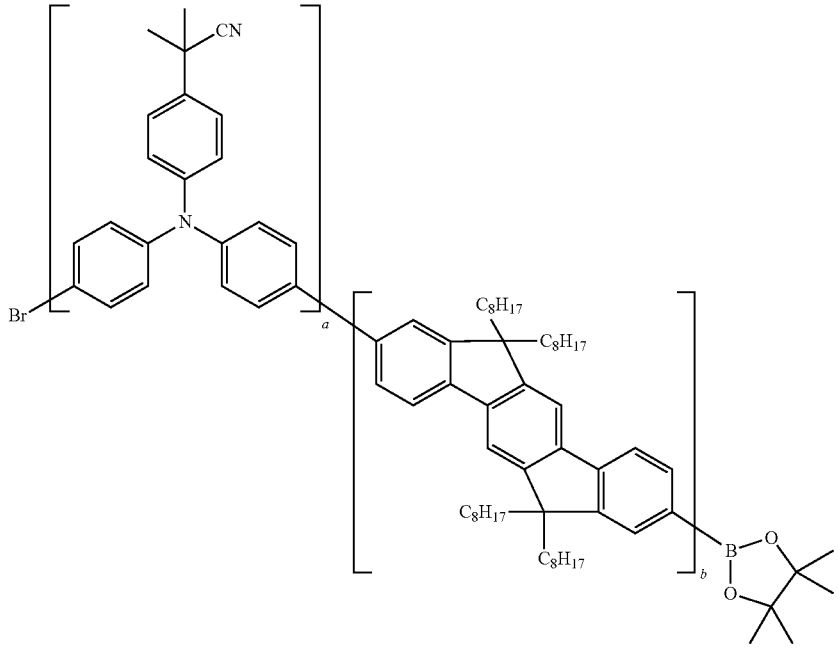

4-Bromo-N-(4-bromophenyl)-N-[4-(sec-butyl)phenyl] aniline

Palladium(II) acetate (2.26 g, Precious Metals Online) and 4,5-bis(diphenylphosphino)-9,9-dimethylxanthene (5.97 g, Alfa-Aesar) were dissolved in toluene (100 mL) and degassed before stirring at RT for 1 h. 4-(sec-Butyl)aniline (TCI, 15.3 g), 4-iodobromobenzene (Apollo Scientific, 62.2 g) and sodium tert-butoxide (21.8 g, Alfa-Aesar) were added and washed in with toluene (113 mL). The reaction mixture was then heated to reflux for 18 h. The reaction was cooled to RT, diluted with water (200 mL) and filtered through a celite pad. The organic layer was washed with water (2×200 mL), dried (Na$_2$SO$_4$) and concentrated. Purification by flash column chromatography eluting with ethyl acetate:heptane mixtures followed by recrystallisation from methanol:ethyl acetate then acetonitrile:THF gave the target compound as a white solid. Yield: 29 g. $^1$H NMR (400 MHz, CDCl$_3$): 7.32 (4H, m), 7.09 (2H, m), 6.92 (6H, m), 2.54 (1H, m), 1.56 (2H, m), 1.21 (3H, m), 0.83 (3H, m).

2,2'-(6,6,12,12-tetraoctyl-6,12-dihydroindeno[1,2-b]fluorene-2,8-diyl)bis(4,4,5,5-tetramethyl-1,3,2-dioxaborolane)

A round bottom flask was charged with 2,8-dibromo-6,6,12,12-tetraoctyl-6,12-dihydroindeno[1,2-b]fluorene (8.84 g, Sigma-Aldrich), potassium acetate (3.53 g, Alfa-Aesar) and bis(pinacolato)diboron (5.74 g, Allychem) in dioxane (220 mL). The mixture was degassed for 15 minutes then [1,1'-bis(diphenylphosphino)ferrocene]-dichloropalladium (II) (419 mg, Peakdale) was added and the reaction mixture heated to 100° C. for 18 hours. The mixture was concentrated and the residue was taken up in DCM/water (2:1) and filtered through a pad of celite washing with DCM. The organic layer was washed with brine, dried (MgSO$_4$) and concentrated onto silica. Purification by dry flash column eluting with heptane/ethyl acetate mixtures gave a yellow solid which was recrystallised from THF/MeCN to give the target compound as a yellow solid. Yield: 5.92 g. $^1$H NMR (400 MHz, CDCl$_3$); 7.83 (2H, m), 7.73 (4H, m), 7.62 (2H,$), 1.91-2.12 (8H, br m), 1.39 (24H, s), 0.91-1.22 (40H, br m), 0.79 (12H, m), 0.50-0.70 (8H, br m).

50:50 Poly-9,9-dioctylindenofluorene:sec-butyl TAA copolymer

4-Bromo-N-(4-bromophenyl)-N-(4-(sec-butyl)phenyl) aniline (1.13 g), 2,2'-(6,6,12,12-tetraoctyl-6,12-dihydroindeno[1,2-b]fluorene-2,8-diyl)bis(4,4,5,5-tetramethyl-1,3,2-dioxaborolane) (2.35 g), potassium phosphate (2.09 g, Alfa-Aesar) and Aliquat 336 (4 drops, Alfa-Aesar) were stirred in a mixture of toluene (17.5 mL), dioxane (8.8 mL) and water (8.8 mL) and degassed. Tris(dibenzylideneacetone)palladium(0) (11 mg, Acros), and tri-(o-tolyl)phosphine (22 mg, Sigma-Aldrich) were added and the reaction heated to 100° C. for 18 h. The reaction mixture was then poured onto methanol (175 mL) and the resulting precipitate collected by filtration. The solid was washed with 1M HCl (175 mL), saturated bicarbonate (175 mL), water (175 mL) and acetone (175 mL). The solid was dissolved in toluene and passed through a silica pad, washing through with toluene. The solid was then charcoal treated (3×232 mg), the filtrates concentrated, taken up in THF (25 mL) and precipitated with methanol (125 mL). The solid was filtered to give the target compound as a yellow solid. Yield: 1.91 g. Mn=14146, n=14.1, Polydispersity=2.0.

The dielectric constant of polymer (19) was 2.6.

The invention claimed is:

1. A semiconductor composition comprising:
    a soluble polyacene semiconductor;
    a polymeric semiconducting binder;
    wherein the polymeric semiconducting binder has a permittivity greater than 3.4 at 1000 Hz; and
    wherein the polymeric semiconducting binder comprises triarylamine repeat units.

2. The semiconductor composition according to claim 1, wherein the charge mobility of the polymeric semiconducting binder when measured in a pure state is greater than $10^{-7}$ cm$^2$ V$^{-1}$ s$^{-1}$.

3. The semiconductor composition according to claim 2, wherein the charge mobility of the polymeric semiconducting binder when measured in a pure state is greater than $10^{-6}$ cm$^2$ V$^{-1}$ s$^{-1}$.

4. The semiconductor composition according to claim 1, wherein at least one of the triarylamine repeat units is substituted by cyano groups or by groups which comprise cyano groups or by alkoxy groups.

5. The semiconductor composition according to claim 1, wherein the triarylamine repeat units comprise at least one of:

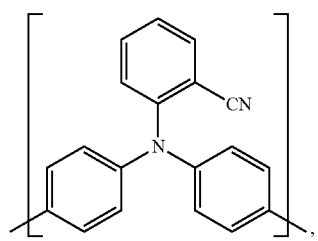

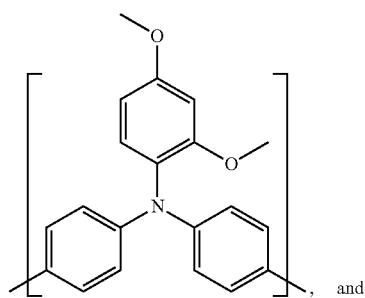, and

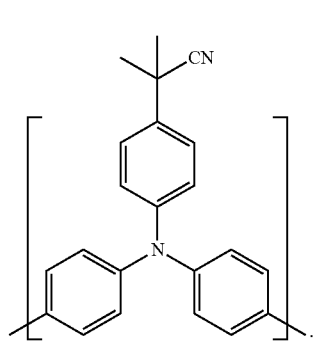.

6. The semiconductor composition according to claim 1, wherein the polymeric semiconducting binder is represented by the Formula (I) comprising at least one of first and second monomer units:

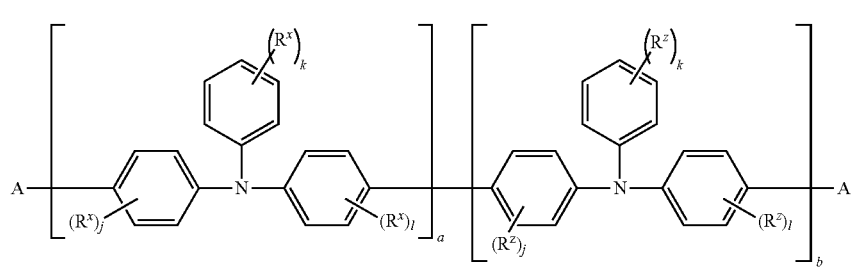

Formula (I)

wherein each R$^x$ is independently selected from hydrogen, an alkyl group, an alkoxy group, halogen, a nitro group or R$^y$, where each R$^y$ is independently a cyano group (CN) or an organic group that includes at least one CN group, and wherein at least one of the repeat units is substituted by cyano groups or by groups which comprise cyano groups or by alkoxy groups;
the sum of indices (j+k+l) is at least 1;
each R$^z$ is independently an alkyl group optionally substituted by one or more substituents selected from hydroxyl, alkoxy, alkylsulphonyl, halogen, cyano, nitro, amino and carboxyl;
A is independently in each occurrence hydrogen, halogen or any suitable end-capping group;
j and l are independently in each occurrence 0 to 4;
k is independently in each occurrence 0 to 5;

a is the number of first monomer units and is greater than or equal to 1; and b is the number of second monomer units, which may be 0.

7. The semiconductor composition according to claim 6, wherein the polymeric semiconducting binder has alkoxy substituents directly substituted onto an aromatic ring in at least one of the 2, 4 and 6 positions.

8. The semiconductor composition according to claim 6, wherein the polymeric semiconducting binder has a cyano group attached to the aromatic ring by means of a linker group.

9. The semiconductor composition according to claim 8, wherein the cyano group attached to the aromatic ring by means of a linker group comprises at least one of:

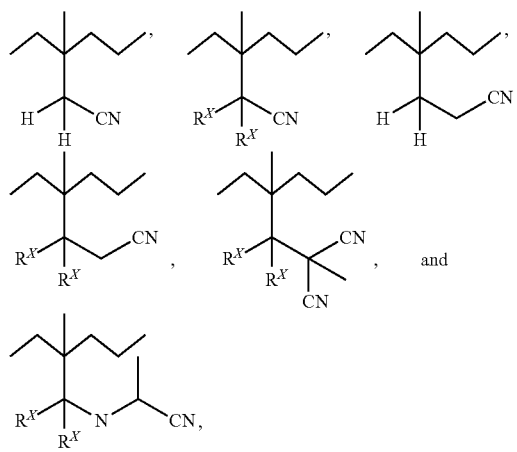

wherein each $R^x$ is independently selected from hydrogen, an alkyl group, an alkoxy group, halogen, a nitro group or $R^y$, where each $R^y$ is independently a cyano group (CN) or an organic group that includes at least one CN group.

10. The semiconductor composition according to claim 6, wherein the polymeric semiconducting binder has at least one of alkoxy and cyano substitution on the pendant aromatic ring.

11. The semiconductor composition according to claim 6, wherein the polymeric semiconducting binder has methoxy groups on the 2,4-positions of the pendant aromatic ring.

12. The semiconductor composition according to claim 1, wherein the polymeric semiconducting binder comprises the copolymer:

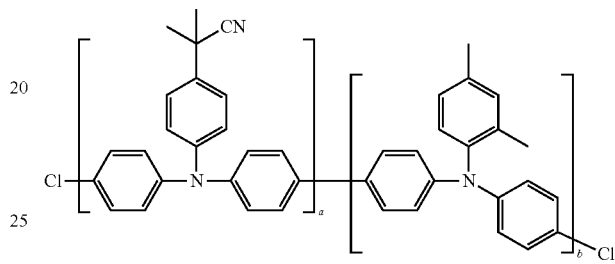

wherein a is the number of first monomer units and is greater than or equal to 1; and b is the number of second monomer units.

13. The semiconductor composition according to claim 1, wherein the polymeric semiconducting binder is represented by at least one of the Formula (VII), (VIII), (IXa) and (IXb), wherein each Formula comprises at least one of first and second monomer units:

Formula (VII)

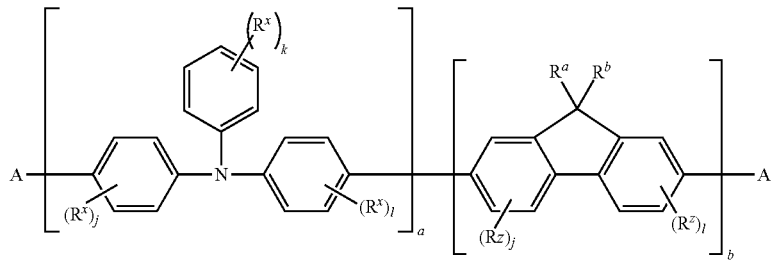

Formula (VIII)

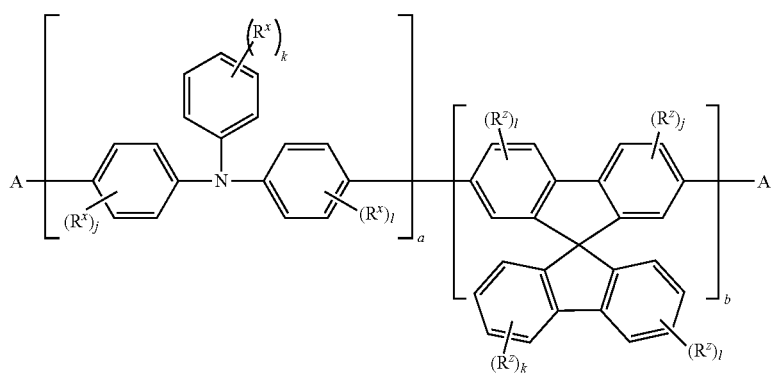

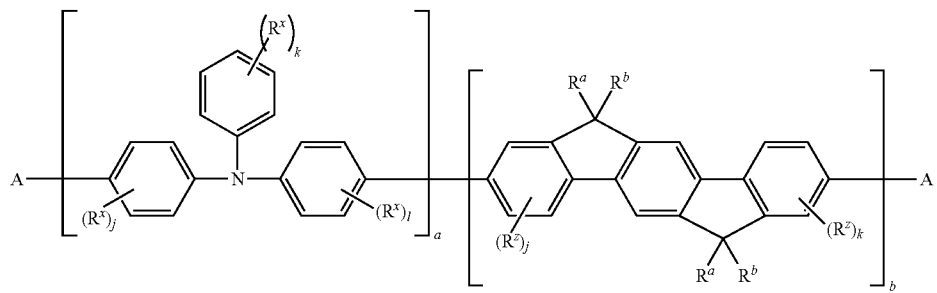

Formula (IXa)

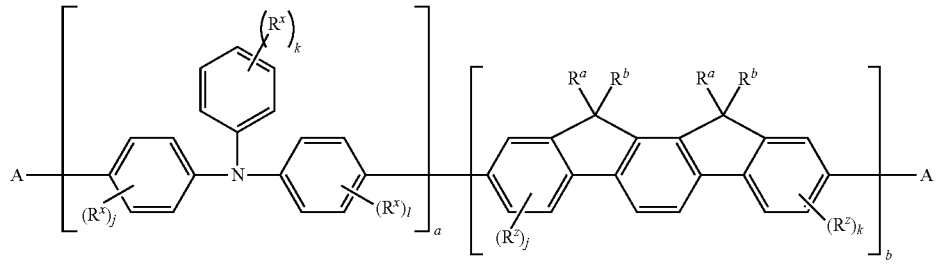

Formula (IXb)

wherein each $R^x$ is independently selected from hydrogen, an alkyl group, an alkoxy group, halogen, a nitro group or $R^y$, where each $R^y$ is independently a cyano group (CN) or an organic group that includes at least one CN group, and wherein at least one of the repeat units is substituted by cyano groups or by groups which comprise cyano groups or by alkoxy groups;

the sum of indices (j+k+l) is at least 1;

each $R^Z$ is independently an alkyl group optionally substituted by one or more substituents selected from hydroxyl, alkoxy, alkylsulphonyl, halogen, cyano, nitro, amino and carboxyl;

A is independently in each occurrence hydrogen, halogen or any suitable end-capping group;

j and l are independently in each occurrence 0 to 4;

k is independently in each occurrence 0 to 5;

a is the number of first monomer units and is greater than or equal to 1;

b is the number of second monomer units, which may be 0; and each $R^a$ and $R^b$ is independently selected from hydrogen and optionally substituted alkyl, alkaryl, aralkyl, alkoxy and polyalkoyloxy groups.

14. The semiconductor composition according to claim 1, wherein the triarylamine repeat units comprise at least one of (II e), (II f), (II g) and (II h):

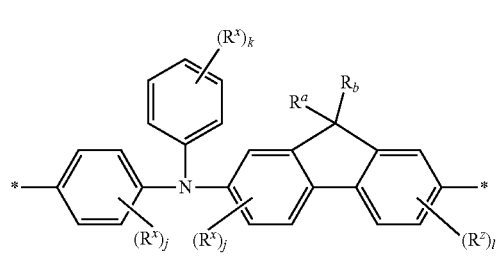

(II e)

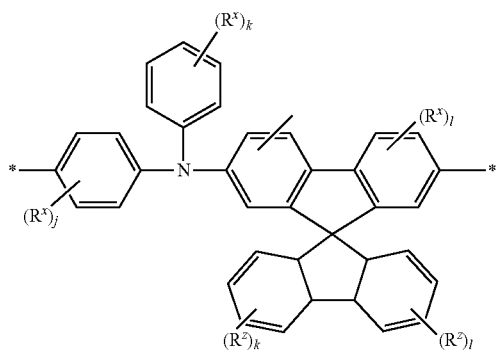

(II f)

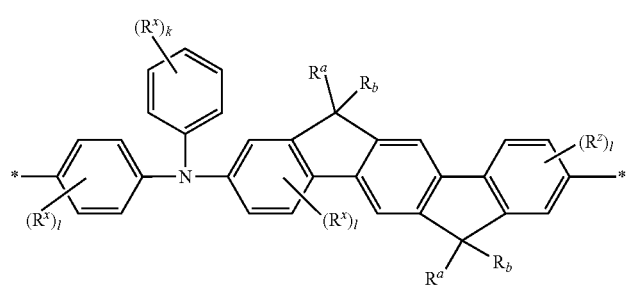

(II g)

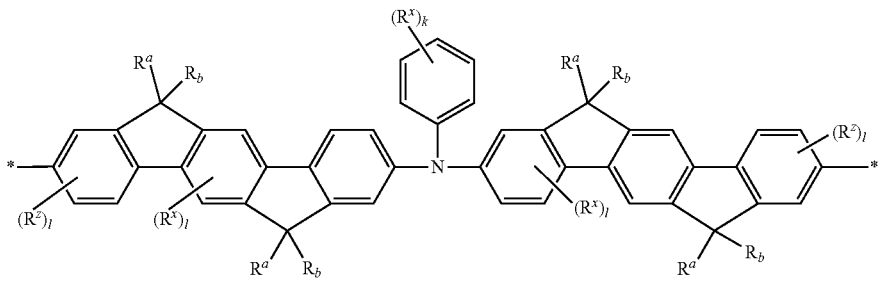

(II h)

wherein each $R^x$ is independently selected from hydrogen, an alkyl group, an alkoxy group, halogen, a nitro group or $R^y$, where each $R^y$ is independently a cyano group (CN) or an organic group that includes at least one CN group, and wherein at least one of the repeat units is substituted by cyano groups or by groups which comprise cyano groups or by alkoxy groups;

the sum of indices (j+k+l) is at least 1;

each $R^z$ is independently an alkyl group optionally substituted by one or more substituents selected from hydroxyl, alkoxy, alkylsulphonyl, halogen, cyano, nitro, amino and carboxyl;

j and l are independently in each occurrence 0 to 4;

k is independently in each occurrence 0 to 5; and each $R^a$ and $R^b$ is independently selected from hydrogen and optionally substituted alkyl, alkaryl, aralkyl, alkoxy and polyalkoyloxy groups.

15. The semiconductor composition according to claim 1, wherein the soluble polyacene semiconductor is represented by at least one of the Formula (A2), (A3) and (C):

Formula (A2)

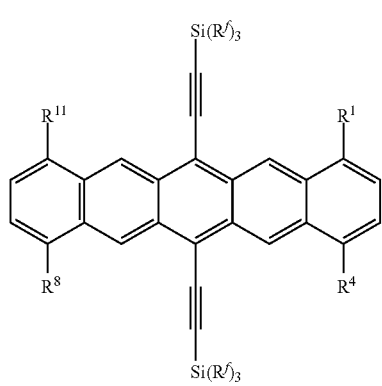

wherein $R^1$, $R^4$, $R^8$ and $R^{11}$ are methyl groups and $R^f$ are ethyl or isopropyl groups, Formula (A3)

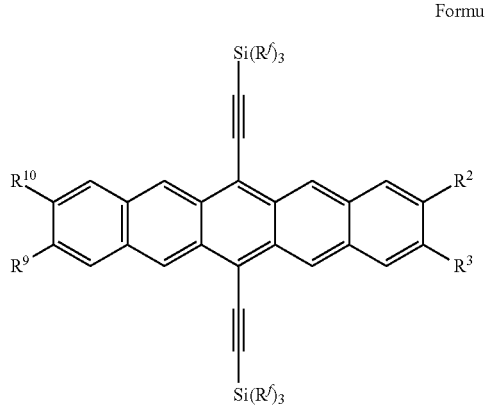

wherein $R^2$, $R^3$, $R^9$, $R^{10}$ are methyl groups and $R^f$ are ethyl or isopropyl groups, Formula (C)

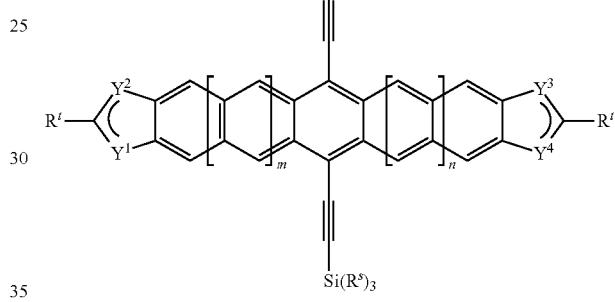

wherein one of $Y^1$ and $Y^2$ denotes —CH= or =CH— and the other denotes —X'—;

one of $Y^3$ and $Y^4$ denotes —CH= or =CH— and the other denotes —X'—;

X' is —O—, —S—, —Se—, or —NR'''—;

$R^s$ is cyclic, straight chain or branched alkyl or alkoxy having 1 to 20 carbon atoms, or aryl having 2 to 30 carbon atoms, all of which are optionally fluorinated or perfluorinated;

$R^t$ is H, F, Cl, Br, I, CN, straight chain or branched alkyl or alkoxy having 1 to 20 carbon atoms and optionally being fluorinated or perfluorinated, optionally fluorinated or perfluorinated aryl having 6 to 30 carbon atoms, or $CO_2R''$, with R" being H, optionally fluorinated alkyl having 1 to 20 carbon atoms, or optionally fluorinated aryl having 2 to 30 carbon atoms;

R''' is H or cyclic, straight chain or branched alkyl with 1 to 10 carbon atoms;

m is 0 or; and n is 0 or 1.

16. The semiconductor composition according to claim 15, wherein the soluble polyacene semiconductor is represented by at least one of the Formula (C1) and (C2):

Formula (C1)

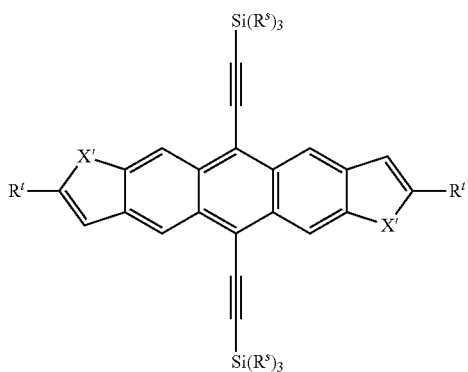

Formula (C2)

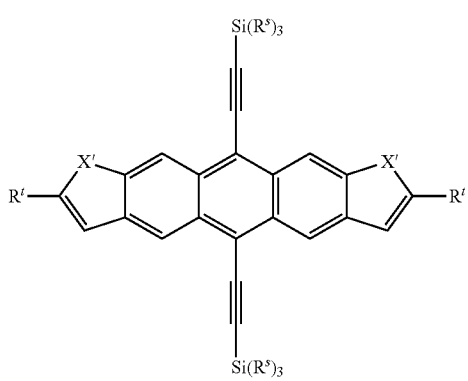

wherein X', $R^t$ and $R^s$ are as defined in claim 15.

17. The semiconductor composition according to claim 1, wherein the polymeric semiconducting binder comprises the copolymer:

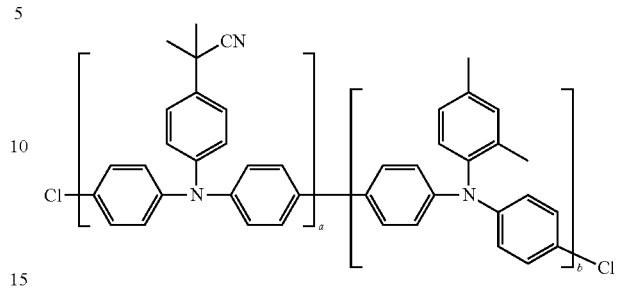

wherein a is the number of first monomer units and b is the number of second monomer units, and wherein the soluble polyacene semiconductor comprises 1,4,8,11-tetramethyl bis-triethylsilylethynyl pentacene.

18. An organic thin film transistor in which the source and drain electrodes are bridged by a semiconductor composition according to claim 1.

19. A solution of an organic semiconducting composition according to claim 1 for use in a process of manufacturing organic thin film transistors, the process comprising depositing an organic semiconducting composition by solution coating.

20. A process of manufacturing organic thin film transistors, the process comprising:
depositing an organic semiconducting composition according to claim 1 by solution coating.

* * * * *